United States Patent [19]
Pissanetzky et al.

[11] Patent Number: 5,659,281
[45] Date of Patent: Aug. 19, 1997

[54] STRUCTURED COIL ELECTROMAGNETS FOR MAGNETIC RESONANCE IMAGING

[75] Inventors: Sergio Pissanetzky, The Woodlands; Peter M. McIntyre, College Station, both of Tex.

[73] Assignee: Houston Advanced Research Center, The Woodlands, Tex.

[21] Appl. No.: 318,776

[22] PCT Filed: Apr. 13, 1993

[86] PCT No.: PCT/US93/03493

§ 371 Date: Dec. 19, 1994

§ 102(e) Date: Dec. 19, 1994

[87] PCT Pub. No.: WO93/21645

PCT Pub. Date: Oct. 28, 1993

Related U.S. Application Data

[63] Continuation-in-part of Ser. No. 869,544, Apr. 15, 1992, Pat. No. 5,359,310, and a continuation-in-part of Ser. No. 926,667, Aug. 6, 1992, Pat. No. 5,382,904.

[51] Int. Cl.$^6$ ...................... H01F 1/00
[52] U.S. Cl. .............. 335/296; 335/216; 335/299; 324/318
[58] Field of Search ............... 335/296, 297, 335/299, 301, 216; 324/318, 319, 320

[56] References Cited

U.S. PATENT DOCUMENTS

| | | |
|---|---|---|
| 4,490,675 | 12/1984 | Knuettell et al. |
| 4,587,490 | 5/1986 | Muller et al. |
| 4,589,591 | 5/1986 | McDougall |
| 4,590,428 | 5/1986 | Muller et al. |
| 4,590,452 | 5/1986 | Ries et al. |
| 4,595,899 | 6/1986 | Smith et al. |
| 4,612,505 | 9/1986 | Zijlstra |
| 4,646,045 | 2/1987 | Chari et al. |
| 4,689,591 | 8/1987 | McDougall ............... 335/299 |

(List continued on next page.)

FOREIGN PATENT DOCUMENTS

| | | |
|---|---|---|
| 138270 | 4/1985 | European Pat. Off. |
| 167243 | 1/1986 | European Pat. Off. |
| 251342 | 1/1988 | European Pat. Off. |
| 424600 | 5/1991 | European Pat. Off. |
| 48701 | 1/1987 | Japan |
| 2106905 | 4/1990 | Japan |
| WO9013824 | 11/1990 | WIPO |
| WO9101564 | 2/1991 | WIPO |

OTHER PUBLICATIONS

Siebold, et al., "Performance and Results of a Computer Program for Optimizing Magnets with iron," IEEE Trans. Magnetics, vol. 24, No. 1 (IEEE, Jan. 1988), pp. 419–422.

Everett, et al. "Spherical coils for uniform magnetic fields," J. Sci. Instrum., vol. 43 (1966), pp. 470–474.

M.W. Garrett, "Thick Cylindrical Coil Systems for Strong Magnetic Field or Gradient Homogeneities of the 6th to 20th Order," J. Appl. Phys. vol. 38 No. 6, (1967) pp. 2578–2583.

(List continued on next page.)

Primary Examiner—Lincoln Donovan
Attorney, Agent, or Firm—Vinson & Elkins L.L.P.

[57] ABSTRACT

Superconducting electromagnets suitable for use in the NMR tomography of human organs, and a method of making the same, are disclosed. Each of the disclosed electromagnets are constructed according to a structured coils methodology, where the desired field at locations within the volume of interest and, optionally, outside of the location of the coils is selected; the current magnitude and polarity for a plurality of coil elements locations are then optimized, by way of a computer program, to provide the desired field magnitude at the locations. The magnet construction results in a plurality of coils of varying current polarity, and of irregular shape and size, optimized to provide the uniform field. Magnets may be constructed according to the present invention which provide suitably highly uniform and high magnitude DC magnetic fields at volumes of interest which may be within or outside of the magnet bore, enabling the MRI of human organs without requiring whole body insertion of the patient into the magnetic bore.

16 Claims, 23 Drawing Sheets

U.S. PATENT DOCUMENTS

| | | |
|---|---|---|
| 4,701,736 | 10/1987 | McDougall et al. . |
| 4,721,914 | 1/1988 | Fukushima et al. . |
| 4,724,412 | 2/1988 | Kalafala . |
| 4,783,628 | 11/1988 | Huson . |
| 4,822,772 | 4/1989 | Huson . |
| 4,912,445 | 3/1990 | Yomasaki et al. . |
| 4,924,185 | 5/1990 | Matsutani . |
| 4,968,915 | 11/1990 | Wilson et al. . |
| 4,987,398 | 1/1991 | Bessho ................................ 335/299 |
| 5,001,448 | 3/1991 | Srivastava et al. . |
| 5,003,979 | 4/1991 | Merickel et al. . |
| 5,006,804 | 4/1991 | Dorri et al. . |
| 5,012,217 | 4/1991 | Palkovich et al. . |
| 5,049,848 | 9/1991 | Pulyer . |
| 5,117,188 | 5/1992 | Ohkawa . |
| 5,359,310 | 10/1994 | Pissanetzky ........................ 335/301 |
| 5,382,904 | 1/1995 | Pissanetzky ........................ 324/319 |
| 5,519,372 | 5/1996 | Palkovich et al. .................. 335/216 |

OTHER PUBLICATIONS

Pissanetzky, "Minimum energy MRI gradient coils of general geometry," Meas. Sci. Technol., vol. 3 (IOP Publishing Ltd., 1992) pp. 667–673.

Pissanetzky, "Structured coils for NMR applications" IEEE Trans. Magnetics, vol. 28, No. 4 (IEEE Jul. 1992), pp. 1961–1968.

Pissanetzky, "Structured Coils and Nonlinear Iron", presented at the 5th Biennial IEEE Conference on Electromagnet Field Computation, Claremont, Calif. (Aug. 3–5, 1992).

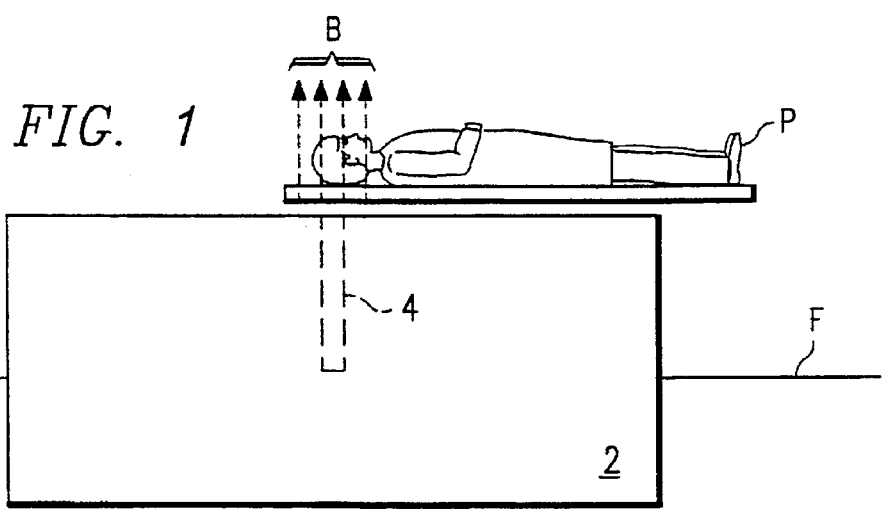
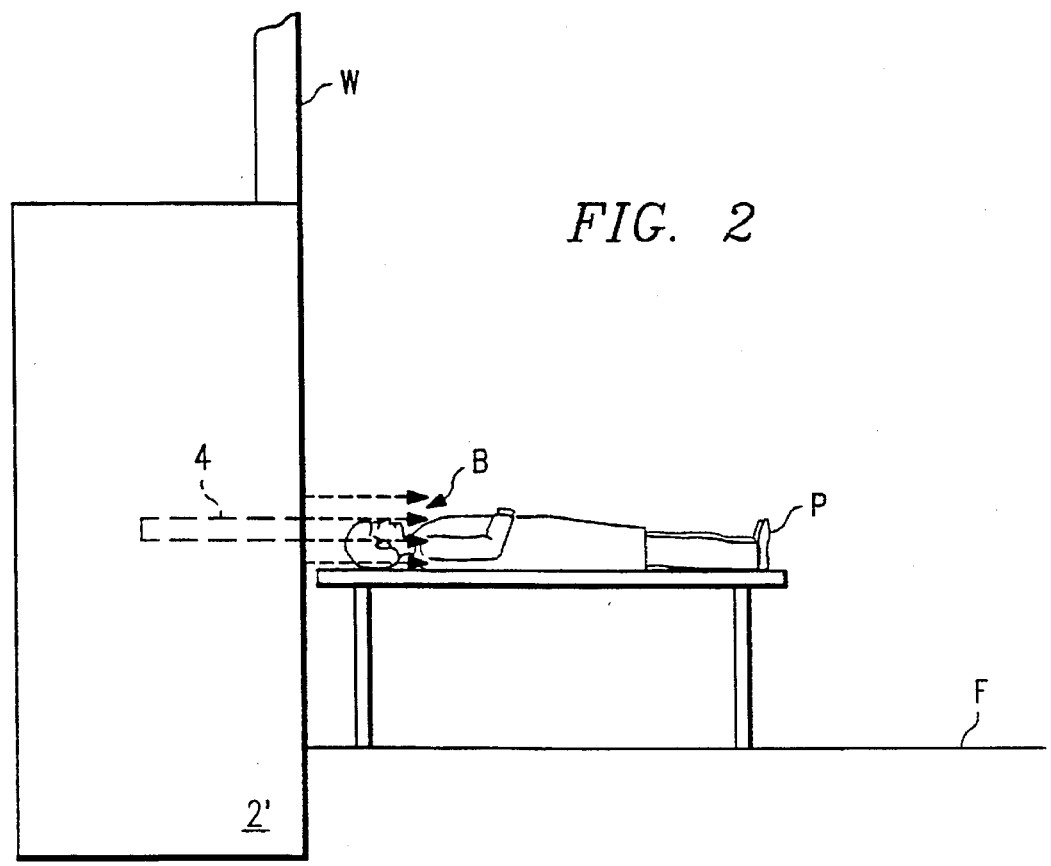

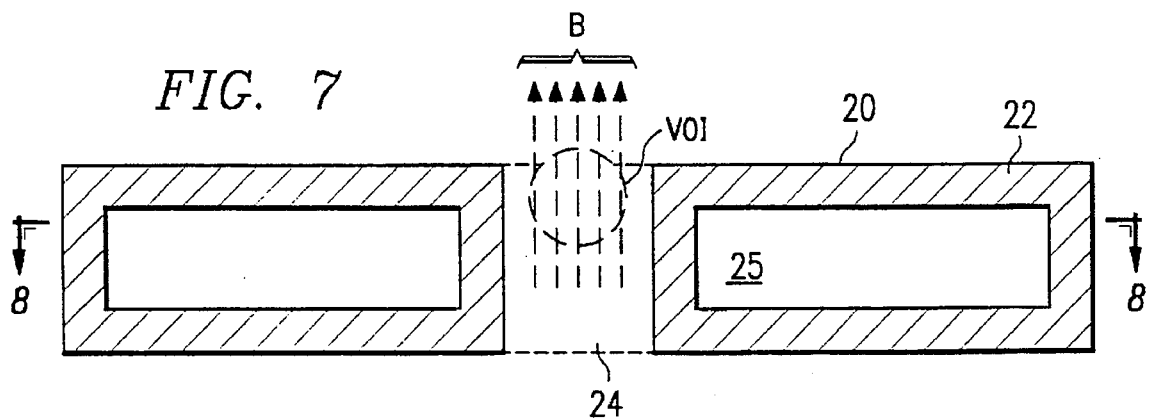
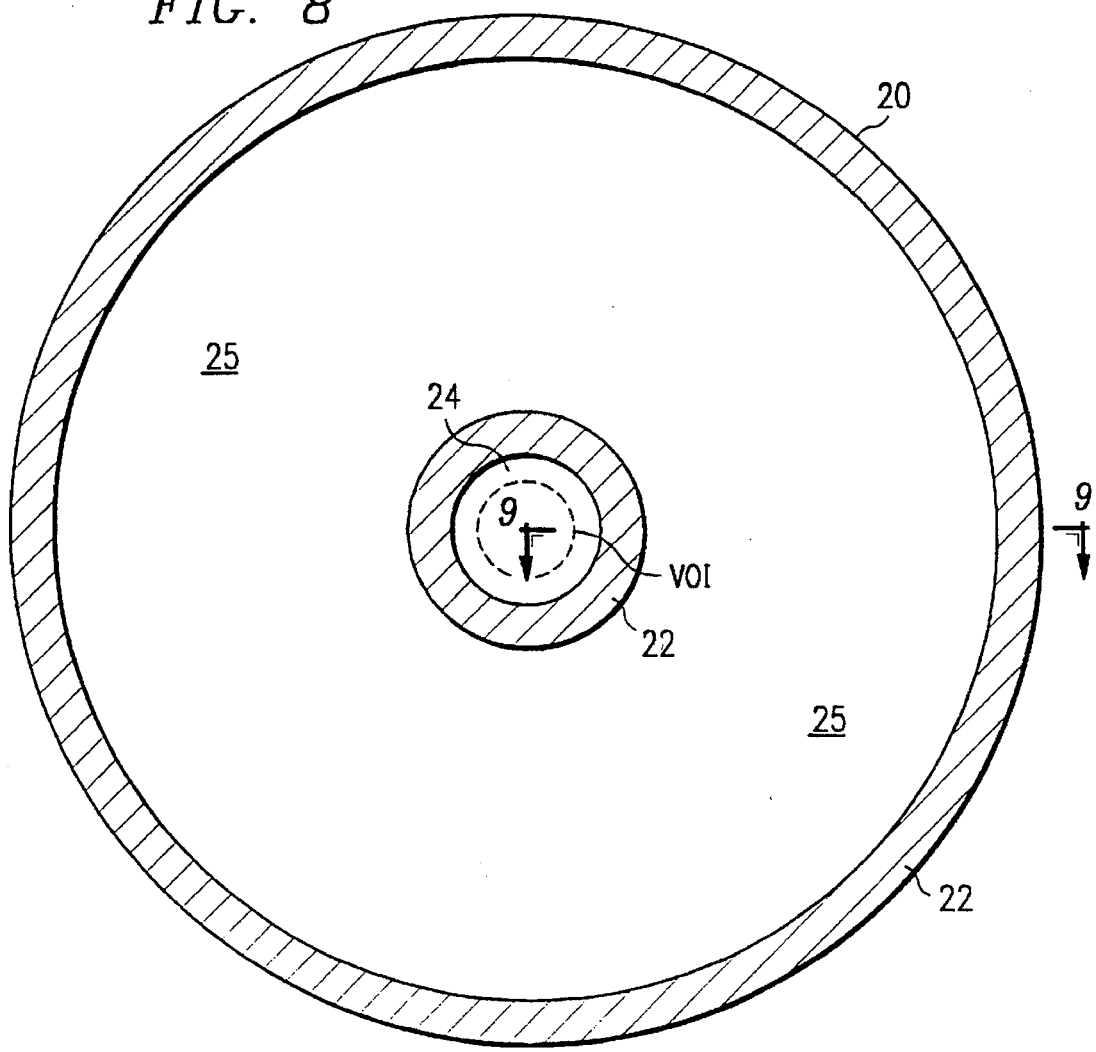

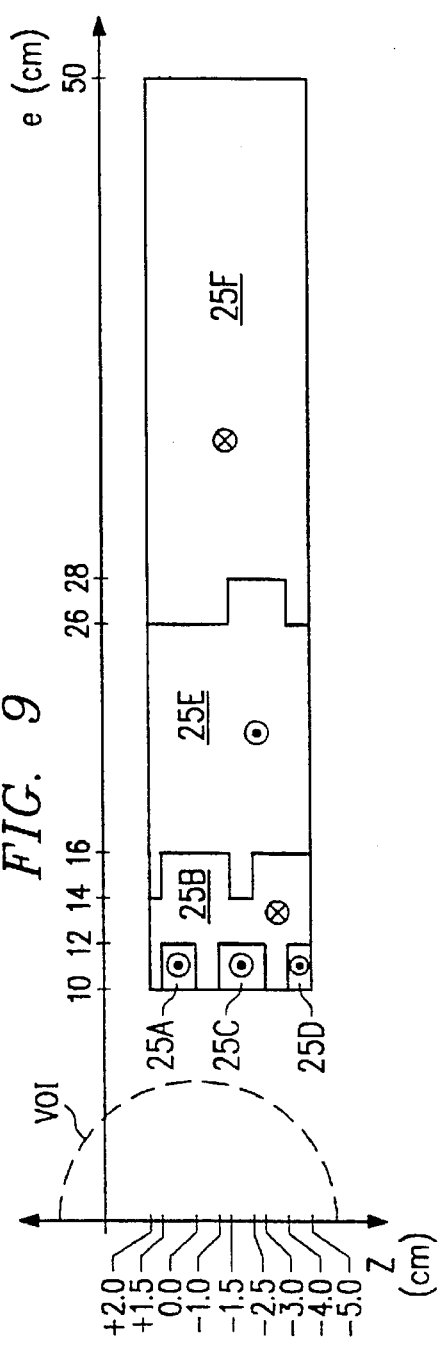
FIG. 9
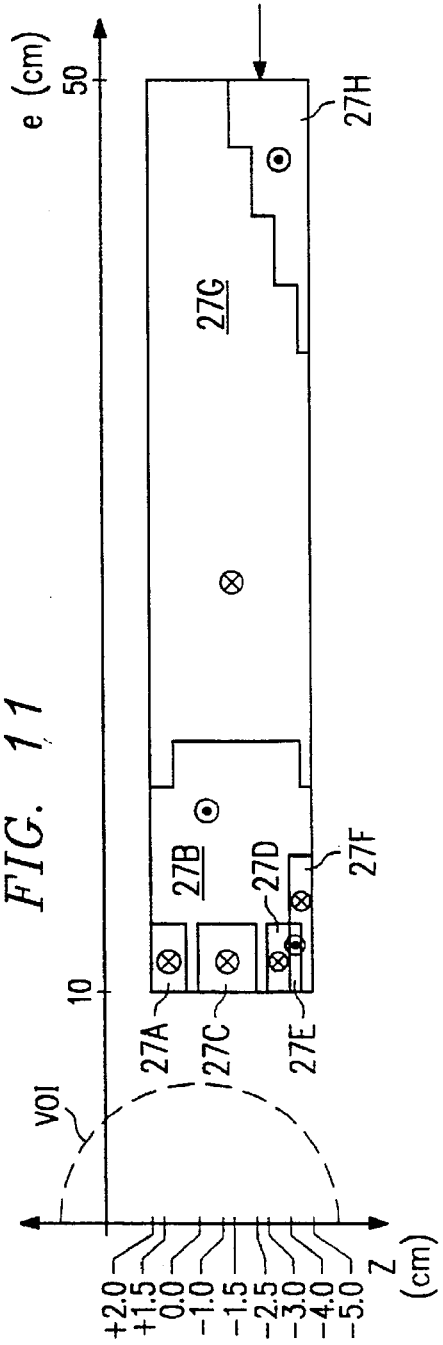
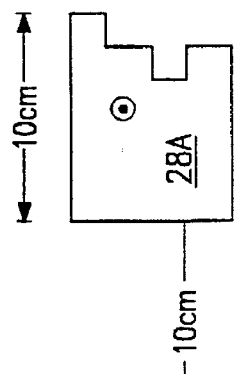
FIG. 11

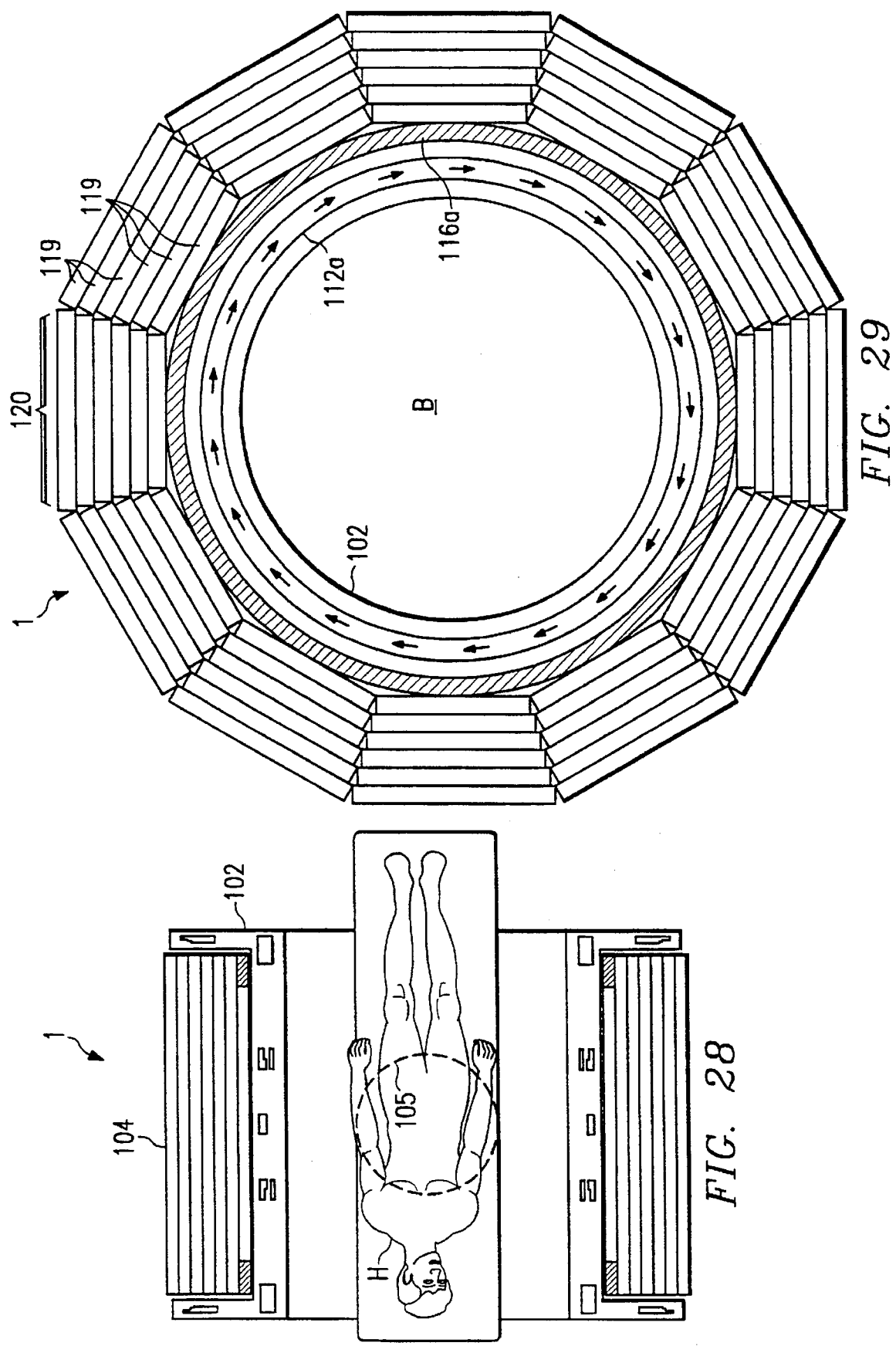

STRUCTURED COIL ELECTROMAGNETS FOR MAGNETIC RESONANCE IMAGING

This application is a continuation-in-part of application Ser. No. 07/869,544, filed Apr. 15, 1992, now U.S. Pat. No. 5,359,310. This application is also a continuation-in-part of application Ser. No. 07/926,667, filed Aug. 6, 1992, now U.S. Pat. No. 5,382,904.

This invention is in the field of electromagnets, and is more particularly directed to a shielded superconducting electromagnet for use in magnetic resonance imaging.

BACKGROUND OF THE INVENTION

High magnetic field electromagnets have become important elements in various types of equipment over recent years. One important type of such equipment is medical imaging equipment, such as the type commonly referred to as magnetic resonance imaging (MRI) equipment. This equipment utilizes the mechanism of nuclear magnetic resonance (NMR) to produce an image, and accordingly imaging systems operating according to this mechanism are also commonly referred to as NMR imaging systems.

As is well known in the field of MRI, a high DC magnetic field is generated to polarize the gyromagnetic atomic nuclei of interest (i.e., those atomic nuclei that have nonzero angular momentum, or nonzero magnetic moment) contained within the volume to be imaged in the subject. The magnitude of this DC magnetic field currently ranges from on the order of 0.15 Tesla to 2.0 Tesla; it is contemplated that larger fields, ranging as high as 4.0 to 6.0 Tesla, may be useful in the future, particularly to perform spectroscopy as well as tomography. The volume of the subject to be imaged (i.e., the volume of interest, or "VOI") is that volume which receives the high DC magnetic field, and within which the DC field is substantially uniform.

Imaging is accomplished in the VOI utilizing the mechanism of nuclear magnetic resonance in the gyromagnetic atomic nuclei contained therewithin. As such, in addition to the large field DC magnet, the MRI apparatus includes an oscillator coil to generate an oscillating magnetic field oriented at an angle relative to the DC field, and at a frequency matching the resonant frequency of the atoms of interest in the selected volume; frequencies of interest in modern MRI are in the radio frequency (RF) range. As the gyromagnetic nuclei in the defined volume will have a common resonant frequency different from atoms outside of the volume, modulation of a gradient magnetic field (produced by a gradient coil) allows sequential imaging of small volumes. The images from the small volumes are then used to form a composite image of the larger volume, such as the internal organ or region of interest. To produce the series of images, the MRI apparatus also includes a detecting coil in which a current can be induced by the nuclear magnetic dipoles in the volume being imaged.

In operation, as is well known, the magnetic dipole moments of those atoms in the volume which are both gyromagnetic and also resonant at the frequency of the oscillating field are rotated from their polarized orientation by the resonant RF oscillation by a known angle, for example 90°. The RF excitation is then removed, and the induced current in the detecting coil is measured over time to determine a decay rate, which corresponds to the quantity of the atoms of interest in the volume being imaged. Incremental sequencing of the imaging process through the selected volume by modulations in the gradient field can provide a series of images of the subject that correspond to the composition of the subject. Conventional MRI has been successful in the imaging of soft tissues, such as internal organs and the like, which are transparent to X-rays.

It is well known in the art that the spatial resolution of MRI tomography improves as the strength of the available magnetic field increases. Conventional MRI equipment useful in diagnostic medical imaging requires high DC magnetic fields, such as 5 kgauss or greater.

Due to the large number of ampere-turns necessary to produce such high magnetic fields, conventional MRI systems now generally utilize superconducting wire in their DC coils. While the magnitude of the current carried in these coils is extremely high, the superconducting material and accompanying cryogenic systems required in such magnets are quite expensive, and also add significantly to the size and weight of the magnet in the MRI apparatus. In the extreme case, some conventional MRI magnets are sufficiently heavy (e.g., on the order of twenty tons) as to limit the installation of the MRI apparatus to a basement or ground floor laboratory. Addition of the necessary coils or iron required to shield the fringe magnetic field generated by such magnets further increases the size, weight and manufacturing costs of the MRI equipment.

By way of background, U.S. Pat. No. 4,783,628 (issued Nov. 8, 1988) and U.S. Pat. No. 4,822,772 (issued Apr. 18, 1989), both incorporated herein by this reference and commonly assigned with this application, describe superferric shielded superconducting magnets. These magnets described in these patents utilize passive shielding of ferromagnetic material, such as iron. The construction of the magnets described in these patents provide a highly efficient magnet, considering the magnetic field strength as a function of the current conducted in the superconducting loops, and with a highly uniform field in the magnet bore even at very strong magnetic fields such as on the order of 4 Tesla; the shielding is also very good in this magnet, with the 5 gauss line at 50 to 100 cm from the outer wall of the bore.

Another example of a conventional superconducting magnet, but which relies substantially on active superconducting shielding loops is described in U.S. Pat. No. 4,595,899. The magnet disclosed in this reference has a set of three driving coils surrounded by three shielding coils, with the current through the shielding coils adjusted to exactly cancel the dipole outside of the magnet. External ferromagnetic shielding is also located around the shielding coils to assist in further shielding. Examples of other prior magnets used in MRI are described in U.S. Pat. No. 4,612,505, in which shielding is accomplished by way of magnetic soft iron rods, conducting coils, or both; U.S. Pat. No. 5,012,217, issued Apr. 30, 1992, describes yet another prior superconducting magnet utilizing a combination of active and passive shielding.

While actively shielded magnets greatly reduce the magnet weight relative to superferric shielded magnets, the weight of these magnets is still quite substantial, for example on the order of 20 tons. As a result, when used in medical equipment such as NMR stations, the "footprint" required for installation of the magnet and the weight-bearing capability of the floor of the room are both significant, whether the magnet is constructed of the superferric type, the actively shielded type, or a combination of the two. As a result, from the cost standpoint, it is desirable to reduce the physical size and weight of NMR equipment, to reduce the cost of the NMR laboratory.

As indicated in U.S. Pat. No. 4,595,899, and as is true for other conventional electrically shielded magnets, any ferromagnetic shielding used in the magnet is generally located some distance away from the magnet bore. Such placement is intended to limit the effect of iron on the shape and uniformity of the magnetic field in the bore, because, as is well known in the art, iron or other ferromagnetic material near the bore will non-linearly affect the field within the bore, especially at fields above the threshold of magnetic saturation for iron at about 1.0 to 1.3 Tesla. As a result, the sole effect of the iron in these conventional magnets is to provide fringe field shielding at some distance from the magnet, with minimal effect on the field within the bore intended. In some cases, the ferromagnetic shield is located as far away from the bore as to be within the walls of the room surrounding the magnet (or MRI apparatus containing the magnet). This distancing of the ferromagnetic material from the bore causes significant problems in use of the magnets and equipment, either requiring large "footprints" for the magnet and its shielding, or requiring the specially constructed rooms to house the magnet or NMR equipment, either approach resulting in high cost and poor space utilization.

Examples of other prior magnets used in MRI are described in U.S. Pat. No. 4,612,505, in which shielding is accomplished by way of magnetic soft iron rods, conducting coils, or both. In particular, FIG. 3 of U.S. Pat. No. 4,612,505 discloses the use of a pair of relatively large superconducting shielding coils disposed outside the magnet. In addition, FIG. 4 of this reference illustrates a magnet having a shielding sleeve of magnetic soft iron, and shielding coils disposed outside thereof. The magnets disclosed in this reference have relatively low field strengths, such as on the order of 0.23 to 0.3 Tesla, and somewhat high fringe fields, such as 10 gauss or greater at a distance of three meters from the magnet axis.

U.S. Pat. No. 5,012,217, issued Apr. 30, 1992, describes yet another prior superconducting magnet utilizing a combination of active and passive shielding. This reference discloses the placement of a passive ferromagnetic shield around the main driving solenoid, but within the shielding solenoid (which generates the opposing magnetic field). This construction apparently requires that the large mass of the ferromagnetic shield be placed within the cryostat, substantially increasing the cryogenic load and, accordingly, the cost of maintaining the superconducting coils at superconducting temperatures.

In conventional magnets utilizing electrical shielding, either alone or in combination with ferromagnetic shielding, the cost of superconducting material for the outer coils is on the same order as that for the inner driving coils. The cryogenic load is also quite large for superconducting actively shielded magnets, due to the additional superconductors. In addition, it is believed that it is difficult to achieve uniformity of the magnetic field within the bore of the magnet where shielding is accomplished by cancellation of opposing fields, particularly where the desired magnetic field is 1.5 Tesla or greater.

Additional discussion of the effect of iron on the field within the magnet bore is presented in Siebold, et al., "Performance and Results of a Computer Program for Optimizing Magnets with Iron", *IEEE Trans. Magnetics*, Vol. 24, No. 1 (IEEE, January 1988), pp. 419–422. As particularly noted in FIG. 3 of this article, the coil system must be designed and adapted relative to the iron yoke in order to provide a uniform field in the bore.

The weight and size of the superferric shielded magnets described in U.S. Pat. Nos. 4,783,628 and 4,822,772 can be quite substantial, however, such as on the order of 35 to 130 tons (as compared with actively shielded magnets weighing on the order of 20 tons). As a result, when used in medical equipment such as NMR stations, the "footprint" required for installation of such a magnet, as well as the weight-bearing capability of the floor of the room, are both significant. It is, of course, desirable to reduce the physical size and weight of NMR equipment, thus reducing the cost of the NMR laboratory. Besides the large footprint of conventional NMR magnets, it has been observed that many patients are uncomfortable when placed in magnets of such length, as the patient's entire body is generally disposed within the magnet during much of the imaging procedure. Indeed, conventional cylindrical NMR magnets have been referred to as "tunnel" magnets, representing the sensation perceived by the human subject when placed inside for an imaging procedure. It is therefore also desirable to provide a high magnetic field magnet for purposes of NMR which has good field homogeneity, but where the axial length of the bore is as short as possible.

By way of further background, it should be noted that the driving coils for magnets such as described in the above-referenced U.S. Pat. Nos. 4,783,628 and 4,822,772 are cylindrical in shape, so that a uniform magnetic field is provided over a portion of the axial length of the bore. As described, for example, in U.S. Pat. Nos. 4,587,490 and 4,590,428, and in Everett, et al., "Spherical coils for uniform magnetic fields," *J. Sci. Instrum.*, Vol. 43 (1966), pp. 470–74, it is also known to provide spherical or quasi-spherical coil arrangements to produce a homogeneous magnetic field within the bore.

In addition, it is also known to provide error, or trim, coils in conventional iron-shielded magnets to provide adjustment of the homogeneity of the magnetic field within the bore. One example of such a magnet is described in U.S. Pat. No. 4,490,675, in which the error coils are disclosed as being within the soft iron cylindrical shield. U.S. Pat. Nos. 4,590,428 and 4,587,490 also disclose NMR or MRI magnets including main and error coils within an iron cylinder.

By way of further background, U.S. Pat. No. 4,924,185 discloses another cylindrical superconducting magnet. As disclosed therein, the sense of oppression on the part of the patient is reduced as the ratio of bore length to bore diameter is below 1.90.

By way of further background, U.S. Pat. No. 4,689,591 discloses a superconducting magnet having a plurality of coaxial coils arranged asymmetrically along the axis, resulting in a volume of interest that is offset from the midplane of the magnet. The volume of interest in this magnet, while offset, remains deeply within a cylindrical bore, however, requiring whole body insertion of the patient for MRI procedures.

Another known type of conventional MRI magnet is of the Helmholtz coil type, including such a magnet which utilizes thermally insulated niobium/tin superconducting material. However, this magnet also requires the patient's whole body to be inserted between the Helmholtz coils.

By way of further background, U.S. Pat. No. 5,049,848, issued Sep. 17, 1991, discloses a magnet configuration suited for MRI in mammography. This magnet configuration is of rectangular shape, and includes permanent magnets for generating magnetic flux in two planes in the gap g within which the imaging is to take place. A shimming electromagnet is disclosed as being placed behind the patient, for reducing front edge fringe field.

By way of further background, notched cylindrical coil systems for providing strong magnetic fields are known, as described in M. W. Garrett, "Thick Cylindrical Coil Systems for Strong Magnetic Fields with Field or Gradient Homogeneities of the 6th to 20th Order", *J. Appl. Phys.*, Vol. 38, No 6 (1967), pp. 2563–86. As described in this reference at pages 2578–2583, expansion of ideal magnet elements to larger cross sections by modifying the geometry in an iterative fashion according to Lyle's Principle can be used to arrive at a magnet having a negative current polarity notch or cavity coil within the otherwise cylindrical positive coil; the notch may be at either the inner or the outer radial surface (see FIG. 2 of the reference), or even wholly within the positive coil.

In the method described in the above-cited Garrett article and also according to other conventional methods for designing cylindrical magnets, the designer relies on the property that the axial component of the magnetic field in the bore is a harmonic function within the volume of interest (VOI), which can be expanded into a series of spherical harmonics. The coefficients of this expansion may be expressed as axial derivatives of the axial magnetic field at the origin (center of the VOI). If one assumes that the current density in the cross-section of each magnet coil is constant, these axial derivatives may be calculated directly from coil geometry, without requiring integration of the Biot-Savart Law, allowing the geometry of the magnet to be adjusted so that the undesirable harmonics of the axial field in the VOI vanish. According to this generalized technique, computer-ready methods have been developed with tabular design conditions (see the Garrett article cited above), facilitating the design of such magnets. This general method constrains the location of the VOI to a high degree, however, in order for the calculations to be readily performed; as such, this general method is practically applicable for a VOI centered at the midplane of the cylindrical magnet.

By way of further background, a widely-used conventional method of designing magnets will now be described relative to FIG. 21. FIG. 21 is a cross-sectional representation of a magnet to be designed for generating a magnetic field of desired magnitude, direction and uniformity in a volume of interest VOI. The representation of FIG. 21 is a quadrant of the z-$\rho$ plane, for a conventional magnet that is both axially symmetric about the $\rho=0$ axis, and midplane-symmetric about the z=0 axis. According to conventional techniques, the magnet designer selects the number of coils in the magnet and the shape of the cross-section of each coil. For example, in the magnet of FIG. 21, three coils 70A, 70B, 70C of rectangular cross-section (in the z-$\rho$ plane) are postulated, along with their initial locations and their current magnitude and polarities.

In the conventional design methodology, the magnetic field in volume of interest VOI is determined, generally by use of a conventional simulation program such as the OPUS computer program, available from Ferrari Associates, Inc. of Jacksonville, Fla. Optimization of the magnetic field parameters toward the design goal is then performed by iterative adjustment of the size, location and current in the coils 70A through 70C, followed by evaluation of the field after each incremental adjustment. Upon the simulated field reaching the optimal condition relative to volume of interest VOI, the position, current and size of each coil is then determined. For the magnet in FIG. 21, for example, the best field (or minimized error) condition is for coils 70A', 70B', 70C' in the position shown.

Comparison of the optimized coils 70A', 70B', 70C' to the initial coils 70A, 70B, 70C in FIG. 21 illustrates the design freedom provided according to conventional magnet design techniques. The number of coils (e.g., three per quadrant) and their shape (e.g., rectangular) remain fixed in this conventional methodology. As such, the magnet design may only adjust the size, aspect ratio, current and location of the coils in obtaining the desired magnetic field. While this number of degrees of freedom is often adequate in the design of cylindrical magnets of modest field magnitude and uniformity requirements where the volume of interest is centered within the bore, this conventional methodology has been observed to be inadequate to successfully design magnets where the volume of interest is not centered within the bore, particularly where the field strength and uniformity requirements are quite stringent.

It is therefore an object of the present invention to provide an electromagnet constructed according to a method having a larger number of degrees of freedom in its optimization.

It is a further object of the present invention to provide such an electromagnet in which the number of coils and their cross-sectional shape (i.e., both the coil boundaries and the number of boundaries) are design parameters and may be selected in optimizing the field strength and uniformity in a selected volume of interest.

It is a further object of the present invention to provide such a method of fabricating a magnet which is applicable to magnets of various symmetry, including cylindrical and planar magnets.

It is a further object of the present invention to provide such a magnet which allows for optimization of the design for a volume of interest at an arbitrary position relative to the bore, including offset from the center of the bore so as to protrude from the bore.

It is a further object of the present invention to provide such a method which allows the center of the volume of interest to be located outside of the magnet bore.

It is a further object of the present invention to provide a superconducting magnet for use in NMR equipment which does not require insertion of the whole body of the patient into the magnet bore.

It is a further object of the present invention to provide such a magnet which is of sufficient field strength to enable in vivo NMR tomography of the internal organs of humans.

It is a further object of the present invention to provide such a magnet which is suitable for the image of specific organs, such as the brain, the female breast, and the like.

It is a further object of the present invention to provide such a magnet which makes the NMR tomography equipment substantially portable.

It is a further object of the present invention to provide an extremely compact superconducting magnet having a high degree of effective shielding.

It is a further object of the present invention to provide such a magnet having a large aperture into which a patient may be placed.

It is a further object of the present invention to provide such a magnet having relatively light weight and low cost.

It is a further object of the present invention to provide such a magnet which can be fabricated using a single cryostat.

Other objects and advantages of the present invention will be apparent to those of ordinary skill in the art having reference to the following specification together with the drawings.

SUMMARY OF THE INVENTION

The invention may be implemented into a superconducting magnet useful in the NMR tomography of human organs, and a method of fabricating the same. According to the method of the present invention, a region of the plane of symmetry is selected within which currents of a given range are allowed to exist, such a region referred to as a "tiling". The location and attributes of target points, such as the volume of interest in NMR tomography, are also selected. An optimization procedure, such as constrained quadratic optimization of the error form between the simulated magnetic field and the desired values, is then performed to determine the current at various locations within the tiling. The phenomenon of clustering occurs in this optimization, resulting in the definition of contiguous regions of the tiling with common current magnitude and polarity, generally at the limit of the allowable range, which allows actual magnets to be readily fabricated according to conventional techniques.

The invention thus enables the construction of magnets in which the volume of interest may be positioned at locations offset from the center of the magnet bore, including at locations where the center of the volume of interest protrudes from, or is even fully outside of, the bore. This enables magnets to be specifically designed for the NMR tomography of organs or appendages of the human body, including the female breast, the head, and the like, without requiring the entire body of the patient to be inserted into a magnet bore. The discomfort level of the patient during tomography procedures is thus reduced, and tomography equipment of compact size and weight can result.

The invention may also be implemented in a cylindrical superconducting magnet utilizing the combination of superferric shielding together with active shielding coils. The shielding coils are placed outside of the superferric shield, but at a radius from the bore within that of the superferric shield and at the ends of the superferric shield, replacing the iron end plate of conventional superferric magnets. As a result, the superferric shield is located extremely close to the bore, and within the gap of the shielding coils. The shielding coils may be located within a single cryostat with the main coils, and the main coils may be formed on bobbins of constant radius, thus significantly reducing the manufacturing cost of the magnet. The resulting magnet may thus generate high fields, above the saturation threshold of iron, at high uniformity within the bore as suitable for MRI, but with low fringe fields and with low total weight.

BRIEF DESCRIPTION OF THE DRAWINGS

FIG. 1 elevation view of a magnet according to the first embodiment of the invention, oriented horizontally.

FIG. 2 is an elevation view of the magnet of FIG. 1, oriented vertically.

FIG. 7 is a cross-sectional elevation view of the magnet of FIG. 6.

FIG. 8 is a cross-sectional plan view of the magnet of FIG. 6.

FIG. 9 is a cross-sectional schematic diagram of the coils in the magnet of FIG. 6, according to an unshielded version thereof.

FIG. 11 is a cross-sectional schematic diagram of the coils in the magnet of FIG. 6 according to an actively shielded version thereof.

FIG. 28 is an axial cross-sectional diagram of the magnet of FIG. 27, illustrating its relationship relative to a human subject, as used in the magnetic resonance imaging context.

FIG. 29 is a radial cross-sectional diagram of the iron shielding for the magnet of FIG. 27.

DETAILED DESCRIPTION OF THE PREFERRED EMBODIMENTS

Figure 3A:
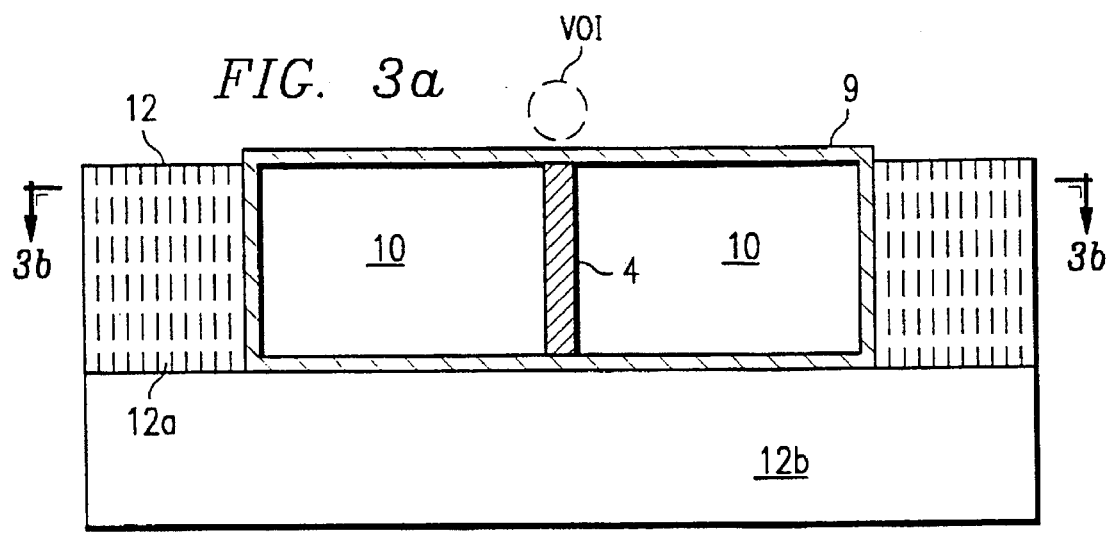
FIGS. 3a and 3b are cross-sectional elevation and plan views, respectively, of the magnet of FIG. 1, illustrating the position of the volume of interest relative to the coils and cryostat.

As noted above, the present invention is directed to superconducting magnets, and methods of fabricating the same, capable of providing high uniformity magnetic fields within a volume of interest as is useful in magnetic resonance imaging (MRI). The following description is intended to present a full description of the invention by way of four exemplary embodiments, each of which is separately presented hereinbelow.

It should further be noted that the method of fabricating a magnet according to the present invention, as described hereinbelow, is applicable not only to cylindrical magnets, but may also be used for magnets of other symmetry. For example, in long magnets of the type used in particle accelerators, the ends of the magnets (in the direction of their length) are effectively infinitely distant from points therewithin, as the ends do not affect the field within the bore at central locations. As such, each cross-section in the plane perpendicular to the axis of the bore is identical to all others. Accordingly, the method described hereinbelow for cylindrical magnets may be applied in the design of such long magnets, considering one of the plane cross-sections therein.

The definition of certain terms used herein will now be provided, for purposes of clarifying the following description. The term "tiling" will be used in this description to identify a region in a plane of a magnet design within which currents are allowed, i.e., within which current values may be set in the optimization procedure. An elemental cross-sectional area within a tiling will be referred to as a "coil element", such that each tiling will be made up of many coil elements. A "coil" will refer to a contiguous grouping of coil elements within a tiling that have the same current polarity, and which will generally have similar current magnitude; these coils correspond to actual physical superconducting coils within the electromagnet fabricated according to the design techniques described herein.

Under-the-Table and Behind-the-Wall Magnet

Referring first to FIG. 1, superconducting magnet 2 constructed according to a first preferred embodiment of the invention, and for providing a high DC magnetic field useful in NMR tomography and thus in MRI equipment, will first be described. According to this first embodiment of the invention, superconducting magnet 2 is partially disposed within floor F of the laboratory room, so as to extend above the level of floor F. The height of the top surface of magnet 2 is preferably on the order of one meter above the surface of floor F, i.e., approximately at table top height thereabove. While DC magnet 2 is illustrated in FIG. 1, gradient coils, RF coils, and detection coils are provided at or near the top surface of magnet 2 to provide the oscillating and gradient fields, and detection capability, necessary in NMR tomography. The enclosure of magnet 2 also roughly corresponds to the dimensions of the cryostat containing the superconducting coils for generating the field and any shielding that is desired, as will be described hereinbelow.

To perform an NMR tomography procedure, patient P is laterally moved over the center portion of magnet 2 until the organ of interest (in this case the head), overlies the location of bore 4 of magnet 2. The arrangement of the coils in magnet 2 described hereinbelow produces a highly uniform magnetic field B throughout a volume of interest ("VOI") above the plane of the surface of magnet 2. In this example, the VOI is a sphere of 20 cm diameter, having its center approximately 15 cm above the surface of magnet 2. The provision of a volume of interest outside of bore 4 of magnet 2 enables the imaging of an organ of patient P without requiring that patient P be inserted into a tunnel or other enclosure. As such, patient anxiety is much reduced while still providing adequate resolution over a reasonably sized VOI.

Referring to FIG. 2, an alternative implementation of magnet 2' is illustrated. In this example, magnet 2', constructed similarly as magnet 2 of FIG. 1 and in the manner described hereinbelow, is oriented vertically so as to have its outer active surface substantially perpendicular to floor F, and flush with the surface of wall W. In this example, bore 4 is oriented horizontally, such that the coils inside of magnet 2 generate magnetic field B in a direction parallel to floor F, and substantially uniform over a VOI outside of magnet 2. Generated field B is preferably also approximately one meter above the surface of floor F, at table-top height, so that the selected organ of patient P (e.g., the brain, as shown in FIG. 2) may be readily imaged. In this example, patient P is placed on bed 6 which has a height corresponding to the position of bore 4. As in the case of magnet 2 of FIG. 1, generation of uniform field B in a volume of interest outside of bore 4 allows for NMR imaging of a patient's organs without insertion of the patient into a magnet bore, and thus enabling high resolution imaging with a greatly reduced sense of oppression from the viewpoint of the patient.

In each of FIGS. 1 and 2, it should be noted that magnet 2 is individually illustrated. It is of course to be understood that the remainder of the overall MRI system will be provided in combination with magnet 2, which provides the large DC magnetic field. For example, besides magnet 2, conventional MRI systems include gradient coils and RF coils for generating the gradient field within the VOI and the radio frequency magnetic field excitation, respectively, both necessary in conventional MRI. In addition, detecting coils will also be provided in which a current is induced from the response of gyromagnetic nuclei in the VOI to the magnetic fields applied thereto; a conventional computer control and image storage system will also be provided. The design of these particular additive elements will depend, of course, upon the particular MRI system design desired, although it is highly preferred that the gradient, RF and detecting coils be located under the table height of magnet 2 (FIG. 1) and behind wall W (FIG. 2). It is contemplated that one of ordinary skill in the art will be able to provide such additional features to magnets 2, 2' according to this embodiment of the invention, utilizing conventional technology. For example, conventional technology for the design of gradient coils is described in Pissanetzky, "Minimum energy MRI gradient coils of general geometry", *Meas. Sci. Technol.*, Vol. 3 (IOP Publishing Ltd., 1992), pp. 667–673.

Figure 3B:
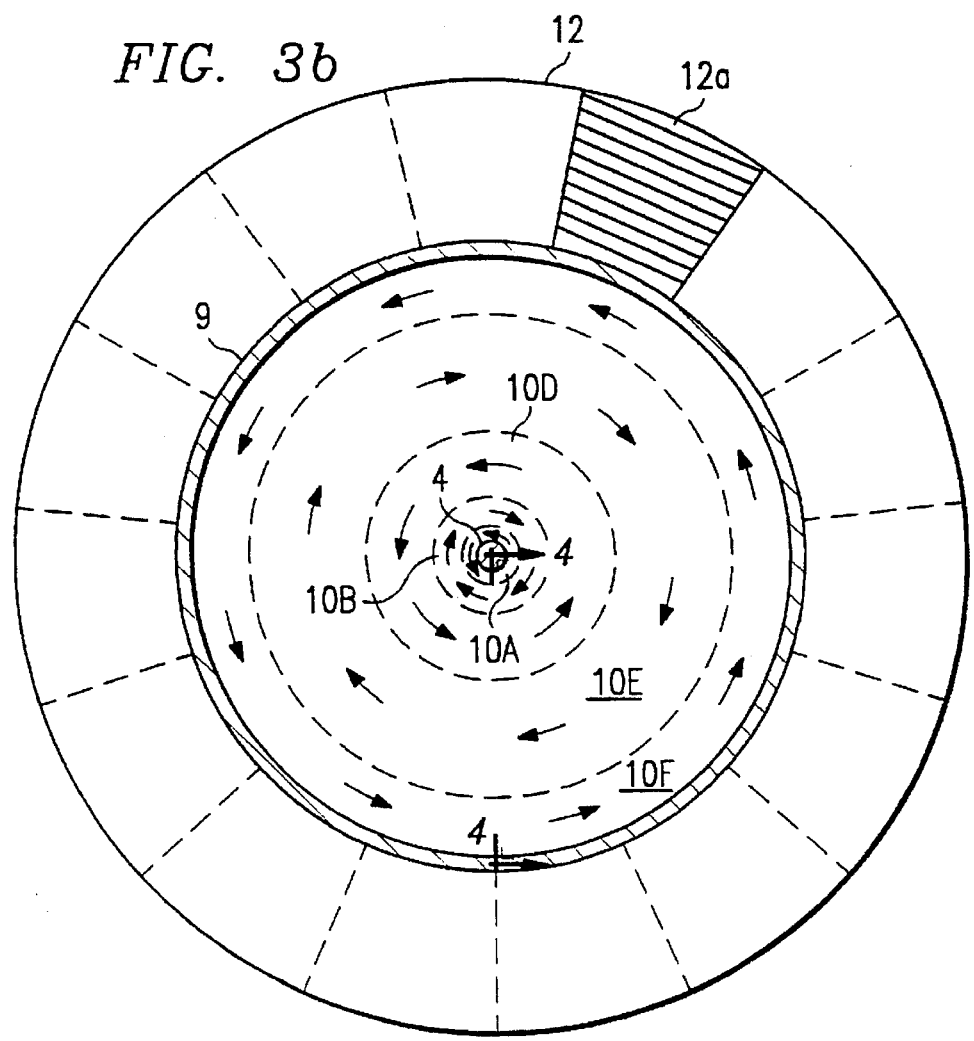

Referring now to FIGS. 3a and 3b, the construction of under-the-table magnet 2 of FIG. 1 will now be described. In this example, magnet 2 is capable of generating a suitably high DC magnetic field, such as on the order of 5 kgauss, with high uniformity (10 ppm or less deviation) over a spherical VOI of diameter on the order of 20 cm, and centered approximately 10 cm above the top surface of the coils of magnet 2.

FIG. 3a illustrates the construction of magnet 2 in a cross-sectional elevation view, while FIG. 3b illustrates magnet 2 in a cross-sectional plan view. According to this embodiment of the invention, magnet 2 includes coil assembly 10 disposed within cryostat 9. Coil assembly 10 includes multiple coils 10A through 10F, each having multiple turns of superconducting wire disposed within conventional bobbin structures about air bore 4, to generate a magnetic field in a direction parallel to the axis of bore 4. The arrangement of superconducting coils 10A through 10F, and the polarity and magnitude of current conducted thereby will be described in further detail hereinbelow.

Conventional superconducting wire may be used in coils 10A through 10F according to this embodiment of the invention. An example of such conventional superconducting wire is SCOK superconducting wire manufactured and sold by Outokumpu Copper (U.S.A.) Inc. of Glendale Heights, Ill. The SCOK wire consists of 1.05 mm (O.D.) 2.32:1 Cu/NbTi wire, having a rating of 570 A at 6 Tesla fields; the capacity of this wire thus exceeds the 500 A current rating of conventional persistent switches. The coils are insulated from one another in the conventional manner, and placed within conventional bobbins at the locations within cryostat, leaving sufficient space interstitially between the wires to allow for a substantial amount of copper stabilizer, mechanical banding, and grooves to allow the circulation of cryogenic fluid therethrough.

Cryostat 9 is a conventional non-magnetic stainless steel shell, such as 304L stainless steel, of sufficient strength to allow for its interior to be pumped down to the desired vacuum when chilled to superconducting temperatures, and to provide the desired structural support for the bobbins within which the superconducting coils wire is placed and also the ducting of the cryogenic coolant. Conventional cryogenic compressor equipment (not shown) is connected to cryostat 9 by way of conventional ducting to cool the interior of cryostat 9 to superconducting temperatures. For example, where the superconducting wire is formed of a niobium titanium alloy, the upper limit on the superconducting temperature is 9.2° K. An example of a cryogenic unit capable of maintaining such temperature is model CGR511-4.5 manufactured and sold by CVI, Inc., which uses liquid helium as the coolant fluid.

Also according to this embodiment of the invention, iron shield 12 is disposed outside of coil assembly 10 and cryostat 9. Iron shield 12 provides shielding of the magnetic field in the conventional sense, thus reducing the fringe field from magnet 2. In addition, it is contemplated that iron shield 12 will also serve to enhance the magnetic field generated by magnet 2, as described in the above-referenced U.S. Pat. Nos. 4,783,628 and 4,822,772.

In order to minimize the cost of manufacturing, and particularly the tolerances to which iron shield 12 must be formed, it is preferred that iron shield 12 include a series of iron plates 12a disposed around coil assembly 10, with both iron plates 12a and coil assembly 10 overlying a lower iron shield unit 12b. As illustrated in FIG. 3b, plates 12a are preferably arranged adjacent to and parallel with one another in a direction parallel to the axis of bore 4, and in multiple segments around the circumference of the circular cross-section of coil assembly 10 (see FIG. 3b). Each plate 12a defines a chord in the circular cross-section of the magnet, and extends the height between the surface of magnet 2 and the top of lower iron shield portion 12b. The preferred material of plates 19 is 1008 steel, which is ferromagnetic as is well-known. The width of plates 12a increases with its radial distance from bore 4 to substantially fill the volume within the arc defined by its segment. In this example, fifteen segments of iron plates 12a surround bore 4 and coil assembly 10.

Lower iron shield portion 12b, underlying coil assembly 10 and plates 12a, may either be formed of a single slab of iron or, alternatively, of a plurality of iron plates of circular cross-section oriented so that the axis of bore 4 is normal thereto.

In the alternative to provision of cryostat 9 within iron shield 12, the cryostat volume may also include iron shield 12. While the cryogenic load will be substantially increased for this alternative construction, the closer proximity of iron shield 12 to coil assembly 10 can result in improved shielding.

Magnet 2 constructed according to this embodiment of the invention can be constructed for a 20 cm diameter VOI without requiring a huge volume for its implementation. In an example of magnet 2 contemplated to be fabricated according to this embodiment of the invention, the overall diameter of magnet 2 (including iron shield 12) is on the order of 370 cm; the height of magnet 2, measured from the bottom of lower iron shield 12b to the top edges of iron shield plates 12a (and the top surface of coil assembly 10), is on the order of 140 cm. The radial thickness of each segment of iron shield plates 12a, when assembled, is on the order of 60 cm, and the thickness of lower iron shield portion is also on the order of 60 cm. The diameter of bore 4 in this example is approximately 4 cm, and the radius of coil assembly 10 (measured from the axis of bore 4 to its outer circumference) is on the order of 185 cm. The thickness of coil assembly 10 is on the order of 80 cm.

FIG. 3b illustrates that coil assembly 10 includes coils 10A, 10B, 10C, 10D, 10E and 10F, having varying total current magnitudes and polarity relative to one another. The arrows illustrated in FIG. 3b indicate the direction of current therewithin corresponding to magnetic field B having an orientation coming out of the page. The cross-sectional size, location, current magnitude and current polarity in each of coils 10A, 10B, 10C, 10D, 10E and 10F is preferably determined according to the "structured coils" methodology, as described in Pissanetzky, "Structured coils for NMR applications" *IEEE Trans. Magnetics*, vol. 28, No. 4 (IEEE, July 1992), pp. 1961–1968, and Pissanetzky, "Structured Coils and Nonlinear Iron", presented at the 5th Biennial IEEE Conference on Electromagnet Field Computation, Claremont, Calif. (Aug. 3–5, 1992), both incorporated herein by this reference.

As noted above, conventional design methodology assumes a uniform current density in the cross-section of the coil, and adjusts the coil geometry to reduce undesired field harmonics. In contrast, the structured coils methodology allows the current density within the coil assembly to vary as a function of location, i.e., as a function of both axial and radial distance from the target sphere. This fundamental difference in approach enables the design of magnets for a VOI that is not necessarily centered in the magnet bore, and in a manner that readily comprehends minimization of fringe field and the effects of iron shielding.

According to the present invention, modeling of the magnet construction defines current density in a piecewise constant manner, with the coils divided into small sections of equal rectangular cross-section (i.e., the coil elements), each having its own current magnitude. The desired field magnitude and direction at target locations within the VOI are selected; field direction and magnitude at target locations in the space-surrounding magnet 2 may also be selected to allow the optimization process to consider minimization of the fringe field outside of magnet 2 in setting the coil currents. With the field magnitude at the target locations defined, the coil element currents then become the unknowns of a problem where the fields at the target locations are known, and in which certain constraints in the current density within the coil elements are preset, considering the current capacity of the superconducting material and other physical limitations. In the typical case, the current density constraints in the coil elements define a simplex in the multi-dimensional space of unknown currents, allowing the currents to be solved by way of the well-known Simplex method of mathematical quadratic programming. The operation of the structured coils methodology is thus suitable to be performed on a conventional digital computer, for example a SPARCSTATION workstation manufactured and sold by Sun Microsystems, Inc.

It has been found that the structured coils methodology is particularly useful in that it allows for most currents in the coil elements to be set at their upper or lower bound. In magnet 2 according to this embodiment of the invention, which allows currents of varying polarity within coil assembly 10, the lower bound is a negative current density value. Furthermore, it has been found that the structured coils approach causes "clustering" of like current magnitudes into "coils", which is advantageous as it provides for the physical construction of the coils as sets of coils, of irregular shape but with a constant current density therein, as in the case of magnet 2. The optimization process causes most, if not all, of the currents to attain their upper or lower bounds. Furthermore, the "clustering" of like currents results in a coil cross-section being divided into a few compact, consolidated regions of irregular shapes, i.e. "structured coils". Such structured coils can readily be constructed from a few sections of uniform winding, because the current density is uniform within each consolidated region.

As described in the Pissanetzky IEEE article incorporated herein by reference, it is preferable to utilize the structured coils methodology by using an "approaching target" strategy, where a target value is selected for each target location, and where the difference between actual field and the target field value is minimized by way of constrained quadratic optimization of the error form. This minimization is facilitated in the cylindrical coils such as in magnet 2 of the present invention, where the number of coil elements is much larger than the number of target locations. As noted above, maximum and minimum current density limits are set for each coil element, defining a non-empty simplex. Simplex minimization of the quadratic error form is then performed, such as by way of the readily available computer software described in Reports AERE-R 9185, TP 401, R 6370 and TP 528, in the Harwell Subroutine Library, Computer Science and Systems Division, Atomic Energy Research Establishment, Harwell, Oxfordshire, England (1984), incorporated herein by this reference. This minimization continues until the current density constraints that prevent further reduction are identified; these constraints are adjusted, and the minimization performed again.

Figure 19A:
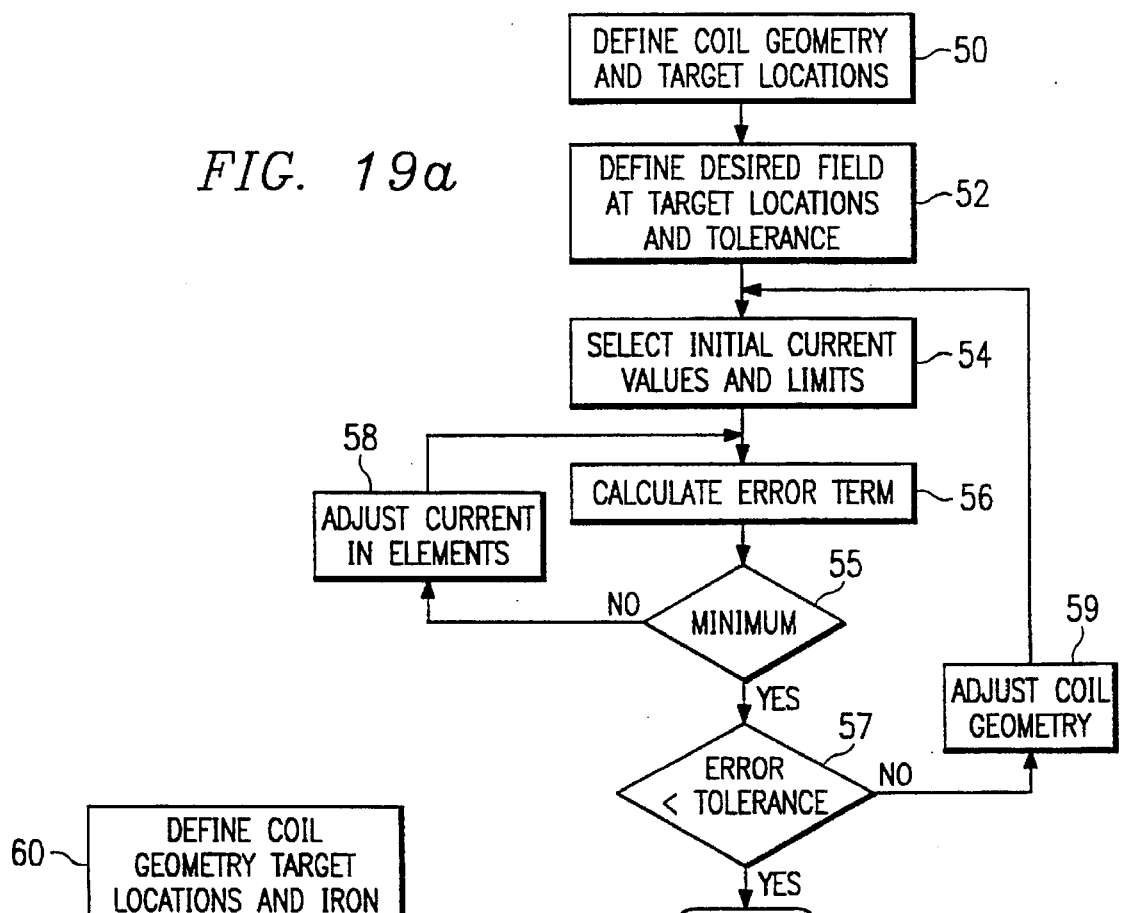
FIGS. 19a and 19b are flow charts illustrating a methodology for magnet design according to the preferred embodiment of the invention.
Figure 20:
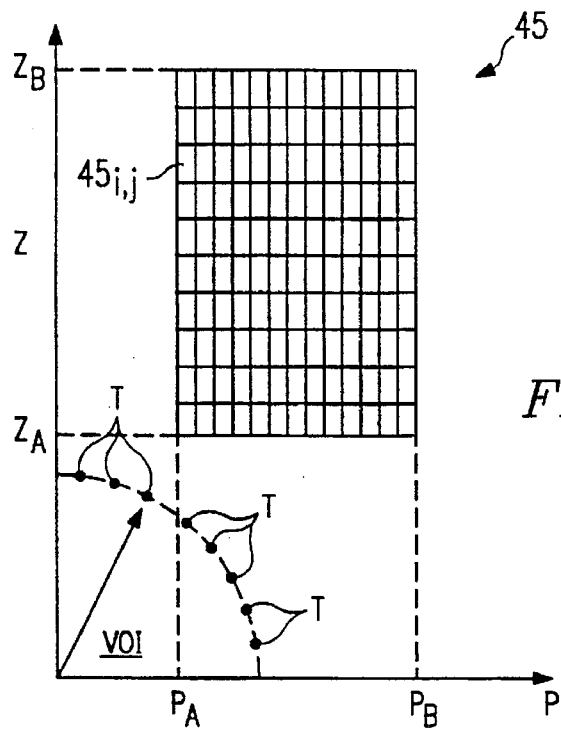
FIG. 20 is a schematic cross-section of a superconducting coil designed according to the methodology of FIGS. 19a and 19b.
Figure 21:
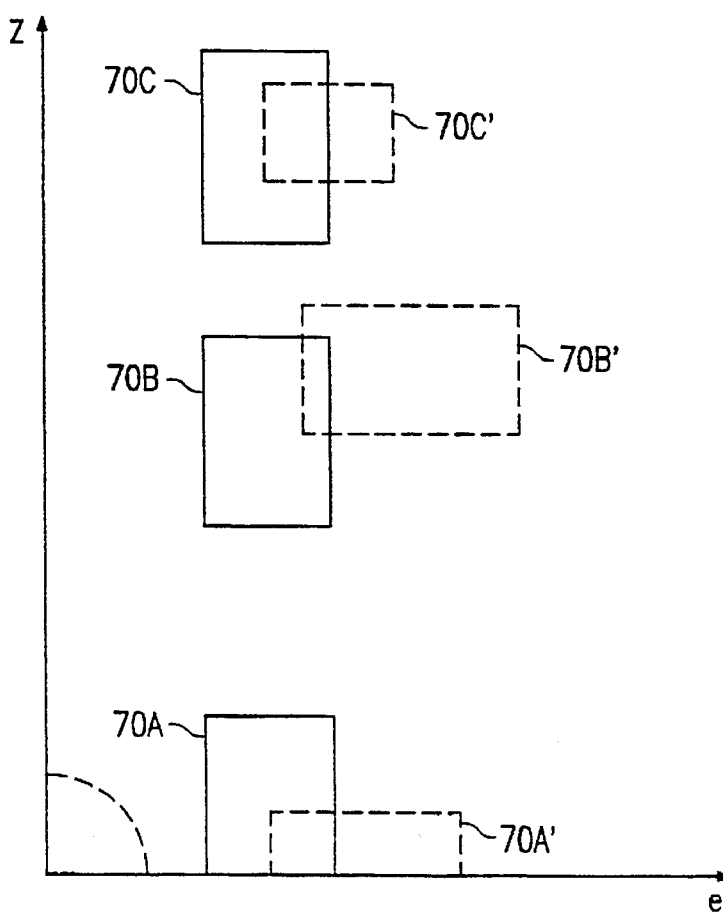
FIG. 21 is a cross-sectional schematic diagram of a quadrant of a conventional magnet, illustrating a conventional design methodology.

FIG. 19a illustrates a flow chart of the methodology for designing magnet 2 according to the preferred embodiment of the invention, relative to an exemplary coil 45 illustrated in quarter cross-section in FIG. 20 and having multiple coil elements $45_j$ therein. As noted above, this methodology may be performed on a conventional digital computer, such as a SPARCSTATION workstation.

In step 50, the tiling and target locations are defined in this example in the z-ρ plane. As noted above, the methodology according to this embodiment of the invention is applicable to magnets of varying symmetry. Magnet 2 useful in MRI systems is of the cylindrical type, and as such the position and size of a tiling is selected to have a rectangular cross-section in one quadrant of the z-ρ plane, where the tiling is the cross-sectional region within which non-zero current values are allowed; coil elements $45_j$ correspond to solid solenoid loops about bore 24 within the tiling. This method may also be applied to a long magnet, such as the type used in particle accelerators, where the effect of the ends of the magnet on the field in the VOI are insignificant; in this case, the cross-section of the magnet illustrated in FIG. 20 is identical to that for a cylindrical magnet, but the coil elements $45_j$ will correspond to infinitely long bars, or wires, extending into and out of the page of FIG. 20. The symmetry of the magnet is thus also defined in process 50 of FIG. 19a, as the field calculations will differ for magnets of different symmetry.

In the example shown in FIG. 20, the VOI has its center at the origin of the z-ρ plane, and is of radius r, and tiling 45 is a rectangular region specified in the z-ρ plane. Target locations T may be defined at the surface of the VOI at the distance r from the origin; since the magnetic field is a harmonic function in the VOI, the magnetic field is guaranteed to be at least as uniform within the interior of the VOI as at its perimeter. The location of tiling 45 is defined relative to the VOI at minimum and maximum z and ρ locations. In the example of FIG. 20, coil elements $45_j$ are arranged in rectangular tiling 45 defined by the $z_A$, $z_B$, $\rho_A$, $\rho_B$ limits in the z-ρ plane. The size of individual coil elements $45_j$ and their arrangement within tiling 45 are also defined in step 50. In addition, as discussed hereinabove, it is preferable that the number j of coil elements $45_j$ be much greater than the number of target locations T, so that a sizable number of degrees of freedom is provided for the solution of the non-empty simplex defined by the dimensional, current and field constraints.

In step 52, the nominal desired field magnitude at the target locations T is defined, along with the acceptable range from the nominal magnitude. As will be described hereinbelow, for the case of actively shielded magnets, target locations outside of the magnet (i.e., $z>z_B$ and $\rho>\rho_B$) may also be defined, at which the stray field is to be reduced to below a maximum value. In step 54, the range of current density for each of coil elements $45_j$ in tiling 45 is set. The lower current density limit is preferably a negative value, so that coils carrying current of opposite polarity may be used to optimize the field; alternatively, with a lower current density limit of zero, coil elements $45_j$ will either carry current of the same polarity or no current. These current density limits are preferably selected according to physical constraints, such as the critical current considerations for superconducting coils, or from the cooling requirements for non-superconducting coils. Also in step 54, an initial value of the current density for each of coil elements $45_j$ is established.

In step 56, an error term is calculated for each of the target locations T, by calculating a weighted sum of the difference between the field produced thereat by the initial value of current density and the desired nominal value for each of coil elements $45_j$. This error term corresponds to:

$$Z = \sum_{i=1}^{n} W_i (B_{zi} - B_0)^2$$

where $W_i$ is the weighting factor for target location $T_i$, where $B_{z\rho}$ is the field at one of target locations T, where n is the number of target locations T, and where $B_0$ is the desired field magnitude at the target location. Each field value $B_{z\rho}$ is preferably calculated as a linear combination of the current carried by each coil element $45_j$ assuming it is a solid solenoid (for cylindrical magnet 2), in the manner described in Urankar, "Vector potential and magnetic field of current carrying finite arc segment in analytical form part III: exact computation for rectangular cross section", *IEEE Trans. Magnetics.*, Vol. MAG-18 (IEEE, 1982), pp. 1860–67, incorporated herein by reference.

Decision 55 determines if the error term is at a global minimum, by determining if a point in the simplex exists which has a smaller value for the error term. This test, in effect, determines if any adjustment in the current value is available which would further reduce the error term Z. If such an adjustment is available, i.e. if the error term is not at its global minimum, process 58 is performed by which the current in the coil elements is adjusted, and the calculation of the error term again performed. Such adjustment of the current density, and thus the minimization of the error term, may be performed according to conventional quadratic programming.

Upon the error term reaching its global minimum (the result of decision 55 is positive), decision 57 is performed by which the value of the error in the field at target locations T (the global minimum for error term Z) is compared against the tolerance limit set in process 52. If the minimum of the error exceeds the tolerance limit, the geometry defined in process 50 cannot meet the desired field uniformity requirements. Accordingly, the size of tiling 45 is then adjusted in process 59, generally by making tiling 45 larger (i.e., increasing the area in the z-$\rho$ plane within which currents are allowed), and the method repeated from process 54 for the new coil geometry. The process continues until the minimum of the error term decreases to meet the tolerance limit, upon which the design is complete (process 59), as the desired magnetic field magnitude and uniformity has been reached, and the size, shape and location of the clustered coils and their current values is determined. It should be noted that this iterative adjustment of the coil geometry in process 59 optimizes the size of tiling 45 for a given tolerance limit.

As noted hereinabove, the method according to this embodiment of the invention generally results in "clustering" of coil elements $45_j$ having the same current density, usually at one of the current limits; each clustered contiguous group of coil elements $45_j$ having like currents is referred to as a "coil". This clustering phenomenon facilitates the construction of the magnet, as the z-$\rho$ plane coils determined by the optimization process correspond to superconducting (or non-superconducting, as the case may be) coils in the actual magnet. Upon determining the current density, size, shape and location of the individual coils, construction of a magnet according thereto may be accomplished in the conventional fashion.

In the alternative to minimization of the error term of the calculated field relative to the desired nominal field, the minimization routine may instead express the zonal coefficients of the field in the VOI as linear combinations of that produced by the current conducted by coil elements $45_j$, for example according to the computer-ready expressions in Garrett and Pissanetzky, "Polygonal coil systems for magnetic fields with homogeneity of the fourth to eighth order", *Rev. Sc. Instr.*, Vol. 42 (1971), pp. 840–857, incorporated herein by this reference. Minimization of these zonal harmonic coefficients subject to the current density limits will also result in a structured coil design. Clustering will also generally occur according to this minimization of zonal harmonic coefficients.

The use of the structured coils methodology greatly increases the number of degrees of freedom available to the optimization of the magnet design over that of conventional methods. As discussed above, conventional magnet design techniques specify the number of coils and their shape; the size, location and currents carried by the coils are design parameters which may be modified to obtain the desired field. In the methodology according to the preferred embodiments of the invention, however, the number of coils and their shape (i.e., the number of boundaries) are also design parameters which may be adjusted during the optimization process. The provision of these additional degrees of freedom results in more rapid and more complete convergence toward the design criteria (i.e., the desired field at the target locations). In addition, it has been observed that the limited degrees of freedom available in the conventional magnet design methodology requires a high degree of symmetry in order to obtain adequate field uniformity. In contrast, the structured coils methodology, in allowing many more degrees of freedom in the optimization, enables the construction of magnets where the volume of interest is not necessarily centered within the bore (i.e., is not necessarily midplane-symmetric) while still obtaining high field strength and high uniformity within relatively large volumes of interest.

In addition to the embodiments described hereinabove, iron shielding may be considered in the design of the coils according to the method described hereinbelow, even though iron presents significant non-linear effects to the magnetic field. For example, magnet 2 of FIGS. 3a and 3b includes iron flux return 12. Consideration of the effects of iron flux return may be made by first optimizing coil shapes for a bore field strength without the iron flux return, and then adding the field enhancement expected from the use of iron in the magnetic loop, according to an alternative method of magnet design shown in FIG. 19b.

Figure 19B:
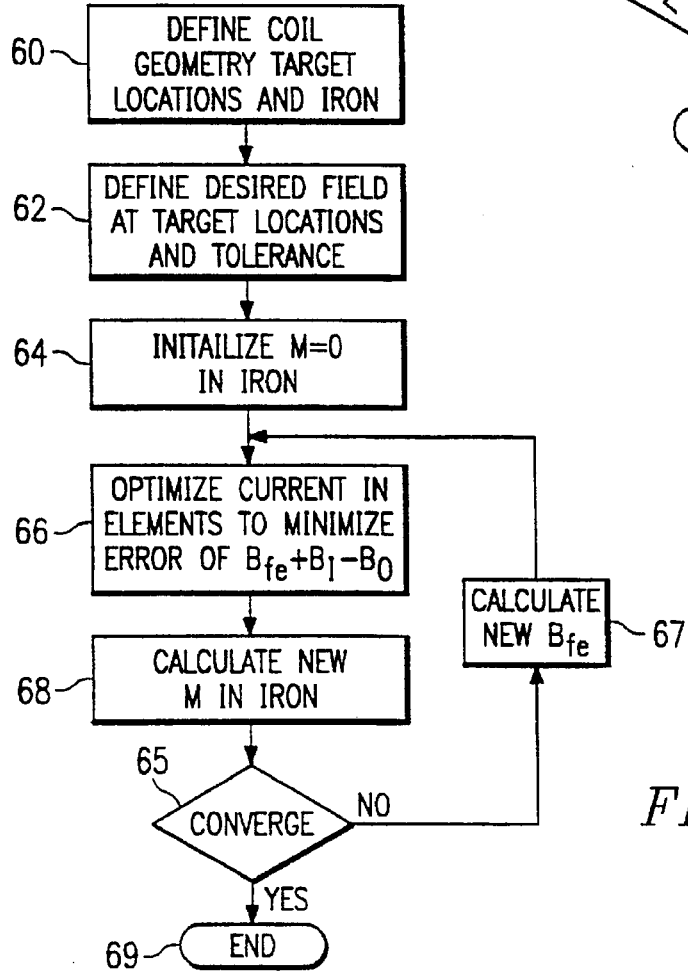

Process 60 in this method of FIG. 19b defines the tiling (i.e., its geometry and location) and target locations, and process 62 defines the desired field at target locations T and the tolerance limit, as in the prior case. In this alternative method, however, process 64 is initially performed by way of which the magnetization M due to the iron flux return is initialized to zero. Process 66 is then performed, in similar manner as processes 56, 58 and decision 55 of FIG. 19a, to optimize the current density in the coil elements. In the calculation of process 66, however, the magnetic field due to the iron ($B_{Fe}$) is added to that produced by the current ($B_j$), prior to its comparison to the nominal desired field $B_0$. After this optimization according to quadratic programming techniques, finite element modeling is used to calculate a new magnetization M in the iron (process 68), for example by way of conventional finite element methods (e.g., the well-known OPUS computer program). Decision 65 is then performed by which the convergence condition is checked; if convergence (either of the error term, or of magnetization M) is not present, process 67 is performed in which a new field $B_{Fe}$ is calculated based on the new magnetization M in the iron, and the error term minimization of process 66 performed again. Upon completion (the result of decision 65 being positive), the magnetic field is optimized in the VOI, and the size, shape, location and current carried by the coil elements defined; clustering also tends to occur in the design of iron shielded magnets according to the present invention, similarly as in the case of non-shielded magnets.

The magnetization M, or field enhancement factor, thus allows optimization of the currents in the defined coil shapes for field uniformity in the VOI. The result is successful so long as the current adjustments are not so significant that the coil shape optimization is defeated. The design of coil currents described hereinbelow contemplates the presence of iron shield 12, and was accomplished by this method.

Figure 4:
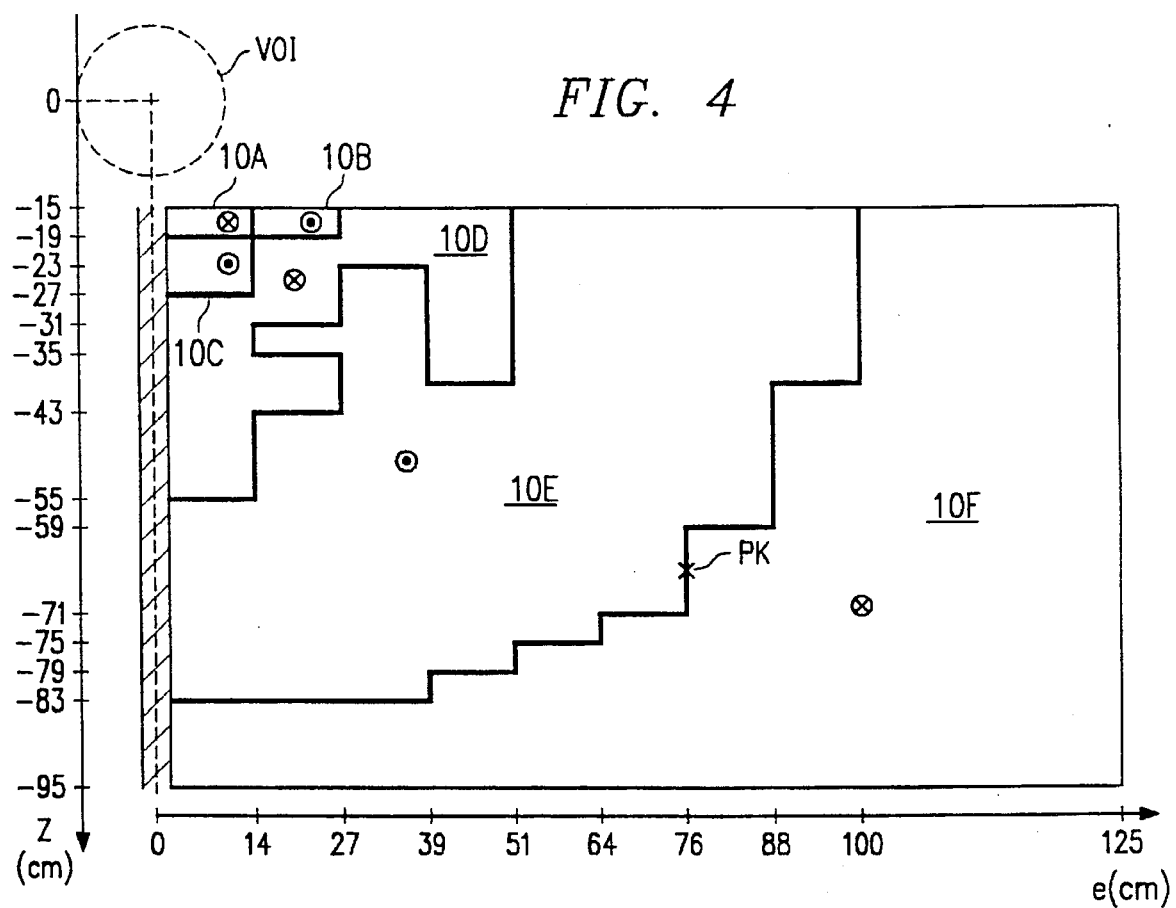
FIG. 4 is a cross-sectional schematic diagram of the coils in the magnet of FIG. 1, presented in an elevation view.

Referring now to FIG. 4, the shape and current of coils 10A through 10F in this example of magnet 2 according to this embodiment of invention will now be described, as optimized for a spherical VOI of 20 cm diameter located outside of bore 4 in combination with a low fringe field outside of iron shield 12. FIG. 4 illustrates the right-hand half of the elevation cross-section of coil assembly 10 shown in FIG. 3, as indicated by the presence of bore 4. The z-axis dimensions in FIG. 4 are measured from the center of the VOI (i.e., from 15 cm above the top surface of coil assembly 10), and the ρ-axis dimensions are measured from the axis of bore 4 (i.e., 2 cm to the left of the left-hand edge of the right-hand half of coil assembly shown in FIG. 4).

The arrangement of the coils 10A through 10F in FIG. 4 resulted from optimization of the field uniformity within the VOI. The polarity of current flow within each of coils 10A through 10F is indicated by a cross-within-circle for current into the page (coils 10A, 10D, and 10F) and by a dot-within-circle for current out of the page (coils 10B, 10C, 10E), for generating a magnetic field in the +z direction (upward in FIG. 4, as in FIG. 1). To generate a 5 kgauss field within the VOI, the total current (current density times cross-sectional area of the coil) within each of coils 10A through 10F in this example are as follows:

| Coil | Current (kA) |
|---|---|
| 10A | 26.63 |
| 10B | −37.95 |
| 10C | −118.75 |
| 10D | 1544.62 |
| 10E | −7377.01 |
| 10F | 7357.70 |

In this arrangement, simulation of the field magnitude, performed by way of finite element simulation of the field according to the OPUS computer program, available from Ferrari Associates, Inc. of Jacksonville, Fla., indicated that the peak field within magnet 2 was approximately 70 kgauss at location PK between coils 10E, 10F. The total currents noted above are obtained for a substantially constant current density for each of coils 10A through 10F (both within each coil 10A through 10F, and also among the separate coils 10A through 10F relative to one another) of approximately 1700 A/cm$^2$; as such, conventional superconducting wire as noted above will be capable of generating the 5 kgauss field within the VOI, of 10 ppm uniformity or better, while still leaving adequate space within coil assembly 10 for copper stabilizers, grooves for conducting cryogenic fluid, and metal banding for providing mechanical strength.

Figure 5:
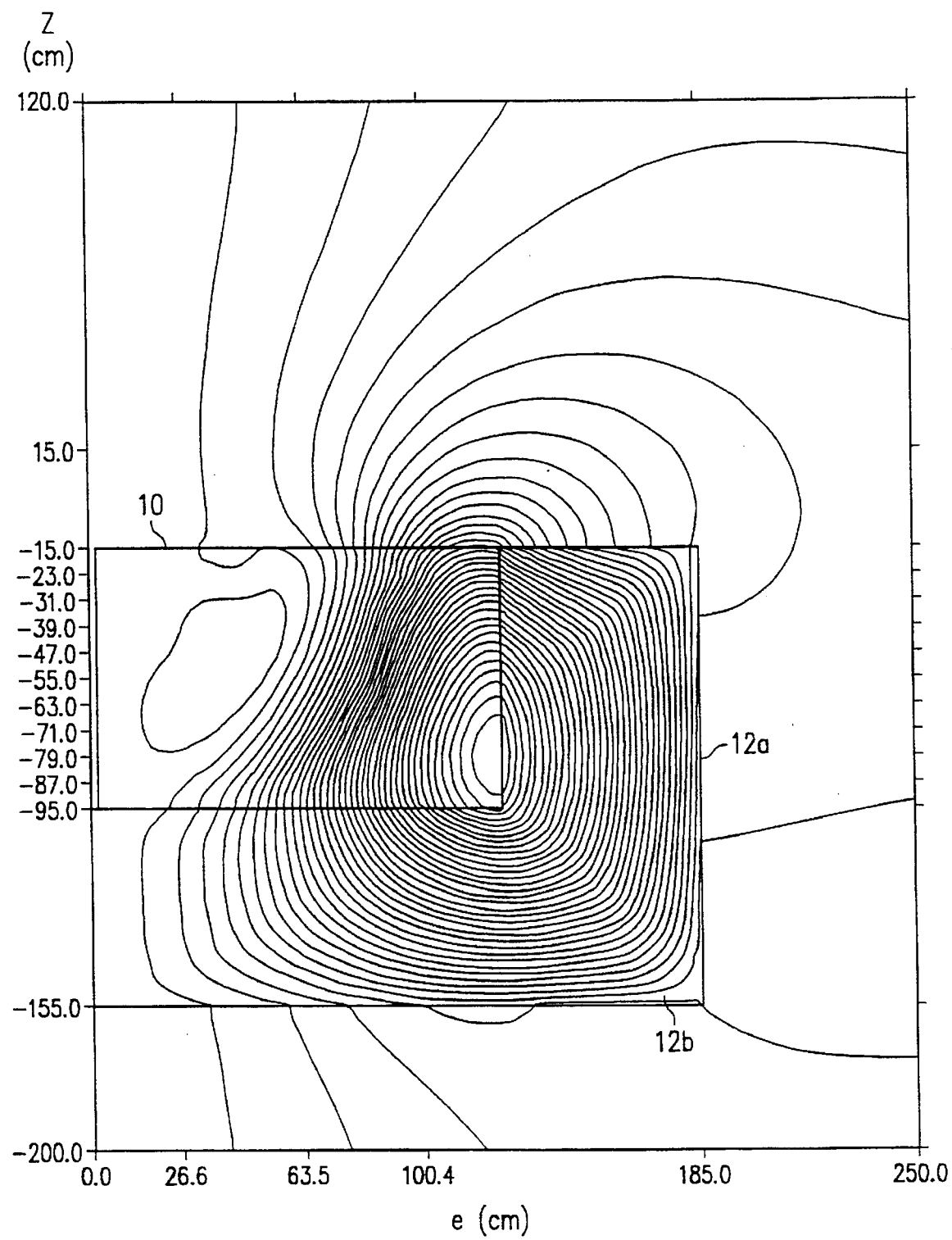
FIG. 5 is a field line diagram of the homogenous and fringe field produced by the magnet of FIG. 1.

FIG. 5 illustrates the field lines resulting from this arrangement of coils 10A through 10F, and the above-specified currents, as modeled by way of the OPUS computer program. For purposes of simplicity of presentation (and of simulation), the field lines of FIG. 5 are illustrated for the half-cross-section of FIG. 4; the axial symmetry of magnet 2 according to this embodiment of the invention allow this representation to accurately convey the field behavior around the full circle of magnet 2. As indicated in FIG. 5, the bulk of the flux generated by coil assembly 10 returns through the portion of the magnetic circuit comprised of iron shield plates 12a and lower iron shield 12b, with only minimal fringe field outside of iron shield 12. The OPUS simulation of this magnet arrangement indicates that the 5 gauss line is located only 9.2 meters in front of magnet 2 (i.e., on the same side of coil assembly 10 as the VOI, at z=+920 cm), and only 2.0 meters away from the outer diameter of iron shield 12. Such a low stray field is believed to be quite good for a magnet in which the VOI is outside of the bore.

In this modeled example, the total weight of iron shield is approximately 85 tons; by increasing the size of iron shield, the 5 gauss line may be brought even closer than in the case discussed above. Magnet 2, according to this modeled example, provides the above performance with approximately 67,000 kA-meters of superconductor, which is quite efficient. The modeled magnetic energy in the magnet is approximately 24.9 MJoule.

As a result of the construction of magnets 2, 2' according to this embodiment of the invention, it is contemplated that NMR tomography is enabled for human organs in a volume of interest outside of the magnet bore. As a result, the patient does not have to be placed into a tunnel or other cylinder, but instead need only be placed over a table top (as in FIG. 1) or adjacent a laboratory wall (as in FIG. 2). Full access to the patient by medical personnel during the MRI procedure is thus provided by this embodiment of the invention, and the degree of patient anxiety is much reduced over prior art magnets. Furthermore, the fringe field of magnet 2 is acceptable according to this construction, and the size and weight of magnet 2, including an iron shield, is reasonable for laboratory size MRI equipment.

Bagel-shaped Magnet for MRI of Human Organs

Figure 6:
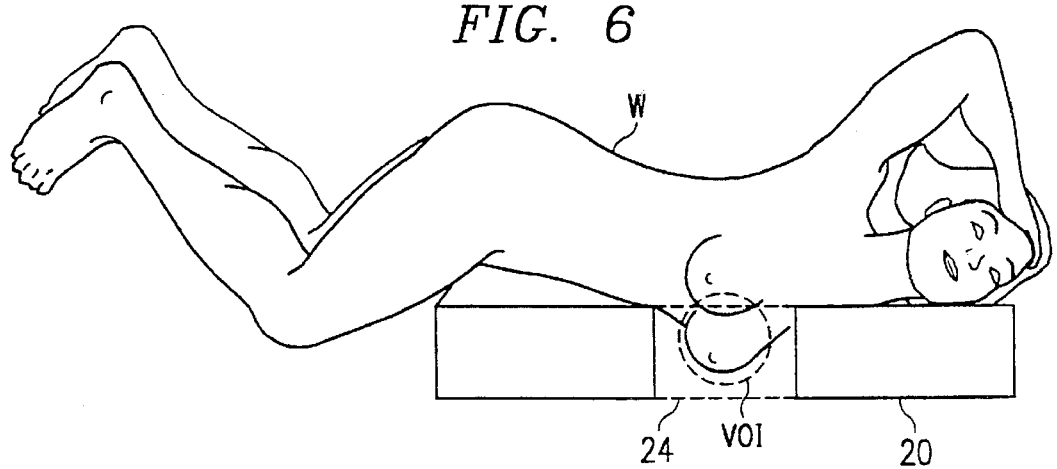
FIG. 6 an elevation cross-sectional view of a magnet according to a second embodiment of the invention.

Referring now to FIG. 6, magnet 20 according to a second embodiment of the invention will now be described in detail. As is well known in the art, the NMR tomography of externalities of a human patient, including the arm, leg and head, is often necessary for the diagnosis of various physical ailments. A particularly important application of NMR tomography is the imaging of the female breast in periodic screening for cancerous tumors. The NMR tomography of such externalities is conventionally performed in the same whole body "tunnel" or cylindrical MRI systems in order to generate a sufficiently high DC magnetic field of adequate uniformity for imaging; these magnets are accompanied by the significant disadvantages of high patient anxiety and limited access by medical personnel described hereinabove. This second preferred embodiment of the invention provides a magnet 20 which takes advantage of the limited volume of interest (VOI) required for such imaging and the external nature of the organ or appendage being imaged, to provide a high DC magnetic field that is highly uniform over a limited VOI, without requiring insertion of the whole body of the patient thereinto, as required in conventional cylindrical magnets.

As illustrated in FIG. 6 for the example of breast MRI, magnet 20 according to this embodiment of the invention is a relatively small (on the order of 1.1 meter outside diameter) magnet of annular shape, having cylindrical bore 24 in its center of on the order of 20 cm in diameter. The field strength of magnet 20 is contemplated to be on the order of 10 kgauss (1.0 Tesla), substantially uniform (<10 ppm) over the VOI of on the order of 10 cm in diameter. This shape and construction of magnet 20 allows for patient W to remain outside of the bore of magnet 20 while still enabling the imaged breast to be disposed within the VOI. As suggested in FIG. 6, the VOI is not centered within bore 24 of magnet 20, but instead is vertically offset to facilitate imaging of the breast of patient W without requiring whole body insertion into a magnet bore as required by conventional cylindrical MRI systems.

The overall thickness of magnet 20 is contemplated to be on the order of 15 cm, and its overall weight is contemplated to be on the order of 1000 pounds. As such, the construction of magnet 20 according to this embodiment of the invention provides a substantially portable magnet, such that the MRI system into which magnet 20 is implemented will have portability, allowing for its deployment by way of mobile vehicle (such as a mobile MRI screening truck), ship, spacecraft, and the like.

Alternatively, magnet 20 is suitable for the imaging of other externalities, such as arms, legs and the head, which may be inserted in bore 24 without requiring insertion of the whole body of the patient thereinto. For the imaging of such other externalities, the VOI need not be offset but may be centered relative to the midplane (the diameter of magnet 20); of course, the VOI may remain offset as illustrated in FIG. 6 and will still be useful for the imaging of such other externalities.

As discussed above relative to magnet 2, it is of course to be understood that the remainder of the overall MRI system will be provided in combination with magnet 20, as magnet 20 is intended to provide the large DC magnetic field necessary in NMR tomography. As such, the gradient and RF coils for generating the gradient and oscillating fields, respectively, within the VOI, as well as detecting coils for detecting the response of gyromagnetic nuclei in the VOI to the magnetic fields applied thereto, are contemplated to be provided in combination with magnet 20 to complete the MRI apparatus. As is well known in the art, the volume required for these additional coils is relatively small, and as such the representation presented in FIG. 6 is contemplated to be substantially accurate in illustrating the relative position of patient W to magnet 20, and thus to the VOI. The design of these particular additive elements will depend, of course, upon the particular MRI system design desired, and it is contemplated that one of ordinary skill in the art will be able to provide such additional features to magnet 20, according to this embodiment of the invention, by utilizing conventional technology. The Pissanetzky. *Meas. Sci. Technol.* article incorporated by reference hereinabove is indicative of such conventional technology, in the field of gradient coil design.

Referring now to FIGS. 7 and 8, the construction of magnet 20 will now be described in further detail. As shown in FIGS. 7 and 8, magnet 20 is preferably of the superconducting type, and as such includes coil assembly 25 disposed within cryostat 22. The orientation of the conduction of current in magnet 20 is in a circular direction about the axis of bore 24. In this example, the net current is counterclockwise (relative to FIG. 8), and as such the orientation of magnetic field B is upward as shown in FIG. 7.

Cryostat 22 is of conventional construction, such as 304L stainless steel, of sufficient strength to allow for its interior to be pumped down to the desired vacuum when chilled to superconducting temperatures, and to provide the desired structural support for the bobbins within which the superconducting coils wire is placed and also the ducting of the cryogenic coolant. Conventional cryogenic compressor equipment (not shown) is connected to cryostat 22 by way of conventional ducting, to maintain its interior at superconducting temperatures, as discussed above relative to magnet 2. In addition, the superconducting wire in coil assembly 25 of magnet 20 is contemplated to be of the conventional niobium titanium alloy type, such as the rectangular cross-section Rutherford type cable discussed above, consisting of braided SCOK superconducting wire with kapton insulation. As such, the temperature at which cryostat 22 must maintain coil assembly 25 is on the order of 4.2° K.

Alternatively, it is contemplated that conventional wire conductors (i.e., non-superconducting) may be utilized within magnet 20, resulting in a very inexpensive system amenable for widespread use. Of course, the current capacity of non-superconducting wire is substantially limited relative to that of superconducting wire, which will likely limit the field strength available for magnet 20. As such, it is preferred that magnet 20 be of the superconducting type.

Referring now to FIG. 9, the arrangement of coils 25A through 25F within coil assembly 25 will be described in detail relative to an unshielded version of magnet 20. As described hereinabove relative to magnets 2, 2', coil assembly 25 includes a plurality of coils 25A through 25F, each of which presents a different value of total current in magnet 20, and of varying polarity, with the goal of providing a highly uniformmagnetic field B within the VOI. The illustration of FIG. 9 is for the right-hand half of magnet 20 as shown in FIG. 7; of course, the construction is symmetric about the axis of bore 24, and as such FIG. 9 is representative of the overall construction of coil assembly 25 in magnet 20.

The design of coils 25A through 25F is preferably accomplished by way of the structured coils methodology discussed above, in which the current polarity and magnitude for the discrete positional coil elements of a tiling corresponding to the position and size of coil assembly 25 (in the z-ρ plane as shown in FIG. 9) are adjusted relative to maximizing the uniformity of field in the VOI at the desired magnitude. As noted above, the structured coils methodology often happily results in coil elements carrying their maximum or minimum current density, with those of like polarity tending to "cluster" together into coils, with the shape of the resultant clustered coils generally being somewhat irregular. The number and irregular shape of the coils 25A through 25F is a result of the additional degrees of freedom provided by the structured coils methodology, as the design parameters include both the number of coils and the number of boundaries for each coil, and the position of each of the boundaries, in addition to the conventional design parameters of coil size, position, and current (magnitude and polarity). These additional degrees of freedom not only facilitate the optimization process, but also enable the design of magnets where the volume of interest is not necessarily midplane-symmetric.

For the example of a 10 kgauss field in the VOI generated by magnet 20 having the dimensions described hereinabove, and where the VOI is offset from the midplane (z=0) axis by 2 cm, coils 25A through 25F having the shape noted in FIG. 9 resulted from optimization according to the structured coils methodology. The polarity of current flow within each of coils 25A through 25F is indicated by a cross-within-circle for current into the page (coils 25B and 25F) and by a dot-within-circle for current out of the page (coils 25A, 25C, 25D, 25E), for generating a magnetic field in the +z direction (upward in FIG. 9, as in FIG. 7). The current density magnitude in each of coils 25A through 25F resulting from this methodology is approximately 8.0 kA/cm², which in the case of niobium-titanium alloy superconducting wire, allows for a great deal of room for copper stabilizer, cryogenic coolant conduction grooves, structural steel banding, and conventional quench protection elements. As noted above, this current density is substantially constant across each of coils 25A through 25F. To generate a 10 kgauss field within the VOI, the total current (current density times cross-sectional area of the coil) within each of coils 25A through 25F in this example are as follows:

| Coil | Current (kA) |
| --- | --- |
| 25A | −24.00 |
| 25B | 223.42 |
| 25C | −28.35 |
| 25D | −13.17 |
| 25E | −618.46 |
| 25F | 1304.00 |

Figure 10:
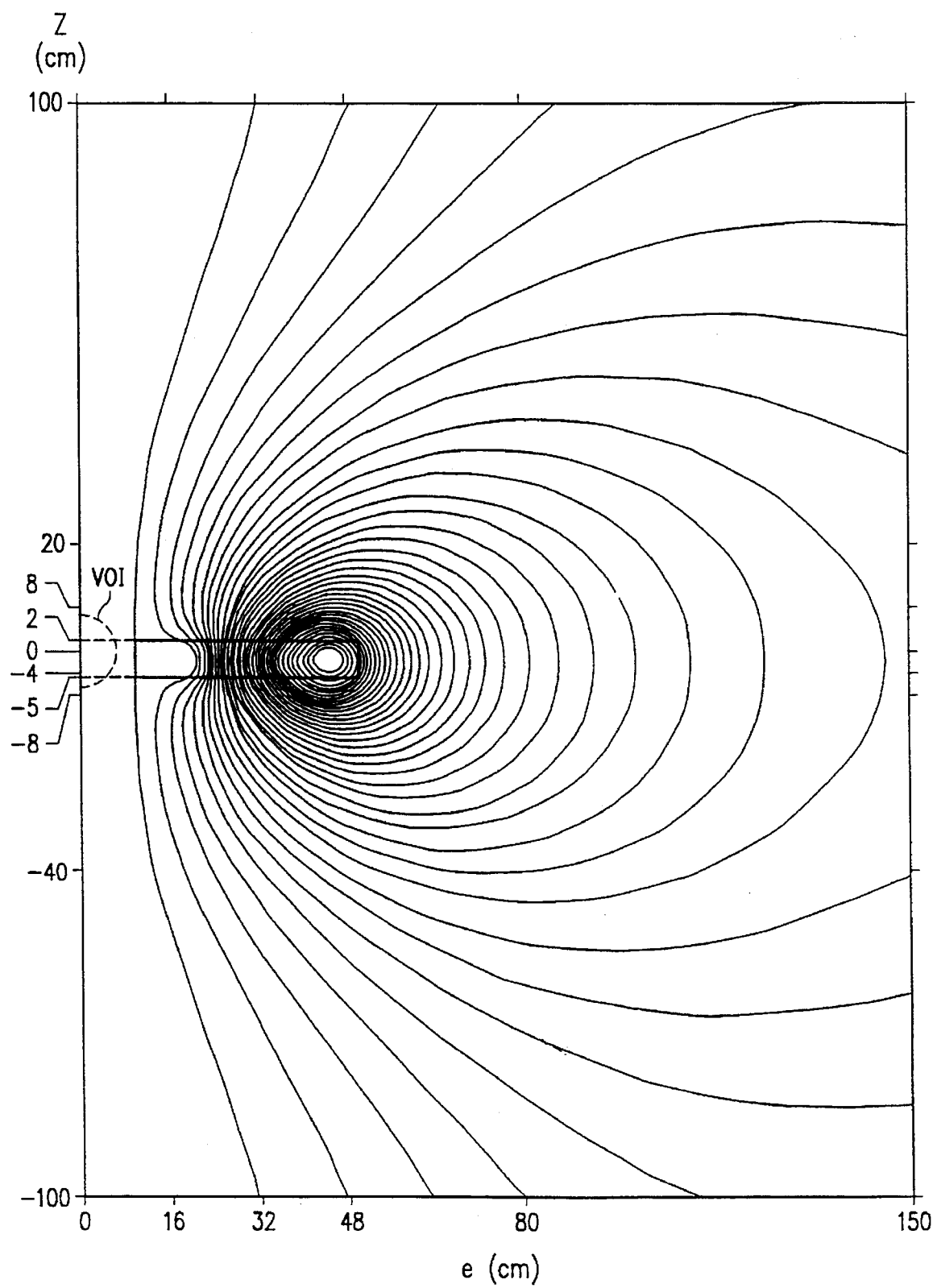
FIG. 10 is a diagram illustrating the lines of field produced by the unshielded magnet of FIG. 6.

FIG. 10 illustrates the field lines as modeled by the OPUS finite element modeling program noted above, for the construction of magnet 20 described hereinabove relative to FIG. 9. For this unshielded version of magnet 20, a 10 kgauss field is produced within the VOI with a uniformity of approximately 7 ppm (before shimming). The 5 gauss line is approximately 4 meters from the side of magnet 20 (i.e., perpendicular from the outer diameter of cryostat 22), and approximately 5.5 meters from the front and back surfaces (i.e., parallel with the axis of bore 24). The overall superconductor required for magnet 20 is modeled to be 4195 kA-meters, which is significantly less than a conventional 10 kgauss cylindrical superconducting whole-body MRI magnet, which requires on the order of 12,000 kA-meters of superconductor.

While magnet 20 of FIG. 9 provides a relatively low level of fringe field away therefrom, the fringe field may be further reduced by providing active shielding coils, such shielding coils also being preferably designed according to the structured coils methodology described hereinabove. FIG. 11 illustrates the arrangement of such an actively shielded magnet, including primary coil assembly 27 with coils 27A through 27H therein, in combination with shielding coil assembly 28 with shielding coil 28A therewithin. Shielding coil assembly 28 is separated from primary coil assembly 27 along the midplane thereof, for example by a distance of 10 cm. Both primary coil assembly 27 and shielding coil 28 are preferably contained within a single cryostat (not shown), as each contain similarly constructed superconducting wire.

In theory, the provision of shielding coil 28A effectively creates a quadrupole magnet, where primary coils 27A through 27H are responsible for generating the high uniformity field in the VOI, and where shielding coil 28A, carrying opposite polarity current from the net current of primary coils 27A through 27H, is intended to cancel the magnetic dipole moment outside of the VOI (at least outside of the diameter of primary coil assembly 27). As is well known for quadrupole magnets, the stray field decays as a function of $\rho^{-4}$, $\rho$ being the distance from the axis of bore 24.

The structured coils methodology described hereinabove is again applied to the z-$\rho$ plane coil elements in primary coil assembly 27 and shielding coil assembly 28 in order to arrive at the optimum coil size, shape and location, as well as the total current therethrough. In addition to optimization of the uniformity of the field in the VOI, the design of an actively shielded magnet according to the structured coils methodology incorporates the use of target points outside of the VOI, optimizing the shielding coil current, size and shape to reduce the field at the target points outside of the VOI, while not affecting the uniformity of the field within the VOI. Design of an actively shielded magnet according to the structured coils methodology is facilitated by using a weighting factor in the error form to comprehend the tradeoff between high uniformity field in the bore B versus low fringe effects. Accordingly, the error form Q minimized in the design of actively shielded magnet 20 according to this embodiment of the invention is as follows:

$$Q = \sum_{i=1}^{j} W_i(B_{zi} - B_i')^2 + \sum_{i=j+1}^{k} p(B_{\rho i}^2 + B_{zi}^2)$$

where the set of $w_i$ is a set of weighting factors for weighting the effect of the j target locations within bore 24, where the difference $(B_{zi} - B_i')$ is the difference between the calculated field and the desired field at the ith target location in bore 24, and where $(B_{\rho j}^2 + B_{zi}^2)$ is the square of the amplitude of the field (radial and axial components) at the [k−(j+1)] target locations outside bore 24 for which the fringe field is determined. The weighting factor p indicates the tradeoff between highest bore field quality (p=0) and best shielding (p large). Empirical study has indicated that a value of $10^{-6}$ to $10^{-5}$ is suitable for magnets to be used in MRI applications.

An example of this design of an actively shielded magnet 20 according to this embodiment of the invention, and illustrated in FIG. 11. The polarity convention of cross-in-circle and dot-in-circle illustrated in FIG. 11 is the same as in the examples discussed hereinabove. The total current values for primary coils 27A through 27H, and shielding coil 28A, in this example of shielded magnet 20 are as follows:

| Coil | Current (kA) |
| --- | --- |
| 27A | 51.79 |
| 27B | −742.38 |
| 27C | 80.34 |
| 27D | 40.03 |
| 27E | −17.78 |
| 27F | 53.34 |
| 27G | 1879.48 |
| 27H | −284.48 |
| 28A | −493.36 |

The current density for coils 27A through 27H is approximately 8.00 ka/cm², and the current density for shielding coil 28A is approximately 10.00 kA/cm², each current density being easily conducted by conventional niobium/titanium alloy superconducting wire, with adequate room for copper stabilizers, cryogenic fluid conduit grooves, structural metal banding, and quench protection elements, each conventional in the art. As in the case discussed above, the current density of coils 27A through 27H is substantially constant thereacross.

Figure 12:
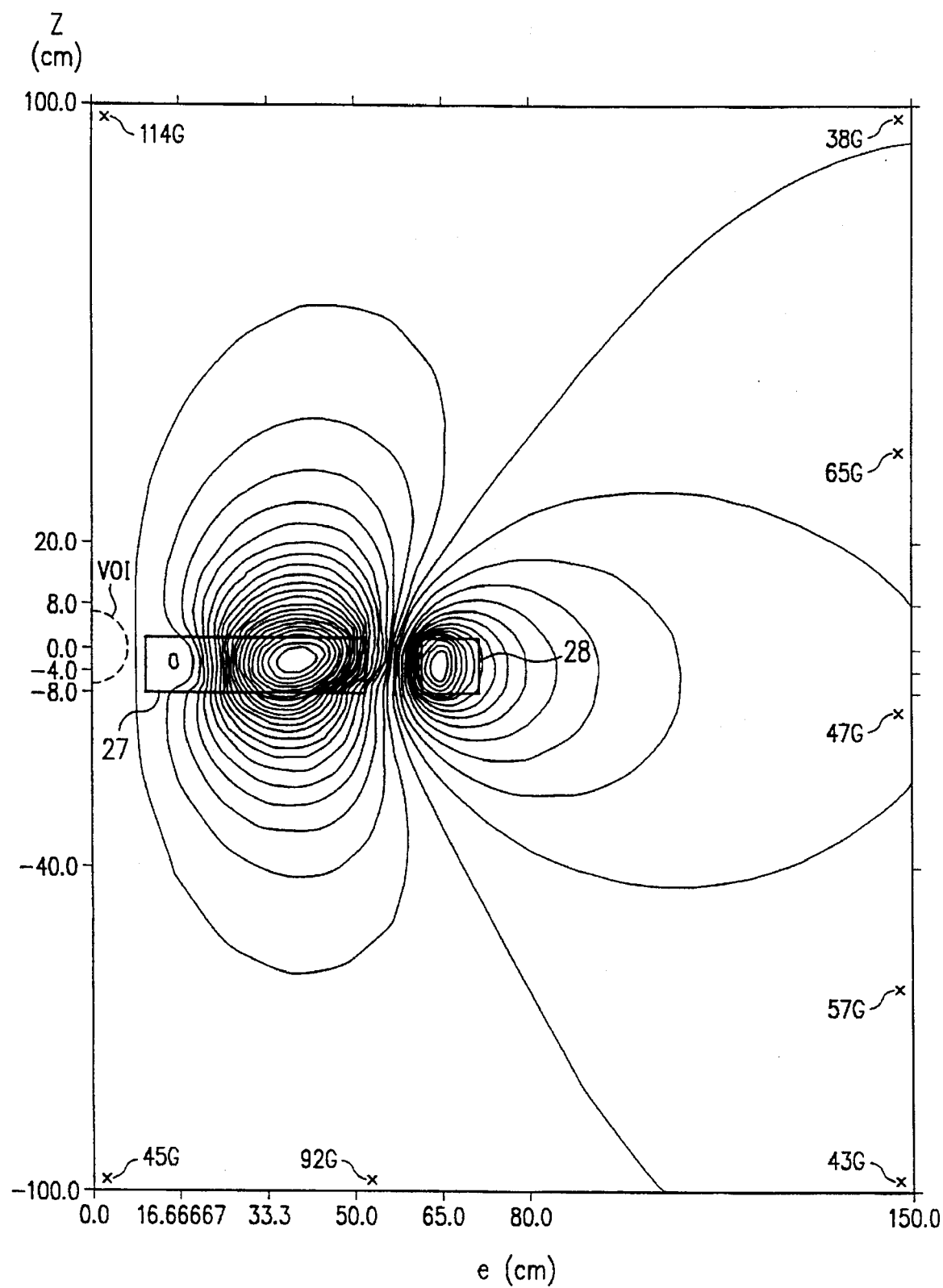
FIG. 12 is a diagram illustrating the lines of field produced by the magnet of FIG. 6 according to the shielded version of FIG. 10.

As modeled by the OPUS finite element computer modeling program, the construction of shielded magnet 20 as shown in FIG. 11 provides field lines as illustrated in FIG. 12. This modeling indicates that the 5 gauss line is only 2.5 meters from the outer diameter of shielding coil assembly 28 (which itself is approximately 75 cm from the axis of bore 24), and only 2.2 meters from the front and back faces of magnet 20. The total amount of superconductor required for this shielded magnet 20 is approximately 5980 kA-meters, which is still quite efficient for a 10 kGauss field strength. The overall size of shielded magnet 20 is approximately 1.5 meters in diameter and 15 cm thick, and the contemplated weight is less than 1000 pounds, again providing a relatively portable high strength DC magnet for MRI systems.

Of course, a tradeoff between superconductor amount and shielding efficiency is available, as one may obtain somewhat less shielding but save significantly in the amount of superconductor and cryogenics required. It is contemplated, therefore, that one of ordinary skill in the art will be able to design a bagel-shaped magnet having the superconductor amount and fringe field shielding suitable for a particular application.

Further in the alternative, one may utilize iron shielding for the bagel shaped magnet 20 of this embodiment of the invention. It is contemplated that such iron shielding, while effective, would strongly tend to reduce the benefits of portability otherwise available for magnet 20 according to this embodiment of the invention, and as such will generally be less desirable in that sense; such a magnet would, of course, still provide the important benefits of enabling the imaging of a human externality without requiring insertion of the patient's whole body into the magnet bore, as in conventional cylindrical magnets.

Furthermore, while magnet 20 described hereinabove has its VOI offset from the midplane of the magnet, it is contemplated that selection of the location of the VOI along the axis of bore 24 may be made in the structured coils design by one of ordinary skill in the art having reference to this description. Selection of the location of the VOI along this axis may be made in the design of the magnet according to this embodiment of the invention.

Figure 22:
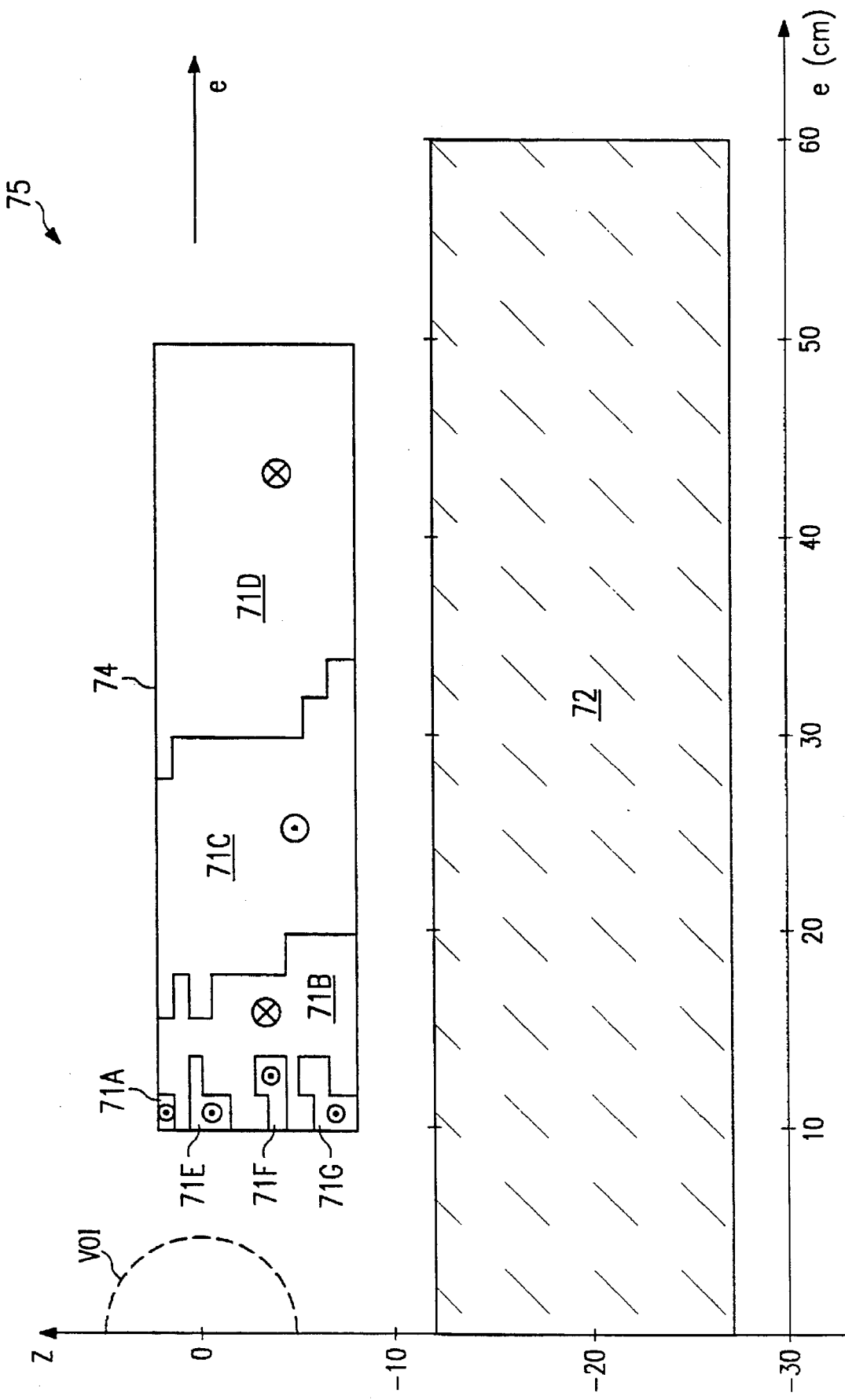
FIG. 22 is a cross-sectional schematic diagram of the coils in the magnet of FIG. 12 according to a version thereof which includes an iron flux return.

Referring now to FIG. 22, another alternative embodiment of a bagel-shaped magnet according to the present invention will now be described in detail. As described above, the use of ferromagnetic material, namely iron, is common in superconducting magnets for fringe field shielding, field enhancement, and as a flux return. Magnet 75 according to this embodiment of the invention, as illustrated in FIG. 22, includes iron flux return 72 which is disposed on the opposite side of coil assembly 74 from volume of interest VOI, and thus on the opposite side of coil assembly 74 from the patient. Iron flux return 72 is a disk-shaped element, and in this example has a thickness of approximately 15 cm and a radius of approximately 60 cm. Iron flux return 72 is preferably formed of a number of parallel disk-shaped iron sheets, but of course may also be formed as a unitary block of iron.

As discussed above, the structured coils methodology is capable of designing a superconducting magnet which includes iron elements therewithin, for example by using the method described relative to FIG. 19b. In the example of FIG. 22, the tiling corresponds to a region, in a half-plane of the z-ρ plane, between +2 cm and −8 cm in the z-dimension, and between 10 cm and 50 cm in the ρ-dimension; the tiling is, of course, symmetric about the ρ=0 axis.

In this example, magnet 75 is designed to produce a 10 kgauss field in a 5 cm radius volume of interest VOI centered at the (z=0) axis; this volume of interest is thus offset from the midplane of coil assembly 74 (at z=−3 cm) by 3 cm. As a result of optimization according to the structured coils methodology described above, and accounting for the presence of iron flux return 72, coils 71A through 71G having the shape noted in FIG. 22 were defined within the tiling-corresponding to coil assembly 74. As in the embodiments described hereinabove, the polarity of current flow within each of coils 71A through 71G is indicated by a cross-within-circle for current into the page (coils 71B and 71D) and by a dot-within-circle for current out of the page (coils 71A, 71C, 71E, 71F, 71G), for generating a net magnetic field in the +z direction (upward in FIG. 22). The global maximum current density magnitude in each of coils 71A through 71G in magnet 75 is approximately 8.0 kA/cm$^2$, which in the case of niobium-titanium alloy superconducting wire, allows for a great deal of room for copper stabilizer, cryogenic coolant conduction grooves, structural steel banding, and conventional quench protection elements. As in the prior cases, this current density is substantially constant across each of coils 71A through 71G. To generate a 10 kgauss field within the VOI, the total current (current density times cross-sectional area of the coil) within each of coils 71A through 71G in this example are as follows:

| Coil | Area (cm$^2$) | Current (kA) |
| --- | --- | --- |
| 71A | 1.43 | −11.43 |
| 71B | 61.43 | 444.10 |
| 71C | 134.29 | −1037.01 |
| 71D | 181.43 | 1451.61 |
| 71E | 5.71 | −30.37 |
| 71F | 7.14 | −57.15 |
| 71G | 7.14 | −57.15 |

Figure 23:
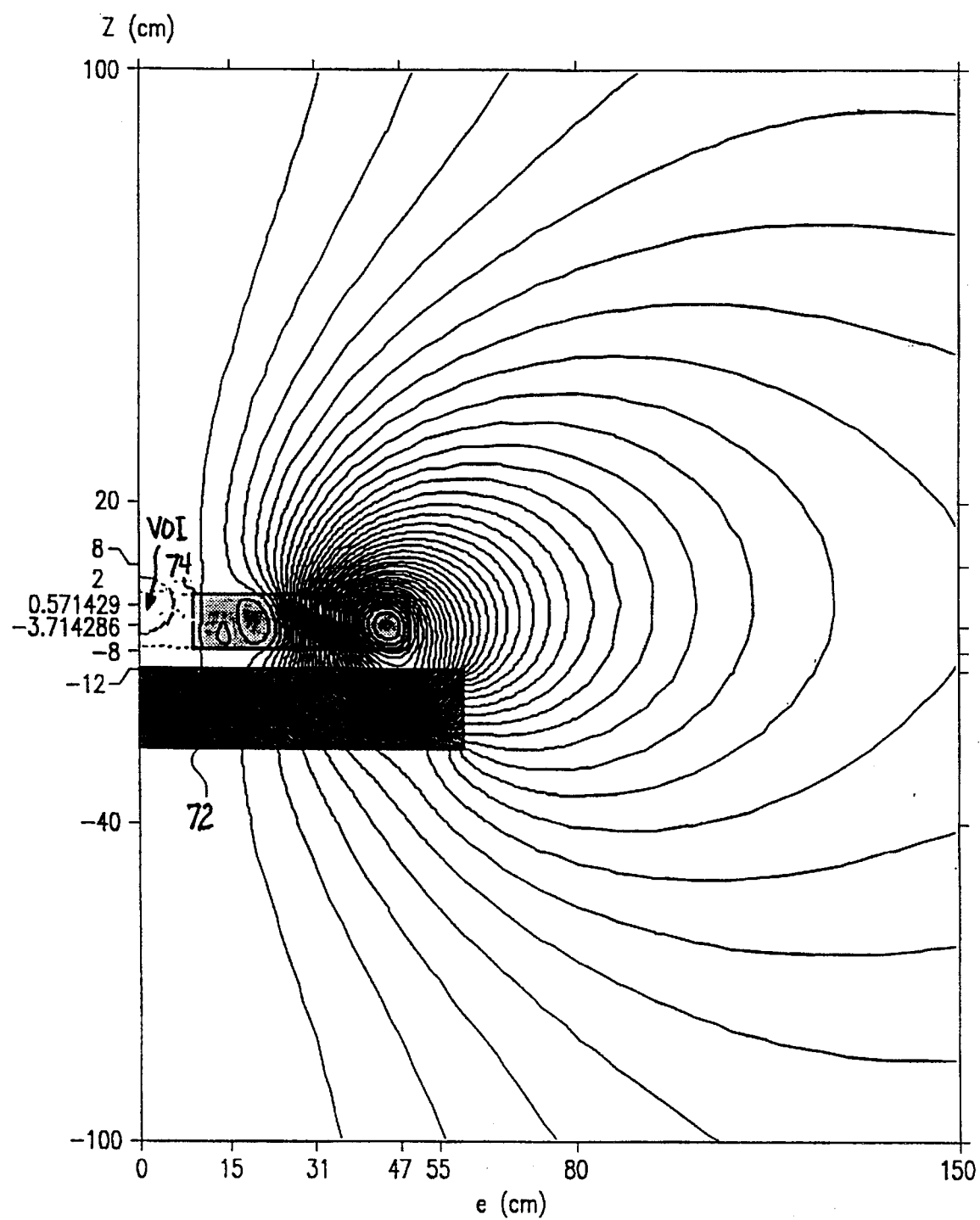
FIG. 23 is a diagram illustrating the lines of field produced by the magnet of FIG. 12 according to the version of FIG. 22.

FIG. 23 illustrates the field lines as modeled by the OPUS finite element modeling program noted above, for the construction of magnet 75 described hereinabove relative to FIG. 22. For this version of magnet 75 including flux return 72, a 10 kgauss field is produced within the VOI with a uniformity of approximately 13 ppm (before shimming). The overall superconductor required for magnet 75 is modeled to be 5948.7 kA-meters, which is significantly less than a conventional 10 kgauss cylindrical superconducting whole-body MRI magnet, which requires on the order of 12,000 kA-meters of superconductor.

As is evident from FIG. 23, iron flux return 72 greatly affects the magnetic flux lines produced by coils 71A through 71G in coil assembly 74. In effect, iron flux return 72 serves to "catch" the return flux, so that the flux presented to coil assembly 74 is substantially parallel to the z-axis. This presentation of the magnetic flux to coil assembly 74 greatly assists the generation of a uniform field within the VOI in this embodiment of the invention.

Figure 24:
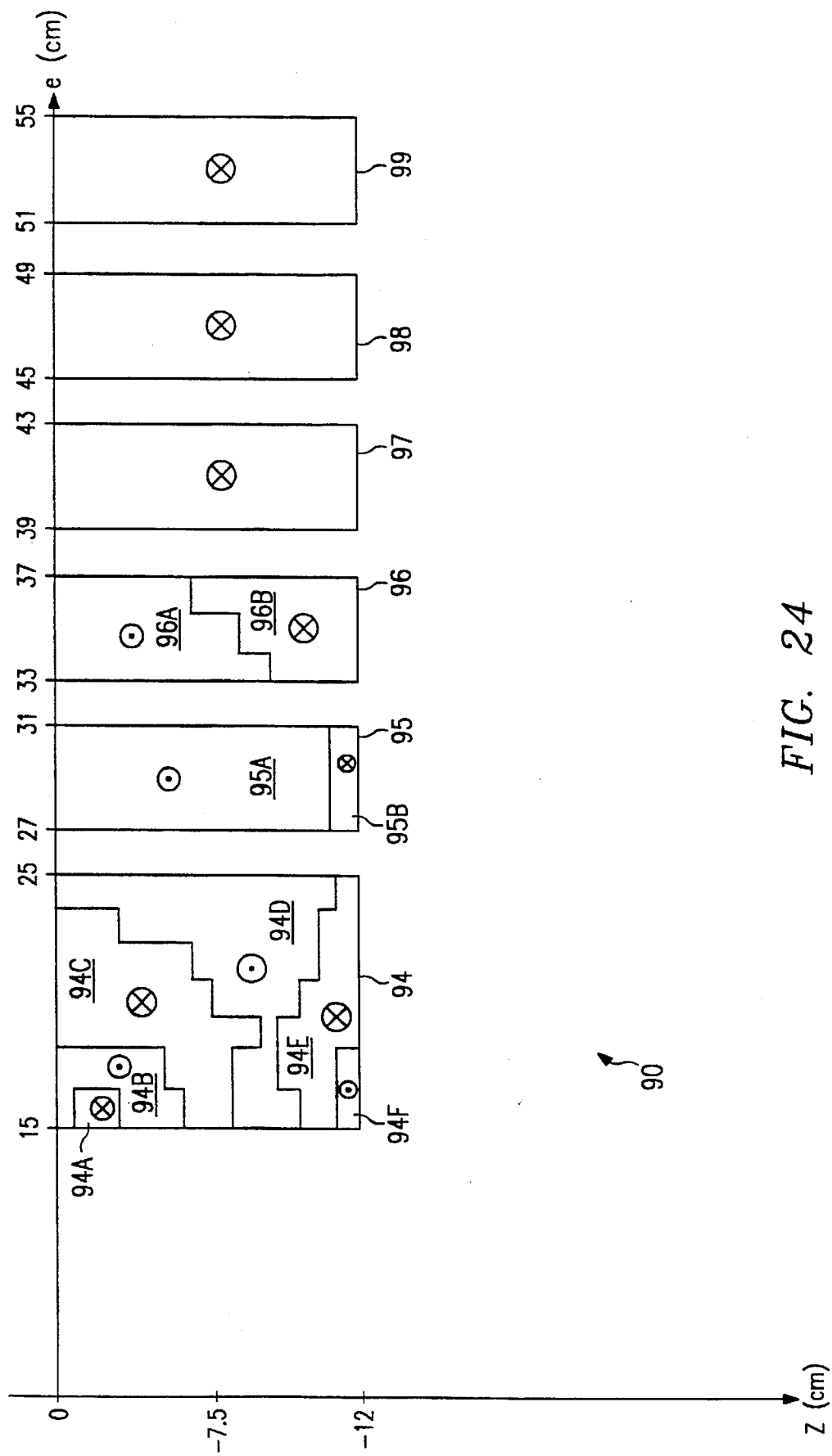
FIG. 24 is a cross-sectional schematic diagram of the coils in the magnet of FIG. 12 according to a version that includes multiple coil assemblies.
Figure 25:
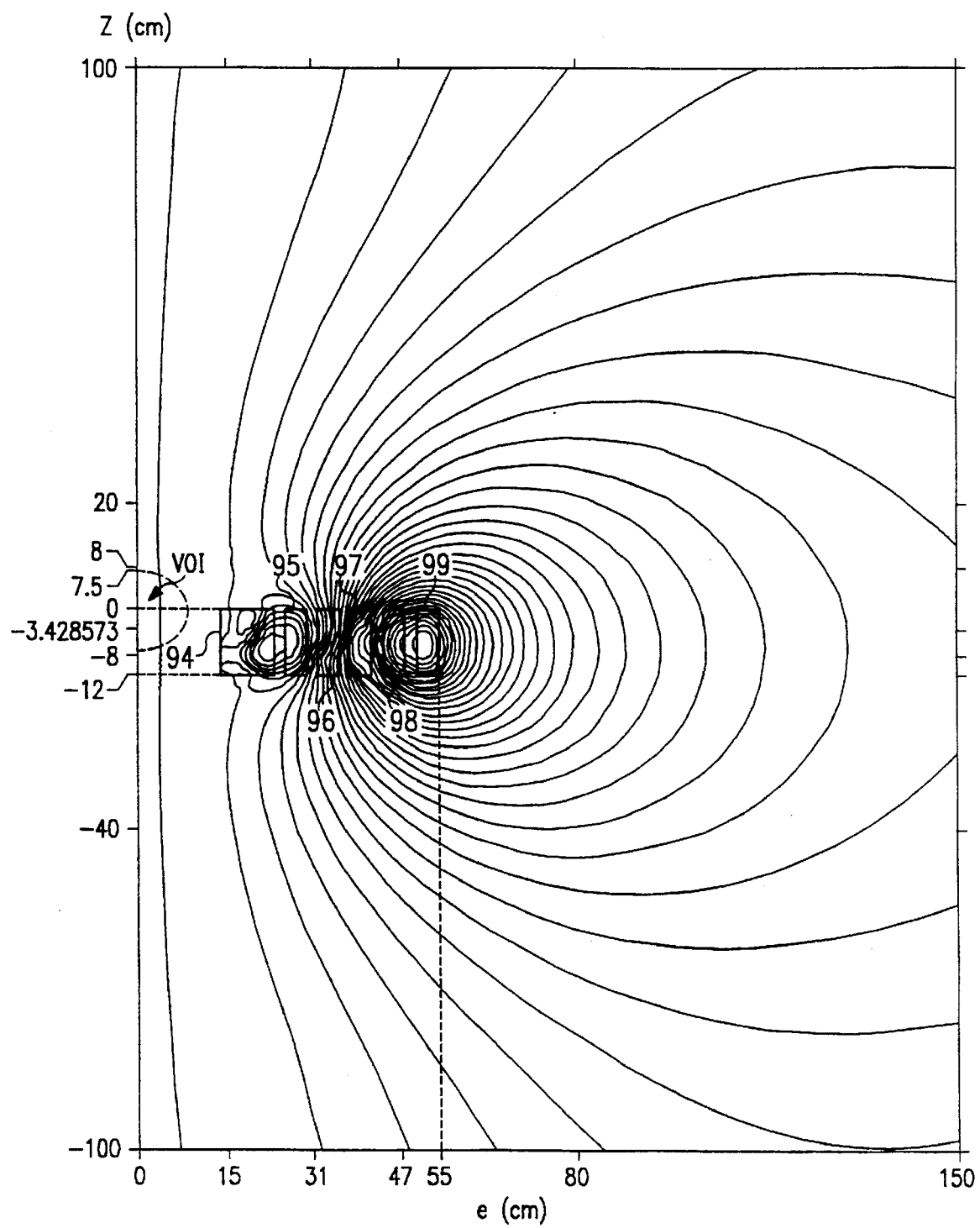
FIG. 25 is a diagram illustrating the lines of field produced by the magnet of FIG. 12 according to the version of FIG. 24.

Referring now to FIGS. 24 and 25, another alternative embodiment of a bagel-shaped magnet according to the present invention is illustrated. As is well known in the art, current government regulations in the field of NMR tomography require that no part of the patient can be exposed to a magnetic field exceeding 2 Tesla (20 kgauss). Magnet 80 according to this embodiment of the invention is designed to reduce the peak magnetic field at the surface of the magnet closest to the patient, while still providing adequate field strength and uniformity within the volume of interest VOI.

Figure 26:
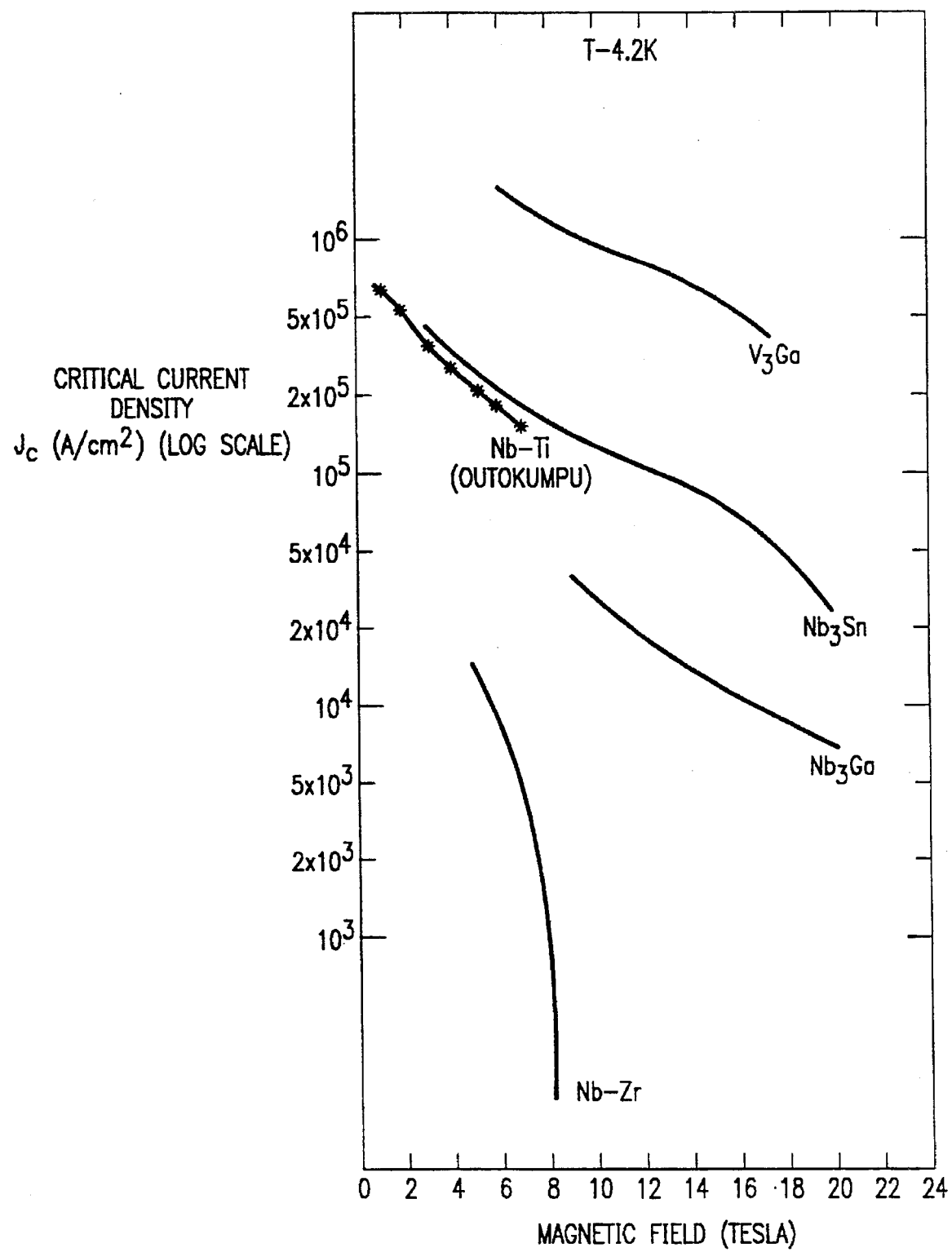
FIG. 26 is a plot illustrating the quenching thresholds of various superconducting materials.

Referring now to FIGS. 24 and 25, magnet 90 according to still another embodiment of the invention will now be described in detail. It is well known in the art of superconducting electromagnets that each superconducting material has an upper limit on the peak magnetic field for a given current density, above which the material will no longer be in a superconducting state (i.e., "quenching" will occur). This quenching threshold (for peak magnetic field) decreases with increasing current density, as shown in the plot of FIG. 26. However, as described hereinabove, according to the structured coil methodology (as well as conventional magnet design techniques) results in a relatively uniform current density for all coils within a coil assembly, with the peak magnetic field within the coil assembly generally concentrated at one region of the coil assembly. As a result, in many regions of a coil assembly, the current density is limited to a level far below that which could be safely conducted while still avoiding quenching.

According to another alternative embodiment of the invention, multiple tilings are used in the structured coils optimization process to allow the current density in each of the tilings to be independent from that in the other tilings. For those tilings located away from the locations at which the peak field is expected, the current density is allowed to be higher, and thus generate additional magnetic field with less superconducting material. The use of multiple tilings thus further improves the efficiency of the magnet, and reduces its cost of manufacture by reducing the cost of the superconducting material required.

As shown in FIG. 24, magnet 90 according to this embodiment of the invention includes six coil assemblies 94 through 99, which resulted from the use of six corresponding tilings in the structured coils optimization methodology described hereinabove. Within each of these six tilings within which current values were allowed, the current density will be constant, but can differ from that resulting in other tilings. In the manufacture of magnet 90, these varying current densities may be implemented by the use of different superconducting cable structure so that a single current path can still be used. For example, in a coil assembly where the current density is to be higher, the amount of insulator, copper stabilizer and interstitial space may be reduced so that more superconducting wire is present within the volume; conversely, a lower current density may be realized by increasing the amount of interstitial space and insulator, resulting in less superconducting wire per unit volume.

In the example of FIG. 24, each tiling corresponds to a region, in a half-plane of the z-ρ plane, between 0 cm and −12 cm in the z-dimension, resulting in six coil assemblies 94 through 99 thereat, at varying positions in the ρ-dimension. Coil assembly 94 is located between 15 and 25 cm in the ρ-dimension, coil assembly 95 is located between 27 and 31 cm in the ρ-dimension, coil assembly 96 is located between 33 and 37 cm in the ρ-dimension, coil assembly 97 is located between 39 and 43 cm in the ρ-dimension, coil assembly 98 is located between 45 and 49 cm in the ρ-dimension, and coil assembly 99 is located between 51 and 55 cm in the ρ-dimension. As in the prior examples, each of these tilings are of course, symmetric about the ρ=0 axis.

In this example, magnet 90 is designed to produce a 5 kgauss field (i.e., 0.5 Tesla) in a 7.5 cm radius volume of interest VOI centered about the z=0 axis; since the midplane of coil assemblies are at −6.0 cm in the z-dimension, the volume of interest VOI is offset from the magnet midplane by 6 cm. As a result of optimization according to the structured coils methodology described above, coil assemblies 94 through 99 include from one to six coils of varying shape, as shown in FIG. 24, were defined within the tiling corresponding to coil assembly 74. As in the embodiments described hereinabove, the polarity of current flow within coil assemblies 94 through and the coils therewithin is indicated by a cross-within-circle for current into the page and by a dot-within-circle for current out of the page. As a result of these currents, a net magnetic field is generated in the +z direction (upward in FIG. 24) within volume of interest VOI.

The cross-sectional area and currents determined by the structured coils optimization method described hereinabove for magnet 90 are as follows:

| Coil | Area (cm²) | Current (kA) |
|---|---|---|
| 94A | 2.45 | 61.22 |
| 94B | 11.00 | −249.47 |
| 94C | 36.73 | 852.19 |
| 94D | 46.53 | −1139.57 |
| 94E | 20.82 | 461.00 |
| 94F | 2.44 | −61.22 |
| 95A | 44.57 | −524.87 |
| 95B | 3.43 | 41.13 |
| 96A | 27.43 | −123.43 |
| 96B | 20.57 | 92.57 |

-continued

| Coil | Area (cm²) | Current (kA) |
|---|---|---|
| 97 | 48.00 | 215.88 |
| 98 | 48.00 | 479.92 |
| 99 | 48.00 | 479.92 |

As is evident from the foregoing, and as described above, the global maximum current density magnitude in each of coil assemblies 94 through 99 varies from one to the other, but will be substantially constant within each of coil assemblies 94 through 99. In this example, the global maximum current densities in coil assemblies 94 through 99 are as follows:

| Coil assembly | Current density (kA/cm²) |
|---|---|
| 94 | 25.0 |
| 95 | 12.0 |
| 96 | 4.5 |
| 97 | 4.5 |
| 98 | 10.0 |
| 99 | 10.0 |

As is evident from the foregoing, the current density in coil assemblies 96 and 97 is lower than in the remainder of coil assemblies 94 through 99. This is because, in this example, the peak magnetic field would be expected to reside within coil assemblies 96, 97 if a uniform current density maximum were used, as in the single tiling examples noted above. However, according to this embodiment of the invention where the current densities in each tiling may vary relative to other tilings, the peak field location may be moved closer toward the volume of interest VOI. In this example, using finite element modeling as performed by the OPUS program, the peak field values in each of coil assemblies 94 through 99 are as follows:

| Coil assembly | Peak Magnetic Field (Tesla) |
|---|---|
| 94 | 7.39 |
| 95 | 4.43 |
| 96 | 4.54 |
| 97 | 4.36 |
| 98 | 3.66 |
| 99 | 2.75 |

As such, the provision of multiple tilings allows the global current density to vary, and allow the highest current density in the coil assembly nearest the volume of interest VOI. It is contemplated that such use of multiple tilings allows for improved efficiency in the construction of an electromagnet, as the total superconductor required in the example discussed hereinabove is 8674.4 kA-meters.

Furthermore, increasing the number of tilings provides yet another degree of freedom in the structured coils optimization. As such, even greater flexibility in the construction of an electromagnet may be provided. As such, a larger volume of interest may be provided, namely a VOI of 15 cm diameter in the example of FIG. 24.

FIG. 25 illustrates the field lines as modeled by the OPUS finite element modeling program noted above, for the construction of magnet 90 described hereinabove relative to FIG. 24. For this multiple tiling magnet, a 5 kgauss field is produced within the VOI with a uniformity of approximately 7 ppm (before shimming).

In summary, the design of each of the uniform high field DC magnets according to this embodiment of the invention tailors the volume of interest to that of the externality to be imaged, such as the female breast. As a result, and particularly when utilizing the structured coils methodology described hereinabove, the magnet may be optimized to provide a highly uniform field in the limited VOI in a manner which dramatically improves the cost, weight, and size of the DC magnet. The magnet according to this embodiment of the invention also allows for the patient to remain outside of the magnet bore, greatly reducing patient anxiety and maximizing access to the patient by medical personnel. In addition, by maintaining the head of the patient outside of the magnet bore, the effect of gradient coil noise on the patient is much reduced, further reducing patient anxiety from that experienced in conventional cylindrical whole-body magnets.

Furthermore, even for such a small magnet as that according to this embodiment of the invention, the stray field may be contained quite successfully, without requiring excessive amounts of superconductor, and indeed allowing for the designer to trade-off stray field control against superconductor cost.

Helmet-shaped Magnet for MRI of the Head

Figure 13:
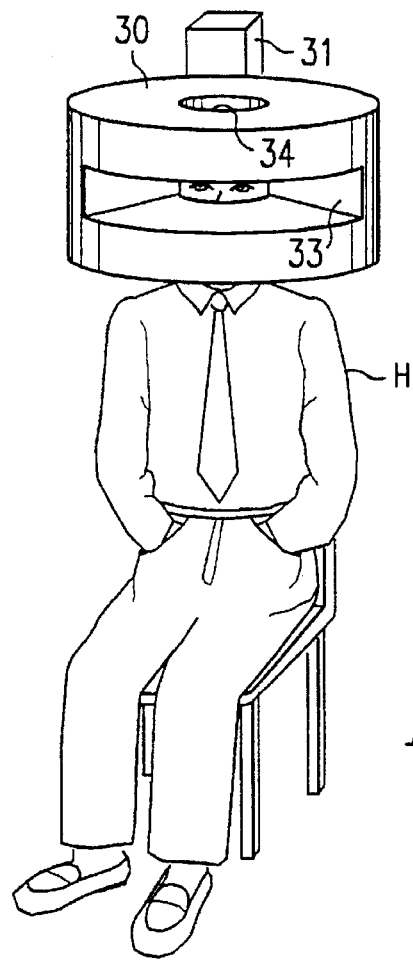
FIG. 13 is a perspective view of a magnet according to a third embodiment of the invention.

Referring now to FIG. 13, magnet 30 according to a third embodiment of the invention will now be described in detail. As discussed above, the NMR tomography of the human head area, in particular the brain, is often necessary to determine the extent of injuries thereof and tumors therein. Another important use of brain MRI is during psychotherapeutic procedures, where the psychiatrist provides a visual stimulus to the patient and observes the brain activity response to the stimulus by way of MRI.

Prior MRI systems incorporating solenoid-shaped magnets have been the primary design used in generating the 5 kgauss or greater magnetic fields necessary for adequate MRI of internal organs, but have required whole-body insertion of the patient into the cylindrical magnet bore. Such insertion can result in a relatively high degree of patient anxiety. In addition, especially where the head is to be imaged, the noise produced by the gradient coil switching is quite frightening to many patients, increasing the level of anxiety from that already presented by the magnet "tunnel". Furthermore, the cylindrical magnets obstruct the vision of the patient, making their use for MRI of brain activity in response to visual stimulus in the psychotherapeutic context cumbersome, if not impossible.

According to this third preferred embodiment of the invention, magnet 30 is provided which is specifically designed for MRI of the head and brain, and which takes advantage of the limited volume of interest (VOI) required for such imaging. A very high DC magnetic field (on the order of 20 kgauss) is provided by this magnet 30, highly uniform over a limited VOI corresponding to the size of the human head, and without requiring the whole body insertion of conventional cylindrical magnets.

Referring to FIG. 13, patient H is shown within magnet 30 according to this embodiment of the invention. Magnet 30 includes cryostat 32 which has bore 34 therethrough of sufficient size (e.g., 20 cm) for patient H to insert his head from below. Magnet 30 is supported from behind by support 31, so that magnet 30 remains in a relatively fixed location; an adjustment mechanism (not shown) such as a worm gear or chain drive may be provided in support 31 to allow for the height of magnet 30 to match the sitting height of patient H. Also provided in magnet 30 is a viewing gap 33, so that the vision of patient H is not obstructed, enabling visual contact between patient H and personnel outside of magnet 30, such as a psychiatrist in the psychotherapeutic context noted above. Furthermore, outside of the psychotherapeutic application, since a certain degree of patient anxiety may be due to obstruction of the patient's vision, gap 33 serves to greatly reduce such anxiety.

The size of magnet 30 is on the order of 60 cm in outside diameter and 35 cm in height. Its field strength is contemplated to be on the order of 20 kgauss (2.0 Tesla), substantially uniform (<10 ppm) over a VOI of on the order of 20 cm in diameter approximately centered within bore 34 of magnet 30. The overall weight is contemplated to be on the order of 1000 pounds. As such, the construction of magnet 30 according to this embodiment of the invention also provides a substantially portable magnet, such that the MRI system into which magnet 30 is implemented may be deployed by way of mobile vehicle (such as a mobile MRI screening truck), ship, and the like, including use in space travel.

As discussed above relative to the other magnets designed according to the structured coils methodology, it is of course to be understood that the remainder of the overall MRI system will be provided in combination with magnet 30, as magnet 30 is intended to provide the large DC magnetic field necessary in NMR tomography. As such, the gradient and RF coils for generating the gradient and oscillating fields, respectively, within the VOI, and the detecting coils for detecting the response of gyromagnetic nuclei in the VOI to the magnetic fields applied thereto, will be provided in combination with magnet 30 to complete the MRI apparatus. As is well known in the art, the volume required for these additional coils is relatively small, and as such the representation presented in FIG. 13 is contemplated to be substantially accurate in illustrating the relative position of patient H to magnet 30. The design of these particular additive elements will depend, of course, upon the particular MRI system design desired, and it is contemplated that one of ordinary skill in the art will be able to provide such additional features to magnet 20, according to this embodiment of the invention, by utilizing conventional technology. The Pissanetzky *Meas. Sci. Technol.* article incorporated by reference hereinabove is indicative of such conventional technology in the field of gradient coil design.

Figure 14:
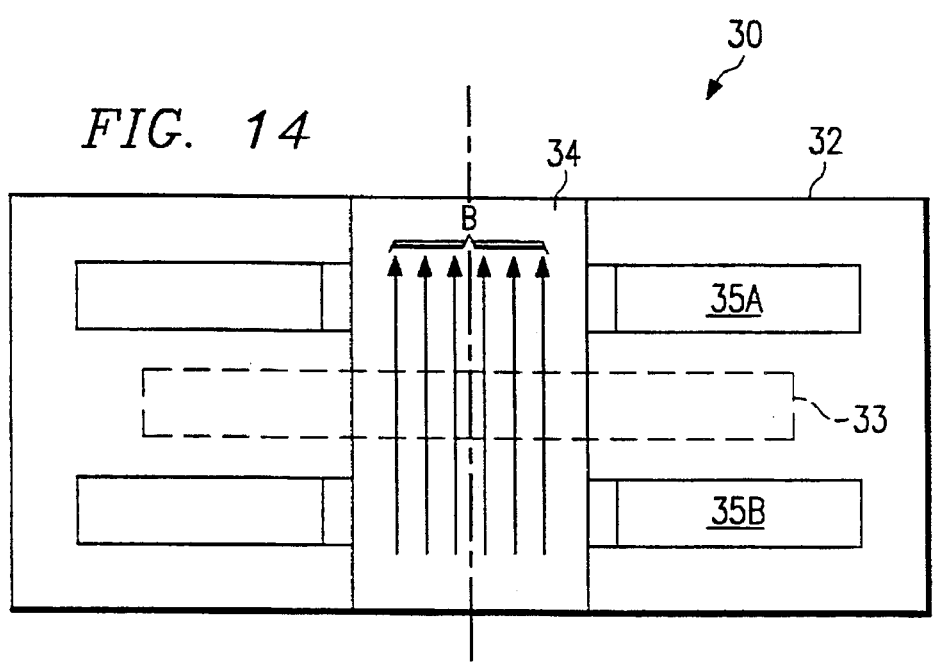
FIG. 14 is a cross-sectional schematic diagram of the magnet of FIG. 12.

Referring now to FIG. 14, the construction of magnet 30 will now be described in further detail. As shown in FIG. 14, magnet 30 is preferably of the superconducting type, and as such includes coil assembly pairs 35A and 35B disposed within cryostat 32. The orientation of the conduction of net current in coil assembly pairs 35A, 35B is in a circular direction about the axis of bore 24, and in the same direction relative to one another, so that for a counter-clockwise net current, the orientation of magnetic field B is upward as shown in FIG. 14.

Cryostat 32 is of conventional construction, such as 304L stainless steel, of sufficient strength to allow for its interior to be pumped down to the desired vacuum when chilled to superconducting temperatures, and to provide the desired structural support for the bobbins within which the superconducting coils wire is placed and also the ducting of the cryogenic coolant. Conventional cryogenic compressor equipment (not shown) is connected to cryostat 32 by way of conventional ducting, to maintain its interior at superconducting temperatures. In addition, the superconducting wire in coil assembly 25 of magnet 20 is contemplated to be of the conventional niobium titanium alloy type, such as the SCOK cable discussed above, which is of the known Rutherford type of rectangular cross-section with kapton insulation. As such, the temperature at which cryostat 22 must maintain coil assembly 25 is on the order of 4.2° K.

Alternatively, it is contemplated that conventional wire conductors (i.e., non-superconducting) may be utilized within magnet 30, resulting in a very inexpensive system amenable for widespread use. Of course, the current capacity of non-superconducting wire is substantially limited relative to that of superconducting wire, which will likely limit the field strength available for magnet 30. It is therefore preferred that magnet 30 be superconducting.

Figure 15:
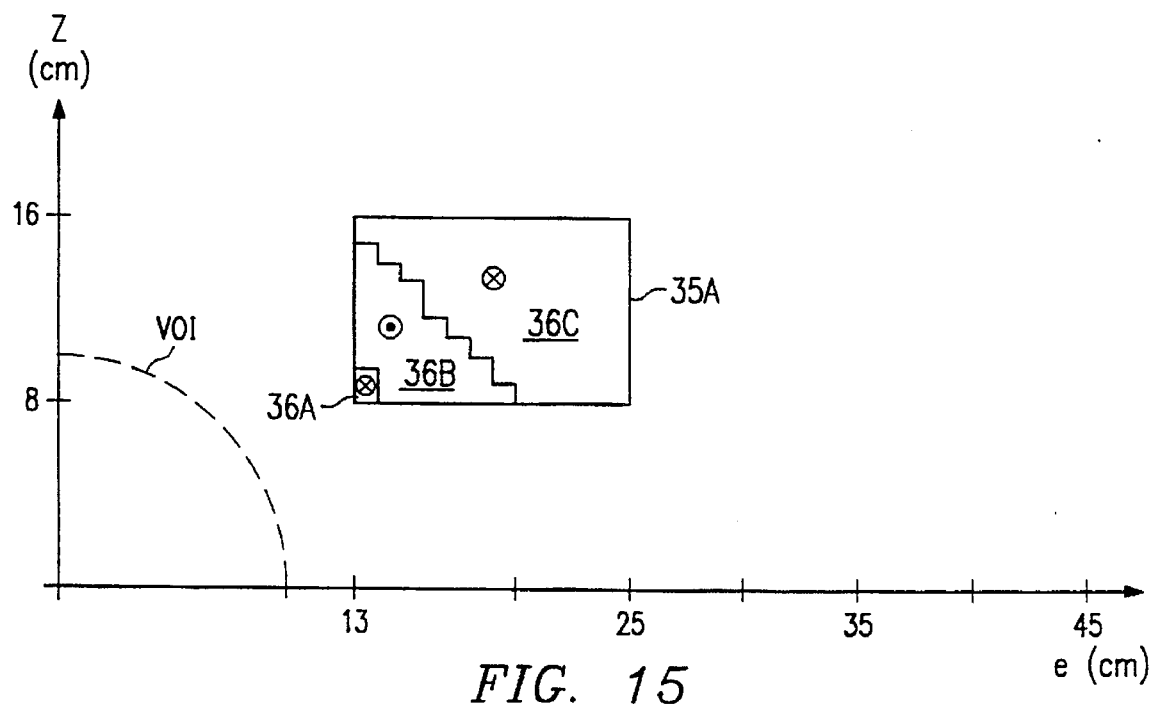
FIG. 15 is a cross-sectional elevation of the coils in the magnet of FIG. 12, according to an unshielded version thereof.

Referring now to FIG. 15, the arrangement of coils 36A through 36C within upper coil assembly 35A will be described in detail relative to an unshielded version of magnet 30. As described hereinabove relative to magnets 2, 2', 20, coil assembly 35 includes a plurality of coils 36A through 36C, each of which presents a different value of total current of varying polarity in magnet 30 to provide a highly uniform magnetic field B within the VOI. The illustration of FIG. 15 is for the upper-right-hand quadrant of magnet 30 as shown in FIG. 14. Coils 36A through 36C will be symmetric both about the axis of bore 34 (the $\rho=0$ axis) and also about the $z=0$ midplane. Accordingly, FIG. 15 is representative of the overall construction of both coil assemblies 35A, 35B in magnet 30.

The design of coils 36A through 36C is, as in the embodiments described hereinabove, preferably accomplished by way of the structured coils methodology, in which the current polarity and magnitude for discrete positional coil elements within tilings corresponding to coil assemblies 35A, 35B (in the z-$\rho$ plane as shown in FIG. 15) are adjusted relative to maximizing the uniformity of field in the VOI at the desired magnitude. As noted above, the structured coils methodology often results in coil elements carrying their maximum or minimum current density (depending on polarity), with a significant degree of clustering resulting in the definition of coils, or clustered groups of coil elements conducting substantially the same current magnitudes and polarities.

For the example of a 20 kgauss field in the VOI generated by magnet 30 having the dimensions described hereinabove, coils 36A through 36C have the shape illustrated in FIG. 15, as optimized according to the structured coils methodology. The polarity of current flow within each of coils 36A through 36C is indicated by cross-within-circle for current into the page (coils 36A and 36C) and by a dot-within-circle for current out of the page (coil 36B), generating a magnetic field in the +z direction (upward in FIG. 15). The current density magnitude resulting from this methodology is approximately 16.0 kA/cm$^2$, and is substantially constant across each of coils 36A through 36C. This low current density allows the use of conventional niobium-titanium alloy superconducting wire, while providing a great deal of room for copper stabilizer, cryogenic coolant conduction grooves, structural steel banding, and conventional quench protection elements, within coil assemblies 35A, 35B. To generate a 20 kgauss field within the VOI, the total current (current density times cross-sectional area of the coil) within each of coils 36A through 36C in this example are as follows:

| Coil | Current (kA) |
| --- | --- |
| 36A | 19.20 |
| 36B | −297.40 |
| 36C | 825.60 |

Figure 16:
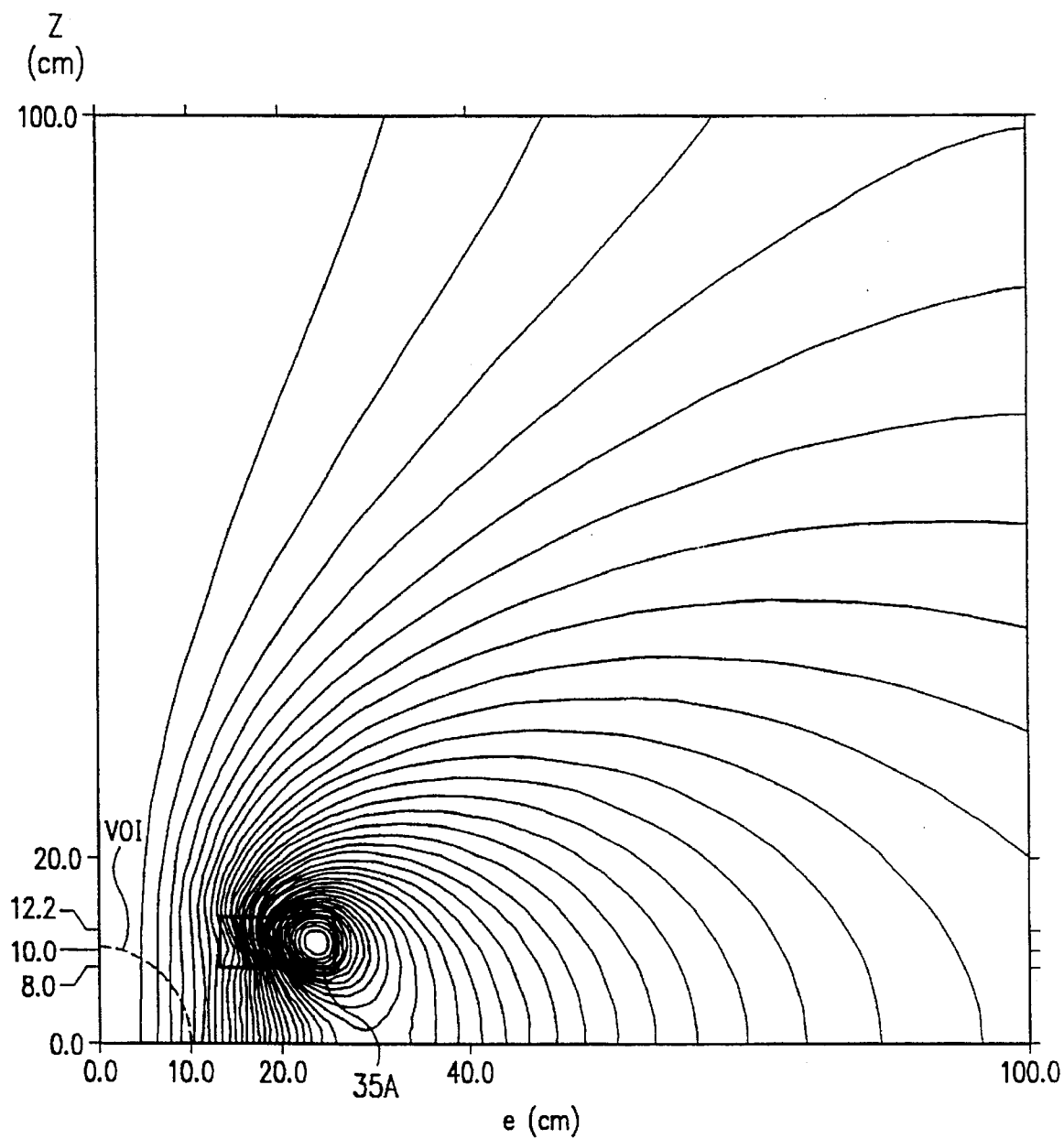
FIG. 16 is a diagram illustrating the lines of field produced by the unshielded magnet of FIG. 14.

FIG. 16 illustrates the field lines as modeled by the OPUS finite element modeling program noted above, for the construction of magnet 30 described hereinabove relative to FIG. 15. For this unshielded version of magnet 30, a 20 kgauss field is produced within the VOI, with a uniformity of approximately 7 ppm (before shimming). The 5 gauss line is approximately 2.5 meters from the side of magnet 30 (i.e., perpendicular from the outer diameter of cryostat 32), and approximately 4.3 meters from its top and bottom surfaces (i.e., parallel with the axis of bore 34). The overall superconductor required for magnet 30 is modeled to be approximately 2732 kA-meters, which is significantly less than a conventional 20 kgauss cylindrical superconducting whole-body MRI magnet, which requires at least 24,000 kA-meters of superconductor.

Figure 17:
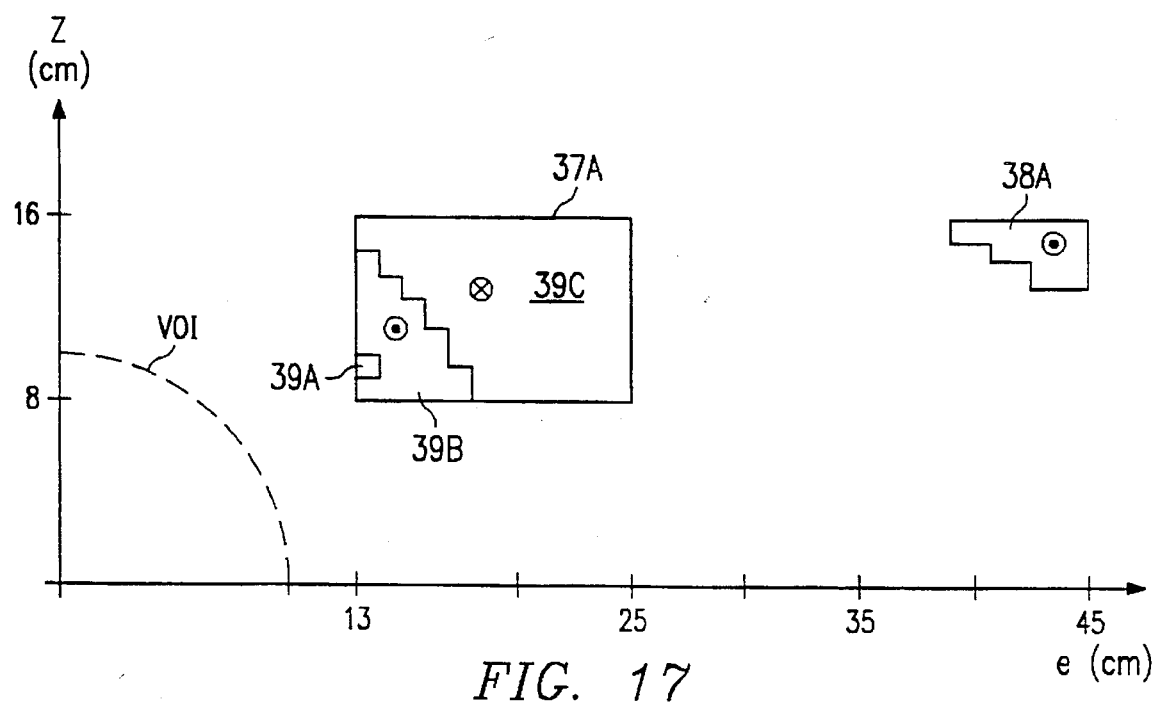
FIG. 17 is a cross-sectional schematic diagram of the coils in the magnet of FIG. 12 according to an actively shielded version thereof.

While the stray field produced by magnet 30 of FIG. 15 is relatively low level, the stray field may be further reduced by providing active shielding coils, such shielding coils also being preferably designed according to the structured coils methodology described hereinabove. FIG. 17 illustrates the arrangement of such an actively shielded magnet (relative to a quarter magnet, symmetric about the $\rho=0$ axis and the $z=0$ plane) including primary coil assembly 37A with coils 39A through 39C therein, in combination with shielding coil 38A. Shielding coil 38A is separated from primary coil assembly 37A in a direction parallel the midplane thereof, for example by a distance of 10 cm. Both primary coil assembly 37A and shielding coil 38A are preferably contained within the same cryostat (not shown in FIG. 17), as each contain similarly constructed superconducting wire.

As in the shielded case of magnet 20 discussed hereinabove, the provision of shielding coil 38A effectively creates a quadrupole magnet, with primary coils 39A through 39C responsible for generating the high uniformity field in the VOI, with shielding coil 38A cancelling the magnetic dipole moment outside of primary coil assembly 37A so that the field decays as a function of $\rho^{-4}$ outside of cryostat 32. The design of the shape, size, location and current in each of coils 39A through 39C and 38A is preferably accomplished by way of the structured coils methodology described hereinabove, again utilizing a weighting factor to effect a tradeoff between highest bore field quality and best shielding.

An example of this design of an actively shielded magnet 30 according to this embodiment of the invention is illustrated in FIG. 17. The polarity convention of cross-in-circle and dot-in-circle illustrated in FIG. 17 is the same as in the examples discussed hereinabove. The total current values for primary coils 39A through 39C, and shielding coil 38A, in this example of shielded magnet 30 are as follows:

| Coil | Current (kA) |
| --- | --- |
| 39A | 6.03 |
| 39B | −256.04 |
| 39C | 883.20 |
| 38A | −151.42 |

The current density for coils 39A through 39C, and for shielding coil 38A, is also approximately 16.0 ka/cm$^2$, again readily conducted by conventional niobium/titanium alloy superconducting wire, with adequate room for copper stabilizers, cryogenic fluid conduit grooves, structural metal banding, and quench protection elements, implemented in the conventional manner.

Figure 18:
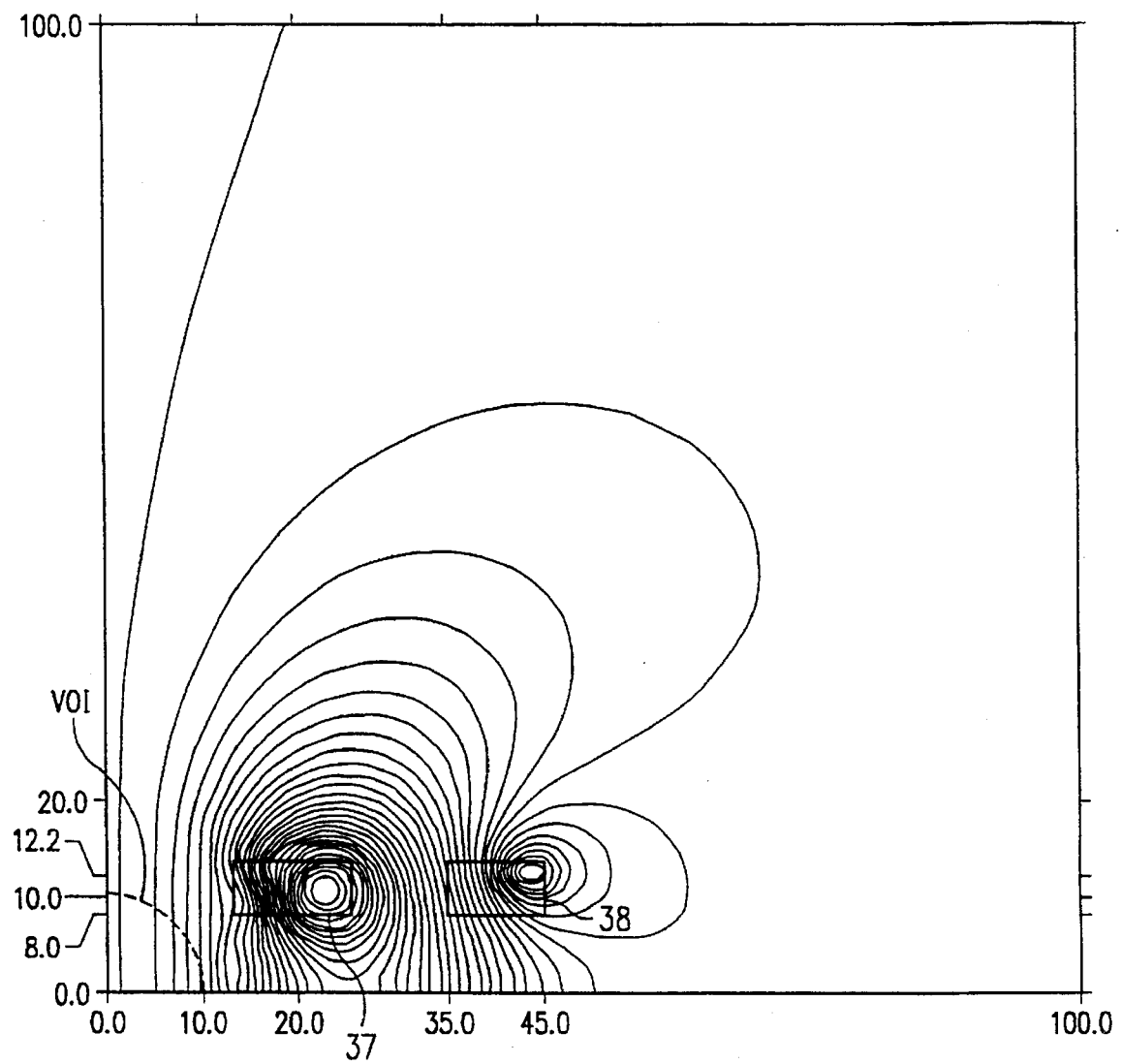
FIG. 18 is a diagram illustrating the lines of field produced by the magnet of FIG. 12 according to the shielded version of FIG. 16.

As modeled by the opus finite element computer modeling program, the construction of shielded magnet 30 as shown in FIG. 17 provides field lines as illustrated in FIG. 18. This modeling indicates that the 5 gauss line is only 70 cm from the outer diameter of shielding coil assembly 28

(which itself is approximately 45 cm from the axis of bore 34), and only 2.0 meters from the top and bottom faces. The total amount of superconductor required for this shielded magnet 30 is approximately 3556 kA-meters, which is still quite efficient for a 20 kGauss field strength. The overall size of shielded magnet 20 is approximately 1.0 meters in diameter and 35 cm thick, and the contemplated weight is less than 1000 pounds, again providing a relatively small and inexpensive high strength DC magnet for MRI systems.

As in the case of bagel-shaped magnet 20, one may tradeoff superconductor amount with shielding efficiency, saving superconductor and cryogenic cost at the expense of poorer stray field shielding. Also as in the case of magnet 20, iron shielding may also be utilized for magnet 30 according to this embodiment of the invention, at the expense of added weight and size, while still obtaining the other benefits of magnet 30.

Uniform high field DC magnet 30 according to this embodiment of the invention thus also tailors the volume of interest to that of the head area, while removing the obstruction to vision presented by conventional cylindrical magnets. In combination with the benefit that the whole body need not be inserted into a magnet bore, the present invention thus provides a high DC field for NMR tomography with minimal patient discomfort, and maximum access to the patient by medical personnel. The effect of gradient coil noise on the patient is much reduced by the magnet according to this embodiment of the invention, further reducing patient anxiety from that experienced in conventional cylindrical whole-body magnets.

Furthermore, in each of these helmet-shaped magnets, the structured coils methodology provides electromagnets with relatively large fields that are substantially uniform over a relatively large volume of interest and with relatively little superconductor required, all relative to conventional magnet designs such as a Helmholtz pair of coils.

Ultrashort Cylindrical Bore Magnet

Figure 27:
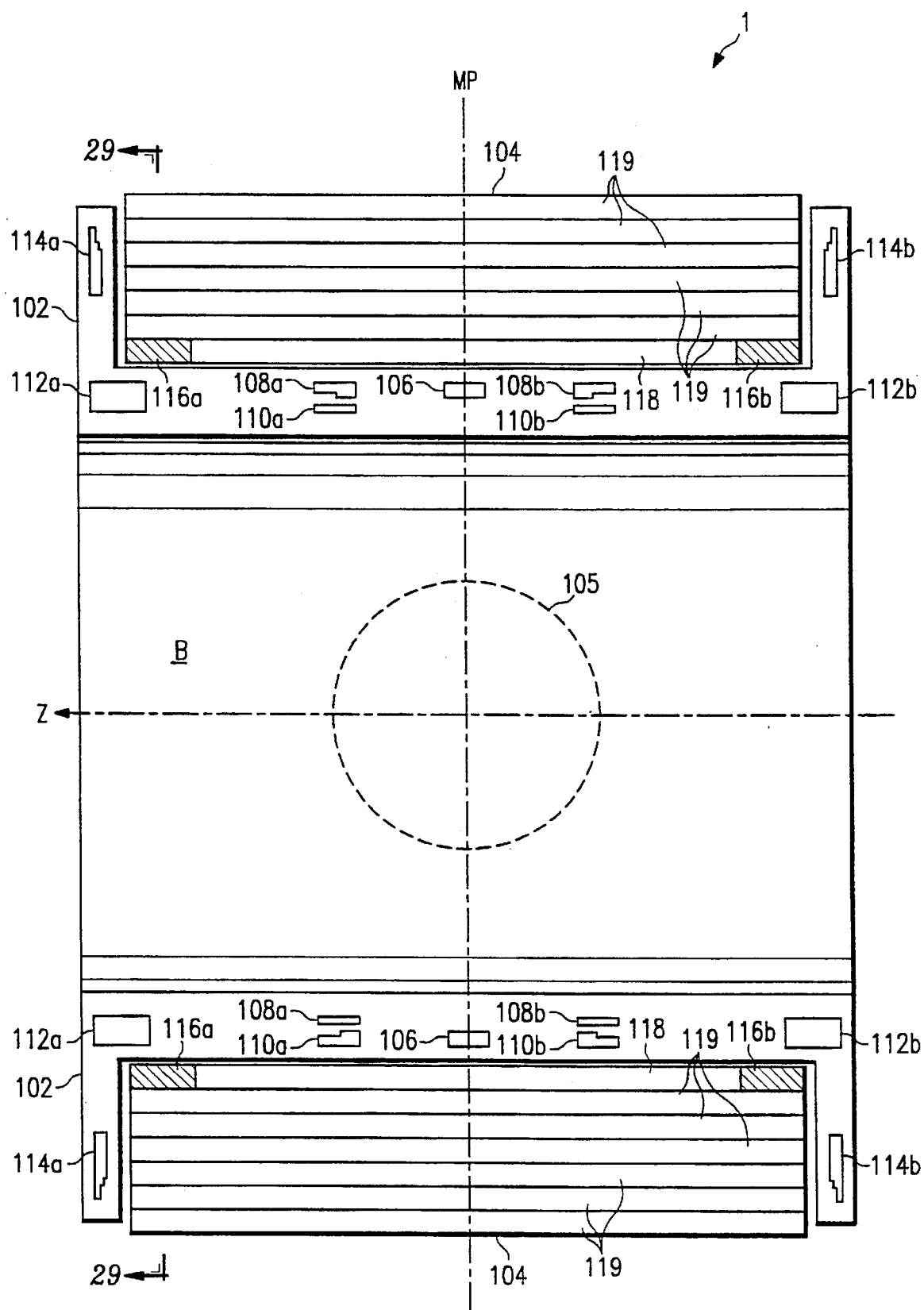
FIG. 27 is an axial cross-sectional diagram, in block form, of a superconducting magnet according to the preferred embodiment of the invention.

Referring to FIG. 27, superconducting magnet 1 according to another embodiment of the invention is illustrated in cross-section. Magnet 1 is intended to generate high DC magnetic fields, such as on the order of 2.0 Tesla, for use in an MRI apparatus of the cylindrical type. As such, the cross section of FIG. 27 illustrates two cross-sectional portions of the cylinder, disposed about cylindrical bore B having axis Z, and symmetric both relative to axis Z and also a midplane MP. Sphere 105 within bore B indicates the volume within which the DC magnetic field generated by superconducting magnet 1 of the present invention is to be highly uniform, deviating on the order of 25 ppm or less therewithin. As such, sphere 5 indicates the volume to be imaged by way of MRI by the apparatus, and in this example is approximately 25 cm in radius.

FIG. 28 illustrates magnet 1 as used for the MRI of a human subject H disposed therewithin. As shown in FIG. 28, sphere 105 is intended to be of sufficient size to enable imaging of a meaningful portion of human subject H, such as an internal organ. According to this embodiment of the invention, the length of bore B is on the order of 1.5 meters, and the diameter of bore B is on the order of 1.0 meters. As will be discussed in further detail hereinbelow, these dimensions allow for a relatively high level of comfort for human subject H, and allows for continuous access of human subject H by way of life support systems, instrumentation and monitoring systems, as well as human intervention by medical personnel.

Magnet 1 includes cryostat 102, within which are located sets of superconducting coils for generating the axial DC magnetic field in bore B, and also for providing the shielding function. As will be described in further detail hereinbelow, driving coils 106, 108a, 108b, 110a, 110b, 112a and 112b are located within cryostat 102 near bore B, for generating the DC axial magnetic field within bore B. Shielding coils 114a, 114b are located at the ends of magnet 1 at a larger radial distance from axis Z from driving coils 112a, 112b, respectively, and each carry current in the opposite direction from that in driving coils 106, 108, 110, 112. Cryostat 102 is preferably formed of stainless steel, such as 304L stainless steel, of sufficient strength to allow for its interior to be pumped down to the desired vacuum when chilled to superconducting temperatures, and to provide the desired structural support for the bobbins within which the superconducting coils are placed as well as the ducting for the cryogenic coolant. According to this embodiment of the invention, as will be described in further detail hereinbelow, a single cryostat 102 contains both the driving coils 106, 108, 110, 112 and shielding coils 114 of this superconducting magnet.

A cryogenic unit (not shown) is provided with magnet 1 for chilling driving coils 106, 108, 110, 112 and shielding coils 114 to the necessary temperature to maintain the wire material in a superconducting state. For example, where the superconducting wire is formed of a niobium titanium alloy, the upper limit on the superconducting temperature is 9.2° K. An example of a cryogenic unit capable of maintaining such temperature is a model CGR511-4.5 manufactured and sold by CVI, Inc., and uses liquid helium as the coolant fluid.

The detailed construction and current for coils 108, 110, 112, 114 of superconducting magnet 1 will be described in further detail hereinbelow.

Referring to FIGS. 27 and 29 in combination, superconducting magnet 1 according to this embodiment of the invention further includes flux return 104 disposed cylindrically within the gap in cryostat 102, between shielding coils 114a, 114b. As shown in FIG. 29, flux return 104 is constructed in a plurality of Segments 120 surrounding cylindrical bore B, each segment 120 defining an arc of the circular cross-section of the magnet. Each segment 120 including a plurality of parallel adjacent steel plates 119, each of which extends the length of flux return 104 parallel to axis Z. The preferred material of plates 119 is 1008 steel, which is ferromagnetic as is well-known; as such, flux return 104 according to this embodiment of the invention is substantially an iron flux return. The width of plates 119 increases with radial distance from axis Z to substantially fill the volume within the arc defined by its segment 120. In this example, twelve segments 120 of parallel plates 119 surround bore B.

Plates 119 within a segment 120 are secured to one another and to rings 116a, 116b on either end of the magnet, for example by way of bolts. Rings 116a, 116b are machined rings of 1008 steel or any other high strength ferromagnetic material, and include the appropriate holes to allow for plates 119 in each segment 20 to bolt thereto. For each segment 120, an additional steel plate 118 is bolted to rings 116a, 116b, located therebetween and thus having a radial distance from axis Z equal to that of rings 116a, 116b; plate 118 thus adds structural strength as well as adding a flux path in flux return 104 between rings 116a, 116b, in addition to that of plates 119. It is preferable that rings 116a, 116b be formed by way of precision machining; however, the present invention allows for plates 118, 119 to be fabricated by less costly, lower precision methods such as flame cutting.

By way of example, iron flux return 104 according to this embodiment of the invention has an inner radial edge (i.e., the inner side of plate 118) located at a radial distance of approximately 68 cm from axis Z. The outer edge of flux return 104 (i.e., the outer side of the top plate 119) is located at a radial distance of approximately 99 cm from axis Z. The overall length of flux return is approximately 130 cm. For 1008 steel, according to this example, the total weight of iron flux return 104 is approximately 16.6 tons.

Referring back to FIG. 27, the construction and location of driving coils 106, 108, 110, 112 and shielding coils 114 will now be described in detail. As noted hereinabove, driving coils 106, 108, 110, 112 are each disposed near bore B, within the inner radius of flux return 104, and all carry current in the same direction to generate the desired magnetic field; for example, the direction of current flow in driving coils 106, 108, 110, 112 is out of the page at the top of FIG. 27 and into the page at the bottom of FIG. 27 (or clockwise in the cross-section of FIG. 29). As such, driving coils 106, 108, 110, 112 together form a driving solenoid for generating a magnetic field in bore B, having field lines (or flux lines) oriented parallel to axis Z of bore B.

Shielding coils 114a, 114b are each disposed at the ends of the magnet, outside of flux return 104, such that flux return 104 is disposed within the axial gap between shielding coils 114a, 114b. The direction of current flow through shielding coils 114a, 114b is opposite that in driving coils 106, 108, 110, 112 (i.e., into the page at the top of FIG. 27 and out of the page at the bottom of FIG. 27, or counterclockwise in the cross-section of FIG. 29), so that shielding coils 114a, 114b generate a magnetic field of the opposite polarity of that generated within bore B.

Conventional design techniques may be used to determine magnitude of the current in each of the driving coils 106, 108, 110, 112 and in shielding coils 114, of magnet 1 of FIGS. 27 and 29. According to the most widely-used design methodology, the location of sets of driving coils (and shielding coils, if desired) is first determined, and the currents are then defined by way of computer-aided modeling. The preferred case for such design is for a magnet that is axially symmetric and symmetric about its midplane, thus ensuring that only even zonal harmonic coefficients are produced. The current density in each coil is presumed to be the same, and not a function of location (i.e., the current density is independent of radial or axial distance from the target sphere). Once the coil locations are determined in this prior method, the designer adjusts the current through each set of coils until the higher order zonal harmonic coefficients ($C_2$, $C_4$ and higher) vanish, so that the zero order zonal harmonic coefficient $C_0$ alone determines the desired field in the bore. Improvements to this prior design technique included finite element (FE) modeling and design for the case of iron shielded magnets, and Monte Carlo random search techniques for actively shielded magnets, each used to determine the currents in the defined coil locations.

It should be noted that this prior technique may be used in order to set the current magnitudes in the driving coils 106, 108, 110, 112, and shielding coils 114, of magnet 1 according to the preferred embodiment of the invention. However, the location and current magnitude in each of driving coils 106, 108, 110, 112, and in shielding coils 114, is preferably determined according to the "structured coils" methodology, as described hereinabove.

Accordingly, the detailed design of magnet 1 was determined by way of the structured coils methodology, with the design goal being a magnet generating a DC magnetic field of 2.0 Tesla within a 1.0 meter diameter bore B, with uniformity of 25 ppm or less within a 25 cm radius sphere 105. The fringe field design goal was a 5 gauss line 5 meters or less from the opening of bore B on either end. In addition, for cylindrical magnets such as magnet 1 in this embodiment of the invention, the axial and mid-plane symmetry allows for the structured coils minimization to be done on a quarter magnet basis.

According to the structured coils method used to design this example of the magnet, 21 target locations were selected on the surface of sphere 105. In addition, for design of the proper shielding, in this example 15 target locations were selected outside of bore B, along a quarter ellipse having its semi-axes 4.8 meters from the center of sphere 5 in the axial direction (along axis Z), and 2.5 meters from the center of sphere 5 in the radial direction (perpendicular to axis Z). This quarter-ellipse definition of the target locations for the fringe field was selected as it resembled the shape of conventional 5 gauss lines for cylindrical MRI magnets.

In performing the quadratic minimization of the field error using target locations both within the bore and outside of the bore, it is useful to include a weighting factor in the error form. This weighting factor comprehends the tradeoff between high uniformity field in the bore B versus low fringe effects. Accordingly, the error form Q minimized in the design of magnet 1 according to this embodiment of the invention is as follows:

$$Q = \sum_{i=1}^{21} W_i(B_{zi} - B_i')^2 + \sum_{i=22}^{36} p(B_{pi}^2 + B_{zi}^2)$$

where the set of $w_i$ is a set of weighting factors for weighting the effect of the target locations (i=1 to 21) within bore B, where the difference ($B_{zi} - B_i'$) is the difference between the calculated field and the desired field at the ith target location in bore B, and where ($B_{pi}^2 + B_{zi}^2$) is the square of the amplitude of the field (radial and axial components) at the target locations (i=22 to 36) outside the bore B, at which the fringe field is determined. The weighting factor p indicates the tradeoff between highest bore field quality (p=0) and best shielding (p large). Empirical study has indicated that a value of $10^{-6}$ to $10^{-5}$ is suitable for magnets to be used in MRI applications.

Iron flux return 104, as used in this first embodiment of the invention, may be considered in the design of the coils even though iron presents significant non-linear effects to the magnetic field. Such consideration may be made by first optimizing coil shapes for a bore field strength without the iron flux return, and then adding the field enhancement expected from the use of iron in the magnetic loop. After adding the field enhancement factor, the currents in the defined coil shapes are then optimized, for field uniformity, using conventional finite element methods (e.g., the well-known OPUS computer program). The result is successful so long as the current adjustments are not so significant that the coil shape optimization is defeated.

Referring back to FIG. 27, the location, size, and current of the coils 106, 108, 110, 112, 114 will now be described in detail for magnet 1 according to this embodiment of the invention, as defined by the structured coils methodology described hereinabove and in the Pissanetzky reference. While each of the coils 106, 108, 110, 112, 114 will be described hereinabove for this particular example, it is expected that variations in the size, number, location and current will occur in the practice of the present invention, particularly as the dimensions or field strength of the magnet change, or as the particular design criteria (e.g., tradeoff between high quality field and minimal fringe field) are changed. As such, the following description is by way of example only, and is not to be construed in a limiting sense.

Superconducting coils 106, 108, 110, 112, 114 in this example are constructed according to conventional design. For example, the SCOK superconducting wire manufactured and sold by Outokumpu Copper (U.S.A.) Inc. of Glendale Heights, Ill. is believed to be particularly useful in a high field superconducting magnet of relatively short length, as in this example. The SCOK wire consists of 1.05 mm (O.D.) 2.32:1 Cu/NbTi wire, having a rating of 570 A at 6 Tesla fields; the capacity of this wire thus exceeds the 500 A current rating of conventional persistent switches. In addition, the coils 106, 108, 110, 112, 114 can use thinner diameter wire of the same composition quite successfully. The coils are insulated from one another in the conventional manner, and placed within conventional bobbins at the locations within cryostat 102 shown in FIG. 27.

In this example, for a 2.0 Tesla magnet, center driving coil 106 has a rectangular cross-section of approximately 7.2 cm (axial direction) by 1.8 cm (radial direction), with its inner edge located approximately 61.2 cm from axis Z. The current through center driving coil 106 in this example is approximately 401,360 amperes.

Outer intermediate coils 108a, 108b have their inner radial edge at approximately 61.0 cm from axis Z, and their inner axial edges at an axial distance of approximately 21.6 cm from the midplane MP of bore B. Outer intermediate coils 108a, 108b are each of irregular cross-section, having a major rectangular portion approximately 3.6 cm (axial) by 2 cm (radial), and a rectangular extension of approximately 3.6 cm by 1.3 cm extending therefrom in the axial direction away from the midplane MP of bore B. The orientation of the irregular cross-section of outer intermediate coils 108a, 108b are symmetric relative to the midplane MP of bore B. Each of outer intermediate coils 108a, 108b carry a current, in this example, of approximately 238,419 amperes.

Inner intermediate coils 110a, 110b are located radially inward of outer intermediate coils 108a, 108b, respectively, and have a rectangular cross-section of approximately 7.2 cm (axial) by 0.5 cm (radial), with its inner radial edge at a radial distance of approximately 58 cm from axis Z. The inner axial edge of each of inner intermediate coils 110a, 110b is approximately 21.6 cm from the midplane MP of bore B. The current carried by each of inner intermediate coils 110a, 110b is approximately 200,000 amperes.

End driving coils 112a, 112b are located near the outer edges of cryostat 102 from the midplane MP of bore B. Each of end driving coils 112a, 112b have a rectangular cross-section of approximately 10.8 cm (axial) by 5 cm (radial), and have their inner radial edges at a radial distance of approximately 58 cm from axis Z. The inner axial edges of end driving coils 112a, 112b are at approximately 61.2 cm from the midplane MP of bore B. End driving coils 112a, 112b, in this embodiment of the invention, carry the majority of the current for generating the DC magnetic field in bore B; in this example, the current through each of end driving coils 112a, 112b is approximately 1.624 million amperes.

As noted hereinabove, the polarity of the current through each of driving coils 106, 108, 110, 112 is the same. As a result, due to the large current therethrough, end driving coils 112a, 112b contribute most of the flux in bore B. Inner coils 106, 108, 110 contribute additional flux, of course, and adjust the field in bore B for optimal uniformity.

It should also be noted that the distance from axis Z of the inner radial edges of center driving coil 106, inner intermediate driving coils 110a, 110b, outer intermediate driving coils 108a, 108b, and end driving coils 112a, 112b, is substantially the same. As a result, the superconducting wire may be placed within bobbins wound about a single pipe, supplemented as needed to finely place the wire at the proper distance. This construction is in contrast to many conventional superconducting magnets of a spherical or quasi-spherical type, in which the center coils are at a significantly greater radial distance from the bore axis than the coils at the end, thus requiring bobbins of widely differing radii. Examples of such spherical magnets are described in U.S. Pat. No. 4,587,490, in U.S. Pat. No. 4,595,899, in Everett, et al., "Spherical coils for uniformmagnetic fields," *J. Sci. Instrum.*, Vol. 43 (1966), pp. 470–74.

Because of the ability to use a single diameter pipe in this embodiment of the invention, the weight and volume of the iron in the magnet may be reduced from that otherwise necessary. In addition, the amount of superconducting material may be minimized, further reducing the cost of the magnet. Furthermore, the construction of the bobbins and the procedure for winding the superconductor thereabout are both simplified when a single diameter pipe is used.

Shielding coils 114a, 114b are also provided in this embodiment of the invention, for carrying current of the opposite polarity from that in driving coils 106, 108, 110, 112, thus injecting return flux into flux return 104. Shielding coils 114a, 114b are located radially outwardly from end driving coils 112a, 112b, respectively, and axially outwardly from flux return 104 relative to the midplane MP of bore B. The inner radial edge of each of shielding coils 114a, 114b is at a radial distance from axis Z of approximately 80 cm. Shielding coils 114a, 114b in this example each have irregular cross-sections that are oriented symmetrically relative to one another. The cross-section of each of shielding coils 114a, 114b includes a major rectangular portion of approximately 2 cm (axial) by 8 cm (radial); a first rectangular extension of 1.6 cm (axial) by 2 cm (radial) extends radially away from the major portion, with a second rectangular extension of approximately 0.8 cm (axial) by 2 cm (radial) extending radially away from the first rectangular extension. The symmetric orientation of the extensions is such that the outer axial edge of coils 114a, 114b is collinear.

The current conducted by each of shielding coils 114a, 114b is approximately 633,000 amperes, and is of the opposite polarity of the current in driving coils 106, 108, 110, 112, as noted above. As such, active shielding is provided by shielding coils 114a, 114b, such that the magnetic flux emanating from the axial openings of bore B is directed toward and injected into flux return 104, with minimization of the fringe field away therefrom.

Figure 30:
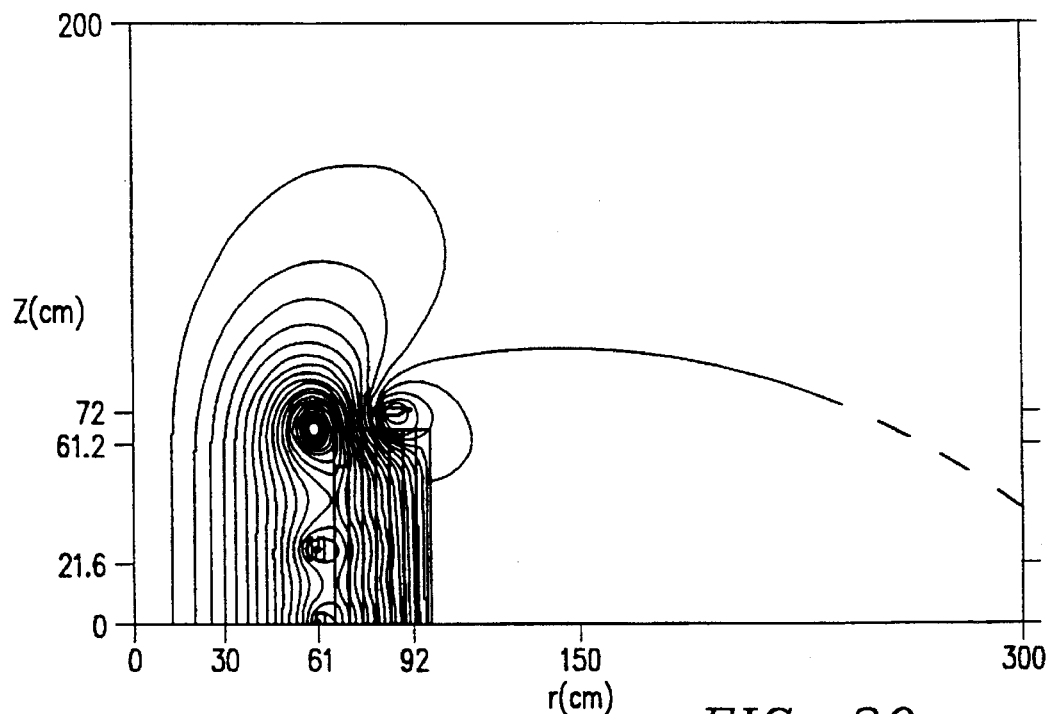
FIG. 30 is a plot illustrating the field lines of the magnet of FIG. 27, as simulated.

Referring now to FIG. 30, the field lines for magnet 1 constructed as described above relative to FIG. 27 are shown, based on finite element simulation of the field according to the OPUS computer program, available from Ferrari Associates, Inc. of Jacksonville, Fla. For purposes of simplicity of presentation (and of simulation), the field lines of FIG. 30 are illustrated for a quarter-magnet; the axial and mid-plane symmetry of magnet 1 according to this embodiment of the invention allow this quarter-magnet representation to accurately convey the field behavior.

As shown in FIG. 30, shielding coils 114a, 114b, located radially outside of end driving coils 112a, 112b, respectively, and located axially outward of flux return 104, inject the return magnetic flux into flux return 104 in a highly efficient manner. In addition, the field within bore B is highly uniform, as indicated by the straight field lines therein, parallel to one another, and spaced from one another in a manner inversely proportional to their radial distance from axis Z; the simulated field uniformity within sphere 5 is approximately 25 ppm. This particular simulation is for a magnetic field of 2.0 Tesla within bore B, as is suitable for advanced MRI with high resolution.

Figure 31:
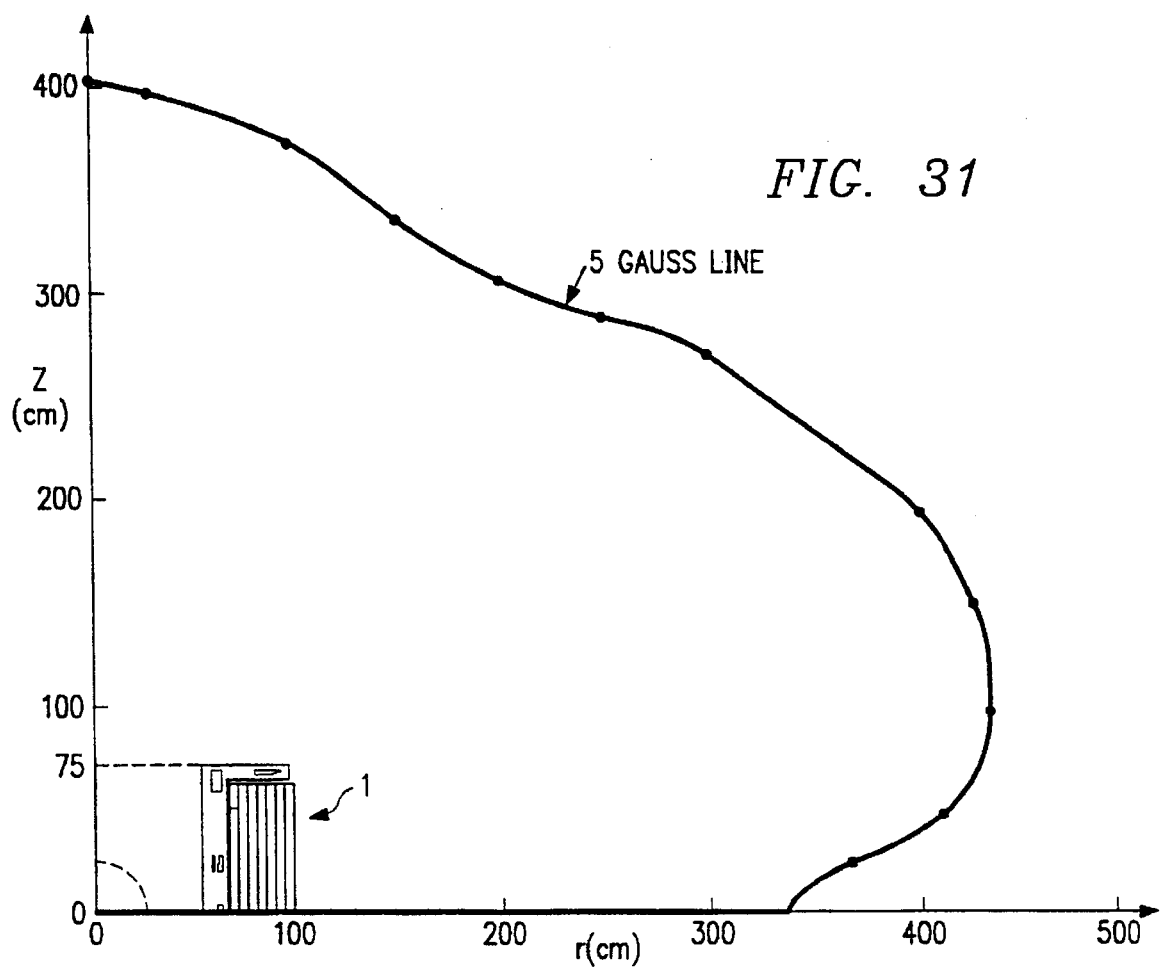
FIG. 31 is a plot illustrating the fringe field of the magnet of FIG. 27, as simulated.

Referring now to FIG. 31, the fringe field generated by magnet 1 according to this embodiment of the invention is illustrated, as simulated by the OPUS computer program noted above. FIG. 31 illustrates the location of the 5 gauss line, which is the conventional measure for shielding of superconducting magnets. As shown in FIG. 31, the 5 gauss line is approximately 4 meters from the midplane MP of bore B, or 3.25 meters from the end of cryostat 102. The maximum radial distance from axis Z of the 5 gauss line is approximately 4.4 meters, at a point approximately radially outward from the axial end of cryostat 102.

Accordingly, it is contemplated that the present invention is suitable for producing a superconducting magnet of compact dimensions, yet which produces an extremely high magnetic field (on the order of 2.0 Tesla) in the cylindrical bore, in a manner which is highly uniform over a volume of interest (25 ppm over a sphere of 25 cm radius), and which produces minimal fringe field (5 gauss line at 4.0 to 4.5 meters). This magnet is extremely compact, having a cryostat length of approximately 1.5 meters and a bore of 1.0 meters, thus allowing good patient access and reduced patient anxiety. The ratio of bore length to bore diameter obtained in magnet 1 according to this embodiment of the invention is therefore well below the top of the desired range of 1.00 to 1.90 for such magnets, as described in the above-referenced U.S. Pat. No. 4,924,185.

Furthermore, the cost and weight of the magnet so produced is relatively low as compared against other magnets. According to the present invention, the driving and shielding coils may be contained within a single cryostat, thus reducing the mechanical and cryogenic requirements of the magnet. Furthermore, the use of active shielding coils located outside of the flux return results in highly efficient injection of the return flux into the iron flux return, especially as compared against superferric magnets that relied on machined steel end plates for such injection.

In addition, the present invention allows for the iron flux return to be produced in a low cost manner. This is because the only iron parts that require precision machining according to this embodiment of the invention are rings 116a, 116b. Plates 118, 119 may be formed by less costly, and less precise, techniques such as flame cutting.

Furthermore, the use and location of the iron flux return 104 near the bore in this embodiment of the invention provides for other significant advantages. Firstly, the efficiency of the flux return is greatly improved over conventional magnets, due to shielding coils located axially outwardly from flux return 104; as such, the amount of iron required is much reduced over prior superferric magnets, which significantly reduces the weight of the overall magnet and its flexibility of use. For example, it is contemplated (by way of computer modeling) that the weight of iron flux return 104 in this embodiment of the invention is on the order of 16.6 tons, well below that of conventional iron shielded cylindrical magnets of 1.0 meter bore size.

In addition, iron flux return 104 is located outside of cryostat 102. As such, it can be readily disassembled for transportation, and reassembled upon arrival, providing a high degree of portability of the magnet as compared against conventional magnets that either have iron shielding located within the cryostat, or that require high precision installation and adjustment of the iron upon installation.

Furthermore, driving coils 106, 108, 110, 112 are only weakly coupled to one another according to this embodiment of the invention, due to the near presence of iron flux return 104. This weak coupling provides significant quench protection, as in the event that one of the coils enters a quench condition, it will receive very little flux from neighboring coils which would otherwise add energy to the quench. Since the vulnerability to quench is reduced according to the present invention, the current through the coils may be increased to closer to its maximum, further improving the efficiency of the magnet in generating high fields with little superconductor.

Furthermore, the presence of the shielding coils at the ends of the flux return, in place of ferromagnetic end pieces as in prior superferric and otherwise iron shielded magnets, improves the uniformity of the generated field. In conventional MRI systems having ferromagnetic end pieces or poles, eddy currents are induced in the end pieces by the gradient coils. These eddy currents, in turn, induce magnetic flux which perturbs the uniformity and stability of the gradient field. The absence of the end pieces in magnet 1 constructed according to the present invention eliminates such eddy currents and the resulting perturbations.

The present invention thus provides for many of the other benefits of iron shielded magnets, without the excessive weight and cost attributed to conventional iron shielded magnets. In this embodiment of the invention, iron flux return 104 isolates the bore field from externally generated magnetic fields. In addition, iron flux return 104 serves to enhance the magnetic field in the bore, reducing the current requirements for the driving coils. These advantages are obtained in the present invention by a magnet which has a relatively light weight, and which may be manufactured at relatively low cost.

While seven driving coils 106, 108, 110, 112 and two shielding coils 114 are provided in this example of the invention, it should of course be apparent to one of ordinary skill in the art that greater or fewer coils may be alternatively be provided, depending upon the particular design constraints for a superconducting magnet to be constructed, without departing from the scope and spirit of the present invention.

The above-described embodiment utilizes active shielding coils 114a, 114b to direct, or inject, the return magnetic flux into iron flux return 104. It is contemplated that other types of flux returns may be utilized in conjunction with the present invention. For example, it is contemplated that an active flux return, for example a superconducting solenoid, may be used in place of iron flux return 104 described hereinabove, in such cases where the reduction in weight of the magnet obtained in such a substitution outweighs the additional cost of superconducting material. In addition, it is contemplated that a combination of a passive ferromagnetic flux return with an active flux return may also be used in conjunction with the present invention, allowing for optimization of magnet weight and superconductor cost.

Figure 32:
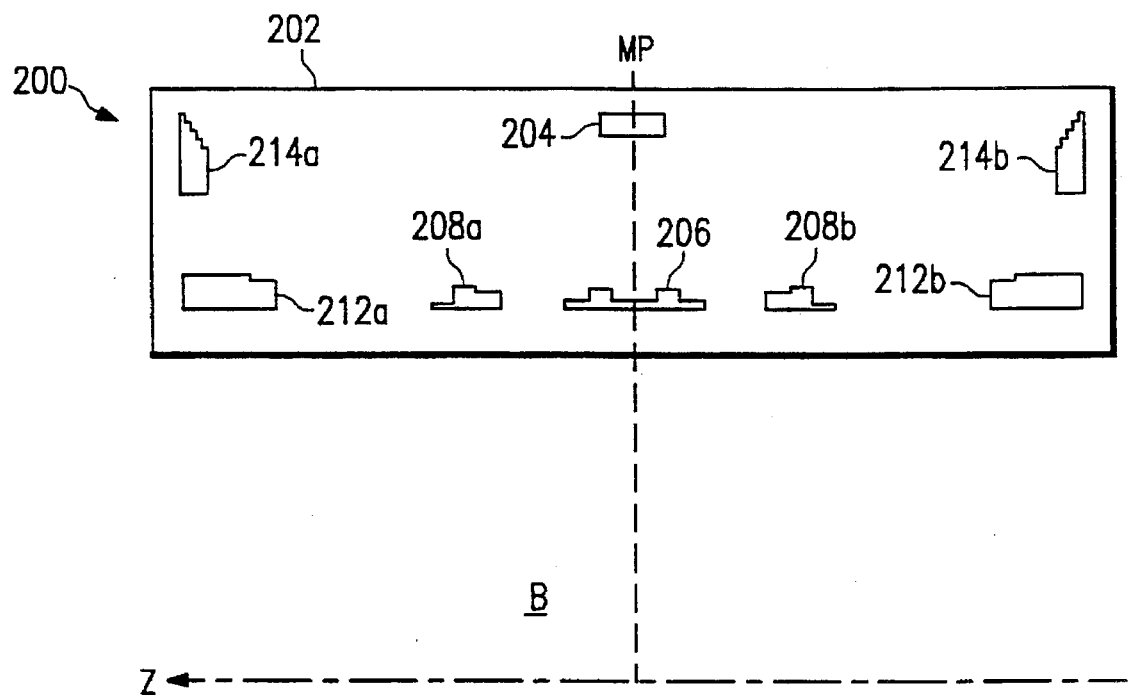
FIG. 32 is an axial cross-sectional diagram of one half of a superconducting magnet according to an alternative embodiment of the invention.

Referring now to FIG. 32, magnet 200 according to an alternative embodiment of the invention will now be described, in which an active flux return is provided in place of iron flux return 104 in the previously described embodiment. The cross-sectional view of FIG. 32 is of one-half of magnet 200; as described hereinabove relative to FIG. 27, magnet 200 is of the cylindrical type, symmetric about axis Z; in addition, the location, size and shape of the coils in magnet 200 is also symmetric about midplane MP, as shown in FIG. 32.

Cryostat 202 in magnet 200 of FIG. 32 is of a hollow cylindrical shape, and of conventional construction and shape for maintaining its internal volume at superconducting temperatures. As in the embodiment described hereinabove, a conventional cryogenic unit is provided with magnet 200 for appropriate cooling of the volume therewithin.

Within cryostat 202, magnet 200 includes center driving coil 206, intermediate driving coils 208a, 208b, and end driving coils 212a, 212b, each consisting of superconducting wire for conducting current of like polarity. End shielding coils 214a, 214b are also contained within cryostat 202, at opposing ends thereof and at a radial distance from axis Z outside of end driving coils 212a, 212b; as in the case of magnet 1 discussed hereinabove, end shielding coils 214a, 214b also consist of superconducting wire, and conduct current of opposite polarity from that conducted by driving coils 206, 208, 212.

In magnet 200 according to this alternative embodiment of the invention, an active flux return 204 is provided in place of iron flux return 104 (see FIG. 27). Active flux return 204 consists of a coil of superconducting wire, disposed at and symmetrically about midplane MP, at a radial distance from axis Z outside center driving coil 206. Active flux return coil 204 conducts current in the same direction as end shielding coils 214a, 214b, and thus in an opposite polarity to driving coils 206, 208, 212.

In this embodiment of the invention, as in magnet 1 described hereinabove, the location, shape, size and current density of each of coils 206, 208, 212, 214, 204 are determined according to the structured coils methodology described hereinabove and in the Pissanetzky article incorporated hereinto by reference. As a result, particularly resulting from the clustering effect, relatively small coils of irregular cross-section and having constant current density will likely result, optimizing the uniformity of the field in bore B while minimizing fringe field outside of bore B.

In this example of magnet 200, the inner radial edges of each of driving coils 206, 208, 212 are at substantially the same radial distance (approximately 58 cm) from axis Z. As such, a single pipe may be used within cryostat 202, about which bobbins for supporting coils 206, 208, 212 may be wound, supplemented as needed to finely tune the location. Center driving coil 206 has three thicknesses (in the radial direction): approximately 0.71 cm at the center at midplane MP, 2.86 cm at its thickest point, and 1.3 cm at its end locations. The overall axial width of center driving coil 206 in this example is approximately 21.5 cm, and the current it conducts is approximately 15,000 amperes.

Intermediate driving coils 208a, 208b each have their inner axial edge located at an axial distance of 21.6 cm from midplane MP, and each have an axial width of about 10.8 cm. Intermediate driving coils 208a, 208b also have three radial thicknesses (in this example), with the thinnest portion approximately 0.7 cm thick, its thickest portion approximately 3.6 cm thick, and its nearest portion to midplane MP approximately 2.5 cm thick. The current conducted by intermediate driving coils 208a, 208b is approximately 732,300 amperes each.

End driving coils 212a, 212b, as in the previously described embodiment, provide the bulk of the direct field in bore B. Each of end driving coils 212a, 212b have their inner axial edge located at approximately 57.6 cm from midplane MP, and each have an axial width of approximately 14.4 cm. The thicker portions (radially) of end driving coils 212a, 212b are approximately 5.0 cm thick, and the thinner portions nearer midplane MP are approximately 4.5 cm thick. The current conducted by end driving coils 214a, 214b is approximately 2.104 million amperes.

End shielding coils 212a, 212b have a stair-step cross-section similar to end shielding coils 14a, 14b in magnet 1 of FIG. 27. The inner radial edges of end shielding coils 214a, 214b are at a radial distance of approximately 76 cm from axis Z, while the inner axial edges thereof are at an axial distance of approximately 68 cm from midplane MP; the axial width of each of end shielding coils 214a, 214b is approximately 4.0 cm. The radial thickness of the thickest portions of end shielding coils 214a, 214b (furthest from midplane MP) are approximately 12.6 cm; each coil 214a, 214b has three steps of approximately 1.4 cm in thickness provided so that the thinnest portions of end shielding coils 214a, 214b (nearest midplane MP) is approximately 7.0 cm. The current conducted by each of shielding coils 214a, 214b is approximately 1.197 million amperes, of opposite polarity from that conducted by driving coils 206, 208, 212.

Active flux return coil 204 in this embodiment of the invention is a coil of rectangular cross-section, disposed symmetrically at midplane MP and at a radial distance of approximately 85 cm from axis Z. Active flux return coil 204 is approximately 3.28 cm in radial thickness by 10.5 cm in axial width, and carries approximately 516,130 amperes of current, of the same polarity as end shielding coils 214a, 214b and opposite polarity from that conducted by driving coils 206, 208, 212.

Figure 33:
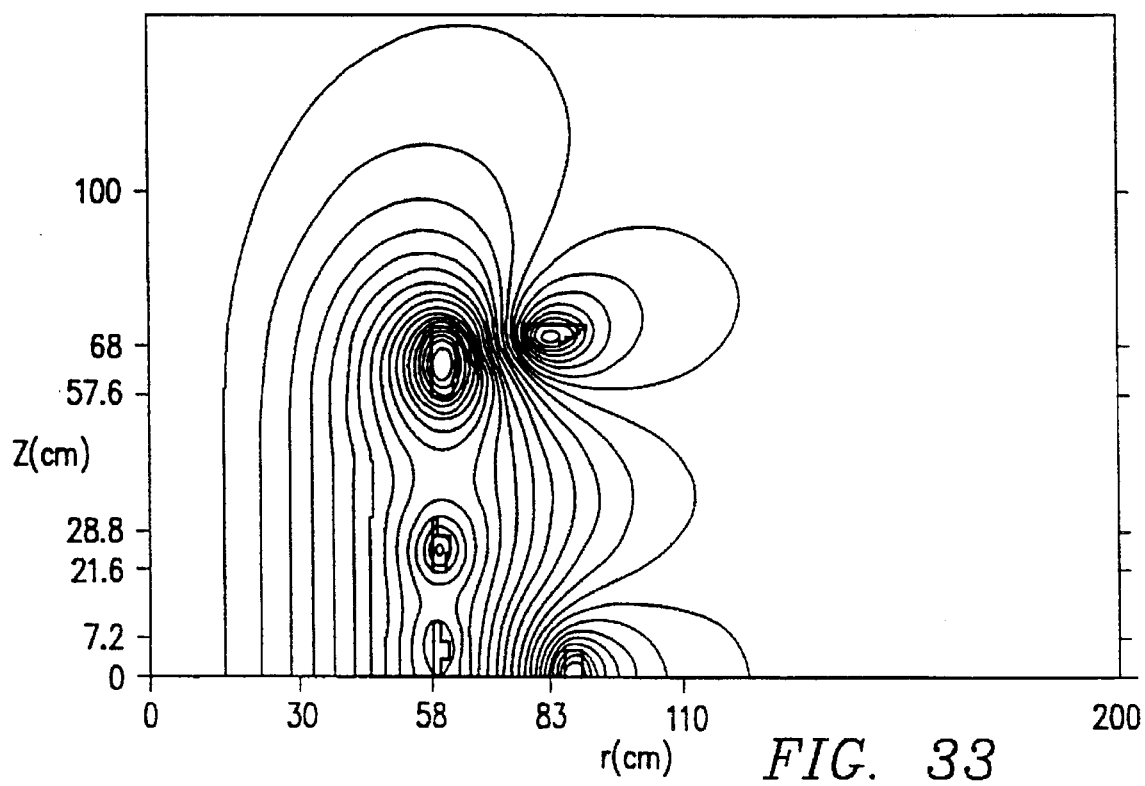
FIG. 33 is a plot illustrating the field lines of the magnet of FIG. 32.

The construction of magnet 200 according to this alternative embodiment of the invention provides a relatively high magnetic field in bore B of high uniformity, with relatively low fringe field away from bore B. As simulated by the OPUS program noted hereinabove, the field strength within bore B is approximately 2.0 Tesla, having a uniformity of approximately 14 ppm over a 25 cm sphere centered at the intersection of axis Z and midplane MP. The field lines simulated by the OPUS program are illustrated in FIG. 33. The OPUS program also simulated the fringe field from this embodiment of the invention as having the 5 gauss line at 5.7 meters from midplane MP along axis Z, and at a maximum of 2.5 meters from axis Z along the side of magnet 200.

Particularly due to the structured coils methodology discussed above and in the above-incorporated Pissanetzky article, the length of magnet 200 (including cryostat) is approximately 1.5 meters, as in the previously described embodiment. However, in contrast to magnet 1 described hereinabove having iron flux return 4, the weight of magnet 200 is extremely low, thus allowing a high degree of transportability and portability. Of course, as in the case with all actively shielded magnets (i.e., not having ferromagnetic shields), the magnetic field in bore B will be vulnerable to externally generated fields. In addition, the cost of superconducting material will, of course, be higher than that in magnet 1 described hereinabove.

It is contemplated that the fully actively shielded magnet 200 will be preferable relative to magnet 1 having an iron flux return 4 in some applications, and vice versa in others. The tradeoff between low weight and low superconductor cost will be made according to the particular application desired.

For optimization of this tradeoff, however, it is further contemplated that one may wish to have a partial iron shield or flux return in combination with a partial active flux return. For example, the partial active flux return coil may be located at the midplane of the magnet outside the iron shield, with possibly additional other active shield coils outside the iron shield but symmetric relative to the midplane. However, in such a combination magnet the iron shield will necessarily have to be inside of the cryostat, and within the cold volume, adding load to the cryogenic system. Location of the iron shield within the cryostat will also preclude its disassembly, and reduce the portability of the magnet. However, the construction of such a combination magnet according to the present invention, particularly using the structured coils methodology, can allow for an extremely short magnet of high field strength, high field uniformity, and low fringe fields, thus obtaining certain important benefits of the present invention.

Conclusion

The structured coils methodology described hereinabove further allows optimization in the design of superconducting magnets having highly uniform field in a volume of interest with greatly reduced cost, weight, and size relative to conventional cylindrical magnets. In particular, the structured coils methodology enables the design of magnets with their region of high field uniformity offset from the center of the magnet, in some cases protruding of the magnet bore. This ease of location of the volume of interest enables the design of magnets for the in vivo NMR tomography of human organs without requiring the whole body of the patient to be inserted into the magnet bore. Excellent stray field containment is also provided by this magnet design, by either iron or active shielding, without requiring excessive amounts of superconductor material.

These benefits are obtained by increasing the number of degrees of freedom in the design optimization process, thus facilitating convergence of the design parameters to the desired solution, and also providing the capability of such offset volumes of interest.

In addition, while the above-described magnets are of the cylindrical type, the method of fabricating a magnet according to the present invention described above is also applicable to magnets of other symmetry. As noted above, long magnets of the type used in particle accelerators, in which the ends of the magnets (in the direction of their length) are effectively infinitely distant from points within the bore because the ends do not affect the field within the bore, may also be designed according to the present invention. This is because each cross-section in the plane perpendicular to the axis of the bore is identical to all others in such long magnets, allowing this method to be applied in the design by considering one of the plane cross-sections therein.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. An electromagnet for generating a DC magnetic field in a volume, comprising:

a plurality of coils encircling a cylindrically-shaped bore, each of said plurality of coils having a plurality of turns of wire for conducting a current therethrough about a longitudinal axis of the bore, at least one of said plurality of coils being cylindrically symmetric and having an irregularly shaped cross-section in a plane coplanar with the longitudinal axis of the bore;

wherein the shape of the cross-section of each of said plurality of coils is selected in such a manner that the magnetic field produced thereby is substantially uniform over a volume of interest that protrudes from said bore.

2. The electromagnet of claim 1, wherein the field produced by said coils is asymmetric relative to a midplane axis of said plurality of coils.

3. The electromagnet of claim 2, wherein said plurality of coils are disposed within a single coil assembly;

and wherein the current density within said coil assembly is substantially constant.

4. The electromagnet of claim 2, wherein said plurality of coils are disposed within a plurality of coil assemblies;

wherein the current density within each of said plurality of coil assemblies is relatively constant;

and wherein the current density within a first one of said plurality of coil assemblies is different from the current density within a second one of said plurality of coil assemblies.

5. The electromagnet of claim 1, further comprising:

a flux return, comprising a ferromagnetic material, disposed near said plurality of coils on the opposite side from the side at which said volume of interest protrudes.

6. The electromagnet of claim 1, further comprising:

means for shielding the stray magnetic field from said plurality of coils, said shielding means located outside of said plurality of coils from said bore.

7. The electromagnet of claim 1, wherein each of said coils comprise superconducting wire;

further comprising:

a cryostat surrounding said plurality of coils to cool said plurality of coils to superconducting temperature; and wherein said shielding means comprises a shielding coil comprising superconducting wire, disposed within said cryostat so that said plurality of coils are located nearer said bore than said shielding coil.

8. The electromagnet of claim 1, wherein said magnetic field is oriented in a direction parallel to the longitudinal axis of said bore.

9. A method of fabricating an electromagnet, comprising the steps of:

defining, in a z-ρ plane, a tiling having a plurality of coil elements arranged in an array;

defining a plurality of target locations outside of said tiling and located in said plane, and a desired magnetic field vector at each of said target locations;

determining the magnitude and polarity of current to be conducted by each of said coil elements in a direction normal to the z-ρ plane to produce the desired magnetic field vectors at said target locations; and constructing coils containing superconducting wire, said coils conducting current corresponding to the result of said determining step.

10. The method of claim 9, wherein at least some of said target locations define a volume of interest.

11. The method of claim 10, wherein said volume of interest protrudes along the z-axis from the midplane of said constructed coils.

12. An electromagnet for producing NMR images of the human head, comprising:

first and second cylindrically symmetric coil assemblies each surrounding a cylindrical bore having a longitudinal axis, said second coil assembly spaced apart from said first coil assembly along said longitudinal axis;

a cryostat surrounding said first and second coil assemblies, said cryostat having a central opening corresponding to said bore, and having an opening between said first and second coil assemblies;

wherein each of said first and second coil assemblies comprise a cylindrically symmetric first primary coil having a plurality of turns of wire for conducting a current therethrough about said bore, said first primary coil having an irregularly shaped cross-section in a plane coplanar with the longitudinal axis of the bore;

and wherein the shape of the cross-section of each of said first primary coils is selected in such a manner that the magnetic field produced thereby is substantially uniform over a volume of interest within said central opening of said cryostat.

13. The electromagnet of claim 12, wherein said first and second coil assemblies are symmetric with one another about a midplane located therebetween.

14. The electromagnet of claim 12, wherein each of said first and second coil assemblies further comprise:

a cylindrically symmetric shielding coil having a radius greater than that of said first primary coil, and conducting a current of opposite polarity of the current conducted by said first primary coil.

15. An electromagnet for producing a DC magnetic field in a volume, comprising:

a plurality of coils encircling a cylindrically-shaped bore, each of said plurality of coils having a plurality of turns of wire for conducting a current therethrough about a longitudinal axis of the bore, at least one of said plurality of coils being cylindrically symmetric and having an irregularly shaped cross-section in a plane coplanar with the longitudinal axis of the bore;

wherein the shape of the cross-section of each of said plurality of coils is selected in such a manner that the magnetic field produced thereby is substantially uniform over a volume of interest located completely outside of said bore;

and wherein the field produced by said coils is asymmetric relative to a midplane axis of said plurality of coils.

16. The electromagnet of claim 15, further comprising:

a flux return, comprising a ferromagnetic material, disposed adjacent said plurality of coils on the opposite side of said plurality coils from said volume.

* * * * *

UNITED STATES PATENT AND TRADEMARK OFFICE
CERTIFICATE OF CORRECTION

PATENT NO. : 5,659,281
DATED : August 19, 1997
INVENTOR(S) : Pizzanetzky, et al.

It is certified that error appears in the above-indentified patent and that said Letters Patent is hereby corrected as shown below:

Col. 3, ln. 32, delete "order of 0.23", insert -- order of 0.25 --.

Col. 7, ln. 47, delete "FIG. 1 elevation", insert -- FIG. 1 is an elevation --.

Col. 7, ln. 60, delete "FIG. 6 an elevation", insert -- FIG. 6 is an elevation --.

Col. 12, ln. 34, delete "vol. 28", insert -- Vol. 28 --.

Col. 13, ln. 45, delete "Oxfcrdshire", insert -- Oxfordshire --.

Col. 19, ln. 32, delete "The PissanetzkyMeas.", insert -- The Pizzanetzky Meas. --.

Col. 20, ln. 13, delete "highly uniformmagnetic", insert -- highly uniform magnetic --.

Col. 25, ln. 46, delete "94 through and", insert -- 94 through 99 and --.

Col. 30, ln. 63, delete "the opus finite", insert -- the OPUS finite --.

Col. 31, ln. 50, delete "sphere 5 indicates", insert -- sphere 105 indicates --.

Col. 32, ln. 38, delete "of Segments", insert -- of segments --.

Col. 32, ln. 56, delete "each segment 20", insert -- each segment 120 --.

Col. 34, ln. 12, delete "sphere 5", insert -- sphere 105 --.

Col. 34, 14, delete "sphere 5", insert -- sphere 105 --.

UNITED STATES PATENT AND TRADEMARK OFFICE
CERTIFICATE OF CORRECTION

PATENT NO. : 5,659,281
DATED : August 19, 1997
INVENTOR(S) : Pizzanetzky, et al.

It is certified that error appears in the above-indentified patent and that said Letters Patent is hereby corrected as shown below:

Col. 36, ln. 9, delete "uniformmagnetic", insert -- uniform magnetic --.

Col. 38, ln. 34, delete "alternatively be provided", insert -- alternatively provided --.

Col. 39, ln. 61, delete "driving coils 214a, 214b", insert -- driving coils 212a, 212b --.

Col. 39, ln. 63, delete "shielding coils 212a, 212b", insert -- shielding coils 214a, 214b --.

Col. 39, ln. 64, delete "coils 14a, 14b", insert -- coils 114a, 114b --.

Signed and Sealed this

Twenty-third Day of December, 1997

Attest:

BRUCE LEHMAN

Attesting Officer

Commissioner of Patents and Trademarks